(12) United States Patent  (10) Patent No.: US 12,366,759 B2
Kusunoki et al.  (45) Date of Patent: Jul. 22, 2025

(54) ELECTRONIC DEVICE

(71) Applicant: Semiconductor Energy Laboratory Co., Ltd., Kanagawa-ken (JP)

(72) Inventors: Koji Kusunoki, Kanagawa (JP); Yosuke Tsukamoto, Kanagawa (JP); Hisao Ikeda, Kanagawa (JP); Ryo Hatsumi, Kanagawa (JP); Daiki Nakamura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/835,811

(22) PCT Filed: Jan. 27, 2023

(86) PCT No.: PCT/IB2023/050700
§ 371 (c)(1),
(2) Date: Aug. 5, 2024

(87) PCT Pub. No.: WO2023/152587
PCT Pub. Date: Aug. 17, 2023

(65) Prior Publication Data
US 2025/0130433 A1   Apr. 24, 2025

(30) Foreign Application Priority Data

Feb. 9, 2022   (JP) ................. 2022-018401

(51) Int. Cl.
*H10K 59/50*   (2023.01)
*G02B 27/10*   (2006.01)
(Continued)

(52) U.S. Cl.
CPC ....... *G02B 27/1006* (2013.01); *G02B 27/144* (2013.01); *G02F 1/13306* (2013.01);
(Continued)

(58) Field of Classification Search
CPC .. G02B 27/1006; H10K 59/50; H10K 59/879; H10K 59/878
(Continued)

(56) References Cited

U.S. PATENT DOCUMENTS 5,953,985 A   9/1999   Kobayashi
6,120,338 A   9/2000   Hirano et al.
(Continued)

FOREIGN PATENT DOCUMENTS

CN   107209390 A   9/2017
CN   111384107 A   7/2020
(Continued)

OTHER PUBLICATIONS

International Search Report (Application No. PCT/IB2023/050700) Dated Apr. 11, 2023.
(Continued)

*Primary Examiner* — Christopher M Raabe
(74) *Attorney, Agent, or Firm* — Husch Blackwell LLP

(57) ABSTRACT

An electronic device that can easily increase the viewing angle and has a reduced screen-door effect is provided. In the electronic device, images displayed on a display panel with a low pixel density and a display panel with a high pixel density are synthesized to be seen. The electronic device includes a first display panel that has a relatively large screen size and a low pixel density, and a second display panel and a third display panel each of which has a relatively small screen size and a high pixel density. The electronic device is configured such that visual information enters the central field of view from the second display panel or the third display panel and visual information enters the peripheral field of view from the first display panel. Such a configuration can easily increase the viewing angle and reduce the screen-door effect.

16 Claims, 28 Drawing Sheets

(51) Int. Cl.
  *G02B 27/14* (2006.01)
  *G02F 1/133* (2006.01)
  *H10K 59/80* (2023.01)
(52) U.S. Cl.
  CPC ........... *H10K 59/50* (2023.02); *H10K 59/878* (2023.02); *H10K 59/879* (2023.02)
(58) Field of Classification Search
  USPC ......................................................... 349/33
  See application file for complete search history.

(56) References Cited

U.S. PATENT DOCUMENTS

| | | |
|---|---|---|
| 2002/0072139 A1 | 6/2002 | Kashiwabara |
| 2008/0197769 A1 | 8/2008 | Seo et al. |
| 2011/0148290 A1 | 6/2011 | Oota |
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0280839 A1 | 10/2013 | Sonoda et al. |
| 2013/0295705 A1 | 11/2013 | Sonoda et al. |
| 2014/0004640 A1 | 1/2014 | Hamaguchi et al. |
| 2014/0004642 A1 | 1/2014 | Otsuka et al. |
| 2015/0035777 A1 | 2/2015 | Hirakata et al. |
| 2015/0060826 A1 | 3/2015 | Matsumoto et al. |
| 2015/0069360 A1 | 3/2015 | Sato |
| 2015/0076476 A1 | 3/2015 | Odaka et al. |
| 2016/0172595 A1 | 6/2016 | Malinowski et al. |
| 2016/0240013 A1 | 8/2016 | Spitzer |
| 2016/0315133 A1 | 10/2016 | Sato |
| 2017/0141167 A1 | 5/2017 | Naganuma |
| 2017/0256754 A1 | 9/2017 | Defranco et al. |
| 2018/0190908 A1 | 7/2018 | Ke et al. |
| 2018/0233089 A1 | 8/2018 | Okamoto |
| 2019/0171005 A1* | 6/2019 | Lee ........................ G02B 6/005 |
| 2020/0203662 A1 | 6/2020 | Mollard et al. |
| 2020/0212120 A1 | 7/2020 | Yang et al. |
| 2022/0236569 A1 | 7/2022 | Yamazaki et al. |
| 2022/0255045 A1 | 8/2022 | Yamazaki et al. |
| 2023/0022494 A1 | 1/2023 | Godo et al. |
| 2023/0067287 A1 | 3/2023 | Akimoto et al. |
| 2023/0228970 A1 | 7/2023 | Hirose et al. |
| 2023/0296910 A1 | 9/2023 | Hirose et al. |
| 2023/0413650 A1* | 12/2023 | Kim ..................... G02B 25/001 |
| 2024/0008342 A1 | 1/2024 | Aoyama et al. |
| 2024/0087487 A1 | 3/2024 | Yamazaki et al. |
| 2024/0196712 A1 | 6/2024 | Yamazaki et al. |
| 2024/0276833 A1 | 8/2024 | Yamazaki et al. |
| 2024/0419008 A1* | 12/2024 | Hatsumi .............. G02B 25/001 |

FOREIGN PATENT DOCUMENTS

| | | |
|---|---|---|
| EP | 3256900 A | 12/2017 |
| GB | 2552279 | 1/2018 |
| JP | 09-331552 A | 12/1997 |
| JP | 2000-036385 A | 2/2000 |
| JP | 2002-324673 A | 11/2002 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| JP | 2021-128194 A | 9/2021 |
| KR | 2020-0080741 A | 7/2020 |
| WO | WO-2016/130941 | 8/2016 |
| WO | WO-2021/161773 | 8/2021 |

OTHER PUBLICATIONS

Written Opinion (Application No. PCT/IB2023/050700) Dated Apr. 11, 2023.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27TH International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

ELECTRONIC DEVICE

This application is a 371 of international application PCT/IB2023/050700 filed on Jan. 27, 2023, which is incorporated herein by reference.

TECHNICAL FIELD

One embodiment of the present invention relates to an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

Goggle-type or glasses-type devices have been developed as electronic devices for virtual reality (VR), augmented reality (AR), and the like.

Typical examples of display devices that can be used for display panels include a display device including a liquid crystal element and a display device including an organic EL (Electro Luminescence) element, a light-emitting diode (LED), or the like.

A display device including an organic EL element does not need a backlight, which is necessary for a liquid crystal display device; thus, a thin, lightweight, high-contrast, and low-power display device can be achieved. For example, Patent Document 1 discloses an example of a display device including an organic EL element.

REFERENCE

[Patent Document]
 [Patent Document 1] Japanese Published Patent Application No. 2002-324673

SUMMARY OF THE INVENTION

Problems to be Solved by the Invention

VR-compatible devices such as goggles-type devices are required to have no screen-door effect and an increased viewing angle in order that the user can feel a sense of immersion and a realistic sensation. Note that in this specification and the like, the screen-door effect refers to a problem in which a mesh-like pattern caused by the boundary between pixels is perceived in display.

To increase the viewing angle, a relatively large display panel is preferably used. However, the relatively large display panel has difficulty in having increased pixel density, and thus cannot solve the screen-door effect.

A microdisplay with a high pixel density can be used for a display panel. In that case, display of the microdisplay is enlarged with an optical system, so that the screen-door effect can be reduced while the viewing angle is increased. This complicates the optical system, however, causing a problem of increased cost. The microdisplay has another problem of increased power consumption to obtain necessary illuminance.

The fovea centralis and its vicinity on the retina of human eyes contribute to high-resolution viewing, whereas a region apart from the fovea centralis on the retina has a lower resolution than the fovea centralis. A technique utilizing the characteristics of human eyes, called foveated rendering, has been proposed: the user's line of sight is tracked in image display so that a high-resolution image and a low-resolution image are displayed for the central field of view and the peripheral field of view, respectively.

One of the approaches to solving the aforementioned problems is applying the foveated rendering technique and using two display panels with different resolutions for an eye. However, this approach causes other problems such as an increase in the number of display panels to increase cost, and a display timing gap between display panels.

In view of the above, an object of one embodiment of the present invention is to provide an electronic device that can easily increase the viewing angle and has a reduced screen-door effect. Another object is to provide an electronic device that can be manufactured at low cost. Another object is to provide an electronic device with high display quality. Another object is to provide an electronic device with low power consumption. Another object is to provide a novel electronic device.

Note that the description of these objects does not preclude the existence of other objects. In one embodiment of the present invention, there is no need to achieve all these objects. Other objects will be apparent from and can be derived from the description of the specification, the drawings, the claims, and the like.

Means for Solving the Problems

One embodiment of the present invention relates to an electronic device that has high display quality and is compatible with VR or the like.

One embodiment of the present invention is an electronic device including a first display panel, a second display panel, a third display panel, a first half mirror, a second half mirror, a first lens, and a second lens. The first panel includes a first display portion and a second display portion. The second display panel includes a third display portion. The third display panel includes a fourth display portion. An image of the first display portion that passes through the first half mirror and an image of the third display portion that is reflected by the first half mirror are seen through the first lens by one of the left and right eyes. An image of the second display portion that passes through the second half mirror and an image of the fourth display portion that is reflected by the second half mirror are seen through the second lens by the other of the left and right eyes.

The image of the third display portion and the image of the fourth display portion can be displayed in a region corresponding to the central field of view, and the images of the first display portion and the second display portion can be displayed in a region corresponding to the peripheral field of view.

Another embodiment of the present invention is an electronic device including a first display panel, a second display panel, a third display panel, a first half mirror, a second half mirror, a first lens, and a second lens. The first panel includes a first display portion and a second display portion. The first lens is positioned to face the first display portion. The second lens is positioned to face the second display portion. The first half mirror is positioned between the first display portion and the first lens. The second half mirror is positioned between the second display portion and the second lens. The second display panel is positioned so that an image of the third display portion is reflected by the first half mirror and enters the first lens. The third display panel is positioned so that an image of the fourth display portion is reflected by the second half mirror and enters the second lens.

The first display panel can be one of a liquid crystal display device and an organic EL display device each including a circuit provided over a glass substrate.

The second display panel and the third display panel can be each an organic EL display device including a circuit provided on a silicon substrate.

A display panel having a higher pixel density than the first display panel can be used as each of the second display panel and the third display panel.

The first display panel, the second display panel, and the third display panel can perform black display at the time of image data writing and data retention, and the first display panel, the second display panel, and the third display panel can perform image display in accordance with signals supplied to the first display panel, the second display panel, and the third display panel at the same timing.

Effect of the Invention

According to one embodiment of the present invention, an electronic device that can easily increase the viewing angle and has a reduced screen-door effect can be provided. An electronic device that can be manufactured at low cost can be provided. An electronic device with high display quality can be provided. An electronic device with low power consumption can be provided. A novel electronic device can be provided.

Note that the description of these effects does not preclude the existence of other effects. One embodiment of the present invention does not necessarily have all of these effects. Other effects can be derived from the description of the specification, the drawings, and the claims.

MODE FOR CARRYING OUT THE INVENTION

Figure 1:
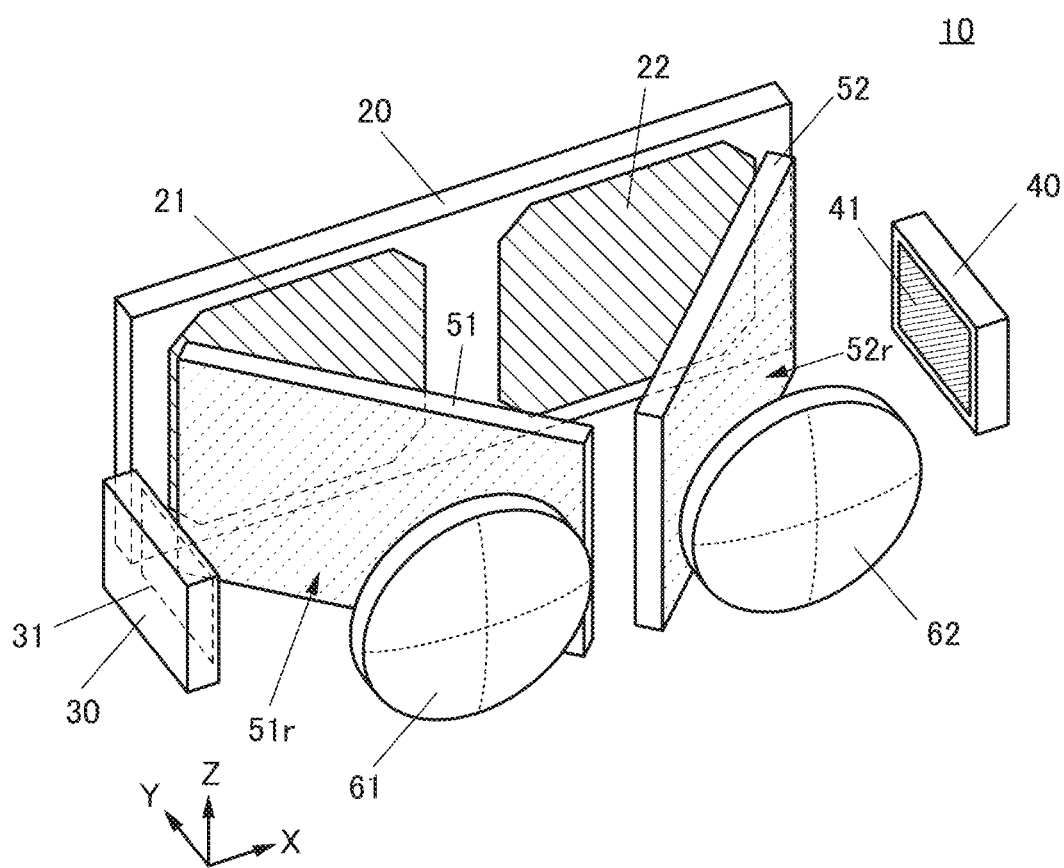
FIG. 1 is a diagram illustrating a display apparatus.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. Note that the hatching of the same component that constitutes a drawing is sometimes omitted or changed as appropriate in different drawings.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases; in this specification, a plurality of names are sometimes used for the same component. Even in the case where elements are illustrated in a circuit diagram as if they are directly connected to each other, the elements may actually be connected to each other through two or more conductors. In this specification, even such a configuration is included in the category of direct connection.

Embodiment 1

In this embodiment, an electronic device of one embodiment of the present invention will be described.

One embodiment of the present invention is a VR-compatible electronic device in which images displayed on a display panel with a low pixel density and a display panel with a high pixel density are synthesized to be seen. The electronic device includes a first display panel that has a relatively large screen size and a low pixel density, and a second display panel and a third display panel each of which has a relatively small screen size and a high pixel density.

Note that in this specification, the pixel density refers to the number of pixels per unit area or unit length. A display panel with a higher pixel density can display a higher-resolution image. The pixel density can be expressed by, for example, ppi (pixels per inch), which is the number of pixels per inch (unit length). Note that the screen definition refers to the total number of pixels and is represented by a common name such as 4K2K or 8K4K, or the number of horizontal pixels×the number of vertical pixels, which is a concept different from the pixel density.

Human eyes have high resolution with respect to visual information entering the fovea centralis and its vicinity (central field of view); meanwhile, human eyes have relatively low resolution with respect to visual information entering the outside of the vicinity of the fovea centralis (peripheral field of view). Thus, when image information with high resolution enters the central field of view, the user is unlikely to perceive the screen-door effect even when image information with low resolution enters the peripheral field of view.

In view of the above, one embodiment of the present invention is configured such that visual information enters the central field of view from the second display panel or the third display panel with a relatively high pixel density and visual information enters the peripheral field of view from the first display panel with a relatively low pixel density. Such a configuration can easily increase the viewing angle and reduce the screen-door effect, so that the user can easily feel a sense of immersion and a realistic sensation.

The first display panel includes two display portions. With the two display portions, one display panel can correspond to the left and right eyes. This can reduce the number of display panels, resulting in a reduction in component cost and power consumption.

Images displayed on the first display panel, the second display panel, and the third display panel are displayed at different positions in the viewing range of the user. Therefore, image switching of the display panels at different timings would cause discomfort to the user. In one embodiment of the present invention, the first display panel, the second display panel, and the third display panel can display images at the same timing, so that an electronic device with high display quality can be provided.

Figure 2A:
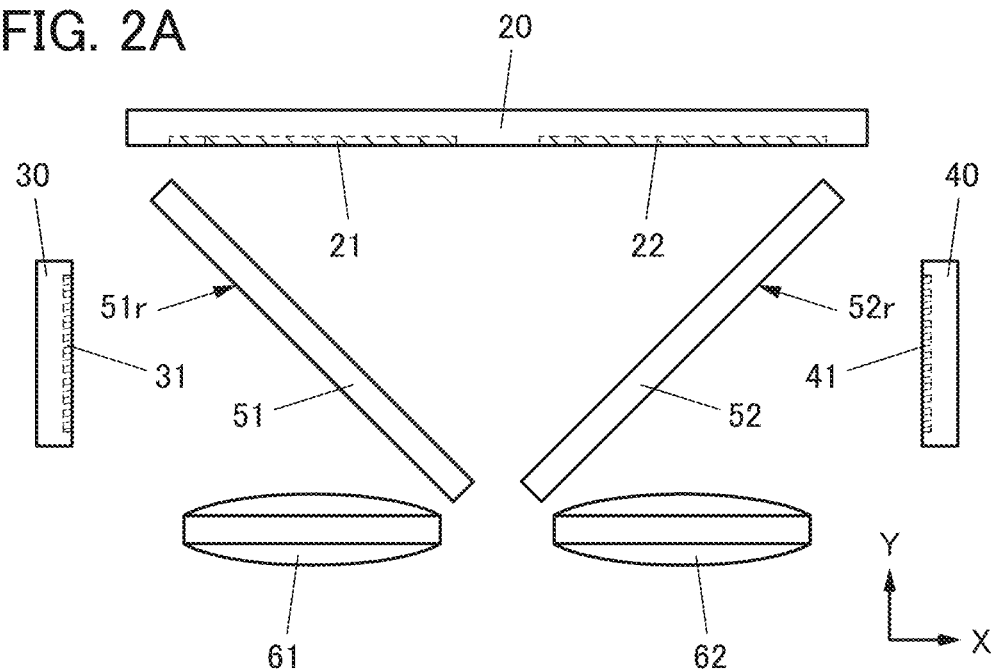
FIG. 2A to FIG. 2C are diagrams illustrating a display apparatus.
Figure 2B:
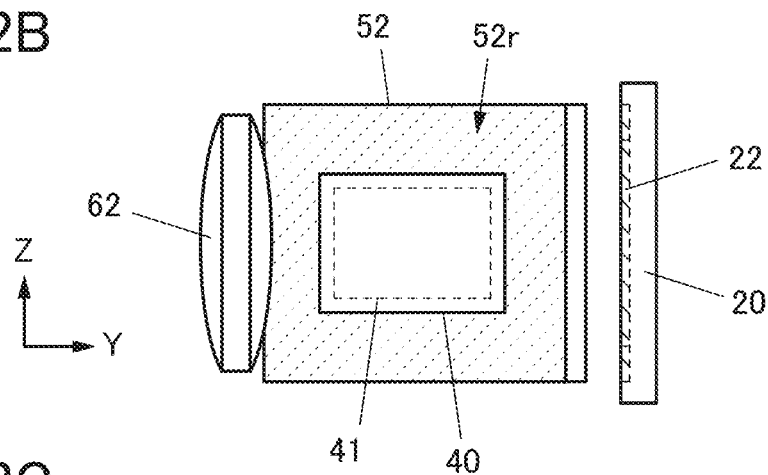
Figure 2C:
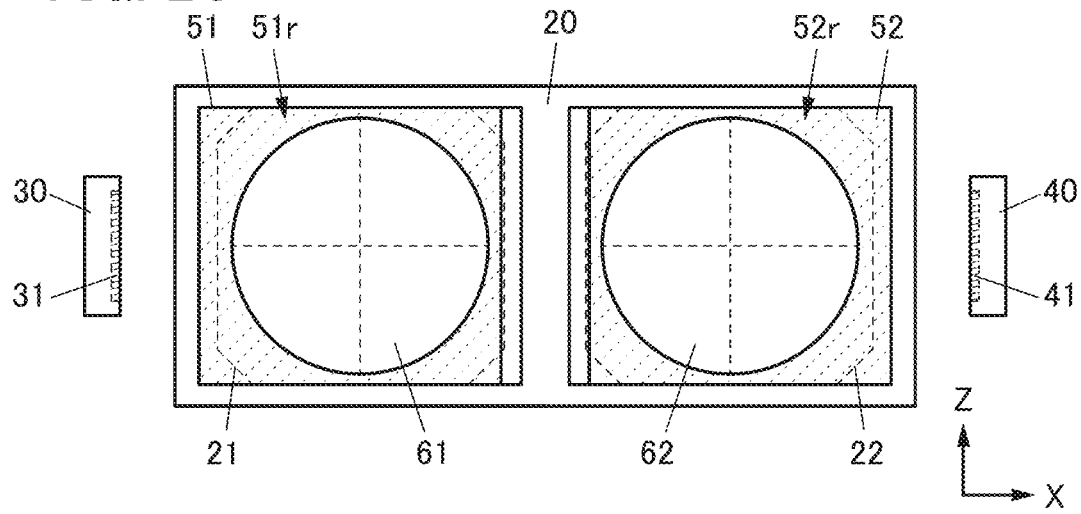

FIG. 1 is a perspective view illustrating a display apparatus that can be used for an electronic device of one embodiment of the present invention. FIG. 2A, FIG. 2B, and FIG. 2C show a plan view (a top view), a right side view, and a front view of the display apparatus, respectively.

A display apparatus 10 includes a display panel 20, a display panel 30, a display panel 40, a half mirror 51, a half mirror 52, a lens 61, and a lens 62. The user can see an image by bringing his/her eyes close to the vicinities of the lens 61 and the lens 62 included in the display apparatus 10. The display panel 20 includes a display portion 21 and a display portion 22. The display panel 20, which is a display panel with a relatively large screen size and a low pixel density, corresponds to the peripheral field of view and will be described in detail later.

The lens 61 can be placed apart from the display panel 20 to face the display portion 21. The lens 62 can be placed apart from the display panel 20 to face the display portion 22.

A convex lens can be used as each of the lenses 61 and 62. Although FIG. 1 and FIG. 2A to FIG. 2C illustrate an example of using a biconvex lens as each of the lenses 61 and 62, one embodiment of the present invention is not limited thereto. For example, each of the lenses 61 and 62 may be formed of one or more plano-convex lenses. Alternatively, the lenses 61 and 62 can be formed by combining lenses selected from a biconvex lens, a plano-convex lens, a biconcave lens, a plano-concave lens, a convex meniscus lens, and a concave meniscus lens. A lens other than the lenses 61 and 62 may be provided.

The half mirror 51 can be placed between the display portion 21 and the lens 61. The half mirror 52 can be placed between the display portion 22 and the lens 62. An image displayed on the display portion 21 can enter the lens 61 through the half mirror 51. An image displayed on the display portion 22 can enter the lens 62 through the half mirror 52.

The half mirrors 51 and 52 can have a structure in which, for example, optical glass with high visible light transmittance is used as a base and a surface provided with a metal film or a dielectric film is used as a reflection surface. The visible light transmittance and the visible light reflectance of each of the half mirrors 51 and 52 can be each approximately 50%, for example. Note that each of the half mirrors 51 and 52 may be configured to have higher transmittance than reflectance (transmittance>reflectance) or higher reflectance than transmittance (transmittance<reflectance) in view of the luminance and the like of each display panel.

The display panel 30 includes a display portion 31. The display panel 40 includes a display portion 41. The display panels 30 and 40, each of which is a display panel with a relatively small screen size and a high pixel density, correspond to the central field of view and will be described in detail later. Note that the pixel densities of the display panels satisfy the relationship: the display panel 30=the display panel 40>the display panel 20.

The display panel 30 can be placed so that an image displayed on the display portion 31 is reflected by a reflection surface 51r of the half mirror 51 and enters the lens 61.

In order that an image of the display portion 31 can enter the lens 61 facing the display portion 21, each component is preferably provided so as to avoid interference. For example, each component can be placed so that the angle between the reflection surface 51r of the half mirror 51 and the display surface of the display portion 21 and the angle between the reflection surface 51r of the half mirror 51 and the display surface of the display portion 31 are each greater than or equal to 35° and less than or equal to 55°, preferably greater than or equal to 40° and 50°. Typically, each component is preferably placed so that the angle is approximately 45°.

The display panel 40 can be placed so that an image displayed on the display portion 41 is reflected by a reflection surface 52r of the half mirror 52 and enters the lens 62.

In order that an image of the display portion 41 can enter the lens 62 facing the display portion 22, each component is preferably provided so as to avoid interference. For example, each component can be placed so that the angle between the reflection surface 52r of the half mirror 52 and the display surface of the display portion 22 and the angle between the reflection surface 52r of the half mirror 52 and the display surface of the display portion 41 are each greater than or equal to 35° and less than or equal to 55°, preferably greater than or equal to 40° and 50°. Typically, each component is preferably placed so that the angle is approximately 45°.

Figure 3A:
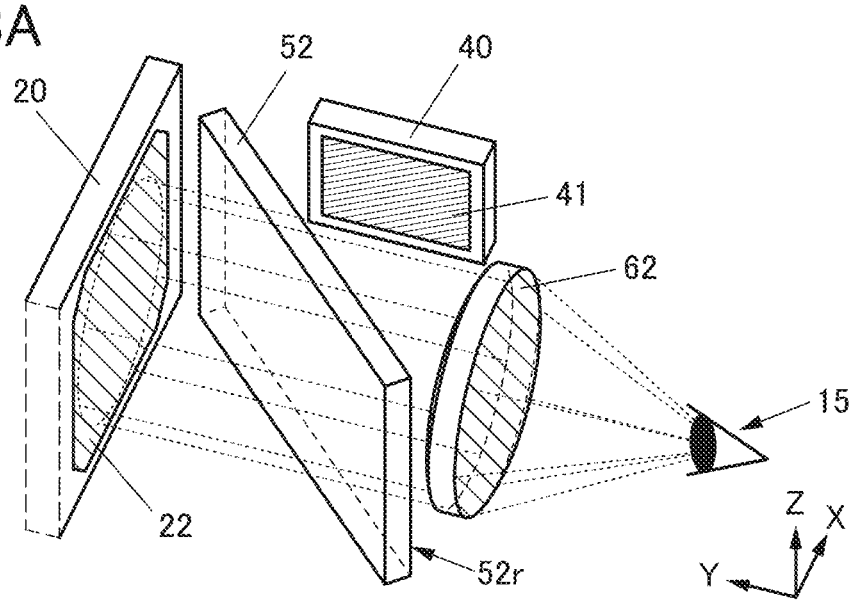
FIG. 3A and FIG. 3B are diagrams each illustrating an optical path of a display apparatus.
Figure 3B:
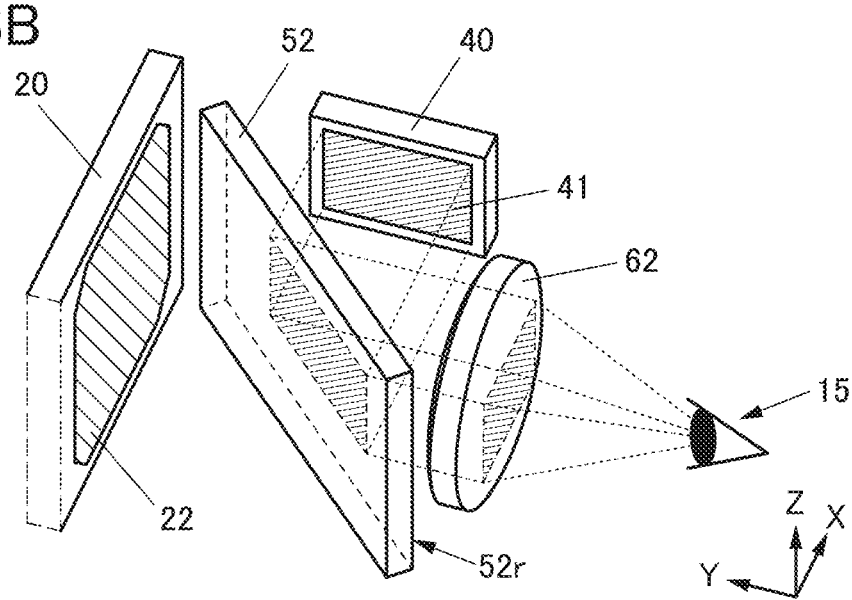

Next, the synthesis of images is described. FIG. 3A is a diagram illustrating part of an optical path at the time when an image of the display portion 22 of the display panel 20 is seen. FIG. 3B is a diagram illustrating part of an optical path at the time when an image of the display portion 41 of the display panel 40 is seen.

Although the images are displayed on the display portion 22 and the display portion 41 at the same time, they are separately illustrated in FIG. 3A and FIG. 3B for clarity of the drawing. The description on the synthesis of an image of the display portion 21 of the display panel 20 and an image of the display portion 31 of the display panel 30 is similar to that in FIG. 3A and FIG. 3B and is omitted here.

The image of the display portion 22 enters the lens 62 through the half mirror 52. The image of the display portion 22 is collected by the lens 62 and then enters an eye 15 to be seen. Note that the image of the display portion 22 is also reflected by the half mirror 52, which does not contribute to seeing and is not illustrated here.

The image of the display portion 41 is reflected by the half mirror 52 and enters the lens 62. The image of the display portion 41 is collected by the lens 62 and then enters the eye 15 to be seen. Note that the image of the display portion 41 also passes through the half mirror 52, which does not contribute to seeing and is not illustrated here.

Figure 3C:
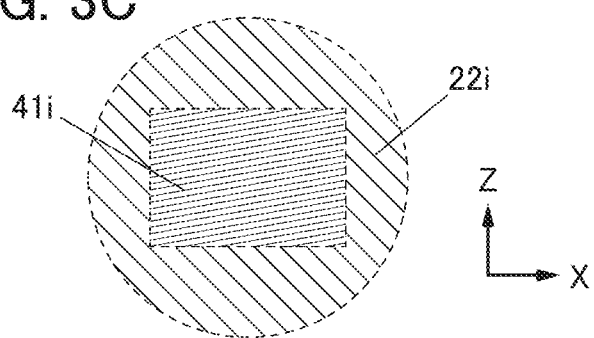
FIG. 3C is a diagram illustrating a synthesized image.

FIG. 3C is a diagram schematically illustrating an image that is synthesized to be seen. A high-resolution image 41i that has been displayed on the display portion 41 with a high pixel density is positioned in a region corresponding to the central field of view. A low-resolution image 22i that has been displayed on the display portion 22 with a low pixel density is positioned in a region corresponding to the peripheral field of view outside the central field of view. Since an edge portion is not clear in the human field of view, the outer periphery of the synthesized image is denoted by a dashed line here.

In order that the central field of view can always match the image 41i, the electronic device preferably has a head tracking function of sensing the position of the user's head and changing an image. Since the head tracking function can minimize the movement of the eyeball, the user's line of sight can be easily gathered in the region of the image 41i.

In the above manner, image information with high resolution can be input to the central field of view (the fovea centralis and its vicinity of the human eye) and image information with low resolution can be input to the peripheral field of view (the outside of the vicinity of the fovea centralis). Such an image can be seen with a reduced screen-door effect.

Figure 4A:
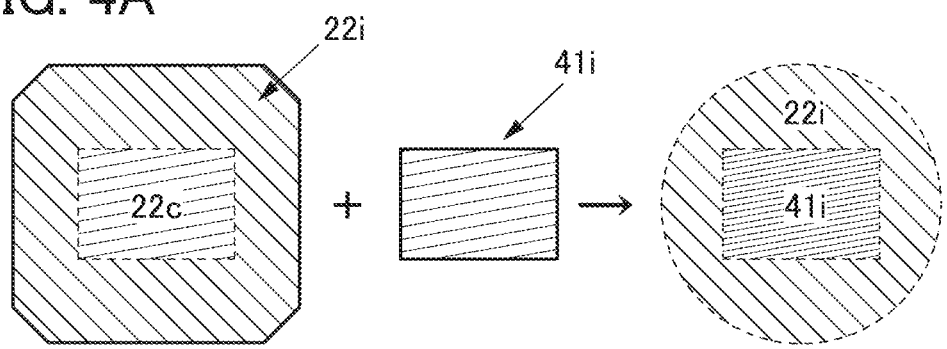
FIG. 4A to FIG. 4C are diagrams illustrating images to be synthesized.
Figure 4B:
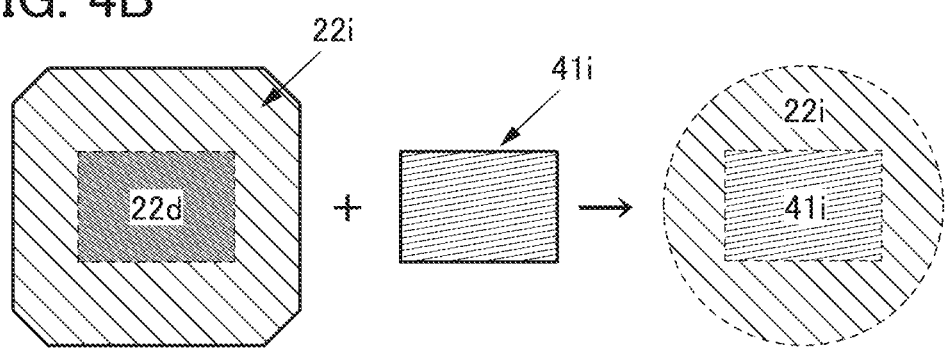
Figure 4C:
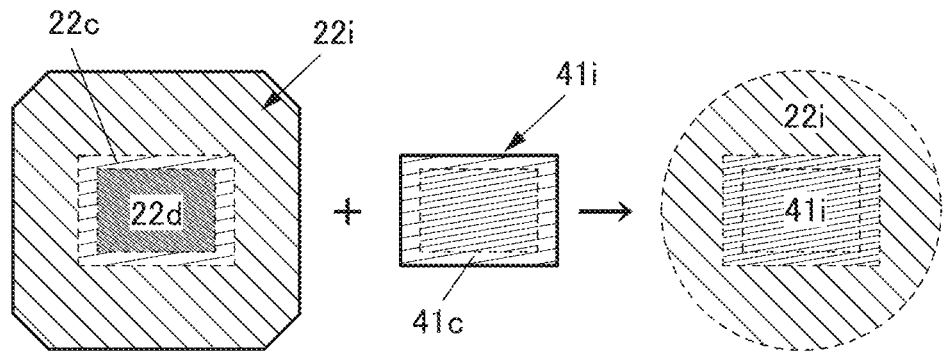

Here, examples of images to be synthesized are illustrated in FIG. 4A to FIG. 4C. The image 22i displayed on the display portion 22, the image 41i displayed on the display portion 41, and a synthesized image to be seen are shown as examples from the left. The description on the synthesis of an image of the display portion 21 of the display panel 20 and an image of the display portion 31 of the display panel 30 is similar to that in FIG. 4A and FIG. 4C and is omitted here.

FIG. 4A is an example in which the illuminance of a region 22c overlapping with the image 41i is lower than that of the peripheral region in the image 22i. When display is performed in this manner and the image 41i is displayed with low illuminance, the images can be superimposed with a small difference in illuminance between the central portion and the peripheral portion. Thus, the boundary between the image 22i and the image 41i can be less noticeable.

FIG. 4B is an example in which a region 22d with no image to be displayed is provided in a region of the image 22i that overlaps with the image 41i. When display is performed in this manner, only the image 41i is displayed on the central portion, the screen-door effect can be further reduced. In addition, the image 22i and the image 41i can have substantially the same illuminance, improving the controllability.

FIG. 4C, which illustrates display combining FIG. 4A and FIG. 4B, is an example in which the region 22d is provided at the central portion of the region 22c. With such a structure in which an image 41c with lower illuminance than that of the central portion is displayed in the vicinity of an end portion of the image 41i, the images can be superimposed with a small difference in illuminance between the central portion and the peripheral portion; thus, the boundary between the image 22i and the image 41i can be less noticeable. In addition, since only the image 41i is displayed on the central portion, the screen-door effect can be further reduced.

Figure 5A:
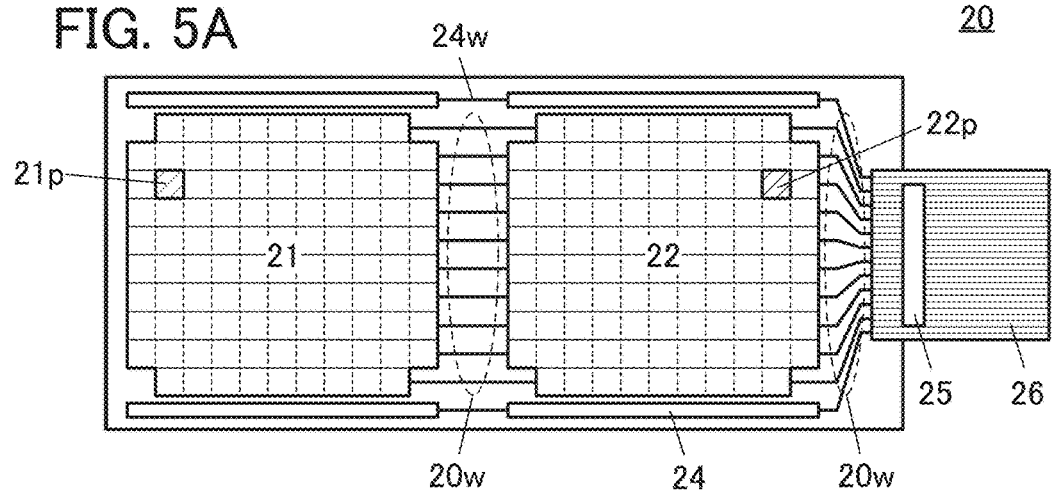
FIG. 5A to FIG. 5D are diagrams each illustrating a display panel.

FIG. 5A is a diagram illustrating the display panel 20. The display panel 20 includes the display portion 21, the display portion 22, gate drivers 24, and a source driver 25.

The gate drivers 24 and the source driver 25 can be provided by a method for mounting an IC package, such as a TCP (Tape Carrier Package) or a COF (Chip On Film), or a COG (chip on glass) method. Alternatively, the gate drivers 24 and the source driver 25 may be monolithically formed over the same substrate as the pixel circuit.

FIG. 5A illustrates an example in which the gate drivers 24 are monolithic circuits formed over the same substrate as the pixel circuit and the source driver 25 is a COF-type circuit mounted through an FPC (Flexible printed circuits) 26. Although FIG. 5A illustrates an example in which the gate drivers 24 are provided on opposite sides of the display portion, the gate drivers 24 may be provided on one side.

The display portion 21 has a structure in which pixels 21p are arranged in a matrix. The display portion 22 has a structure in which pixels 22p are arranged in a matrix. The pixels 21p and the pixels 22p are electrically connected to the source driver 25 through wirings 20w. Note that a demultiplexer may be provided between the source driver 25 and the wirings 20w.

The gate drivers 24 include a driver portion of the display portion 21 and a driver portion of the display portion 22, which are electrically connected through a wiring 24w. In the display portion 21 and the display portion 22, image data output from the source driver 25 is written to pixels of a row selected by the gate drivers 24. For example, images are written to the display portion 22 closer to the source driver 25, and then images are written to the display portion 21.

That is, the display panel 20 includes the two display portions but operates as one display panel. Thus, the number of driver circuits such as a source driver can be smaller than that in the case where two display panels are used, reducing the component cost and the mounting cost.

Figure 5B:
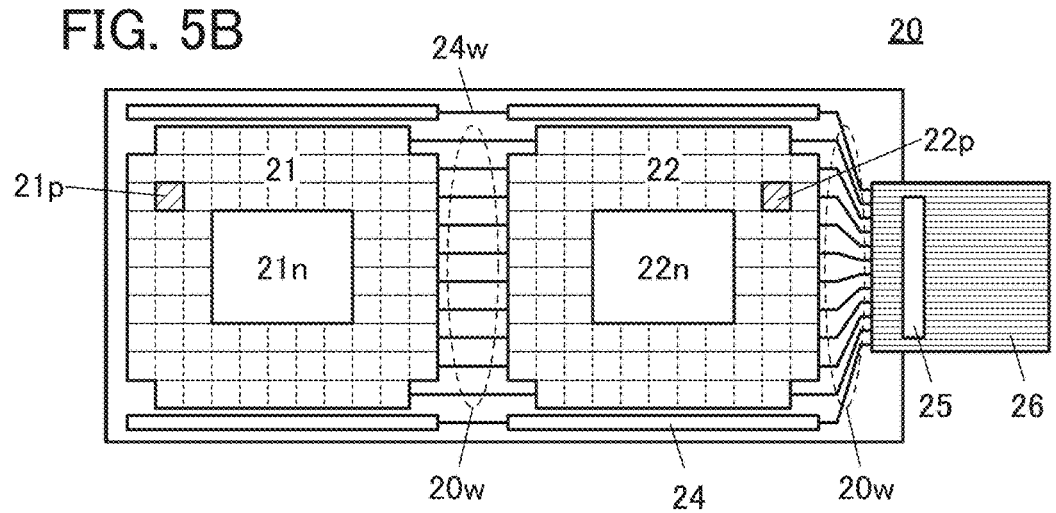

FIG. 5B is a modification example of FIG. 5A; the pixels 21p in a region 21n of the display portion 21 that overlaps with the display portion 31 and the pixels 22p in a region 22n of the display portion 22 that overlaps with the display portion 41 are omitted. This structure can prevent unnecessary display due to crosstalk or the like in the region 21n and the region 22n and improve the display quality. Note that the structure in FIG. 5B can also be regarded as a structure in which the image 22i illustrated in FIG. 4B can be displayed using hardware.

Figure 5C:
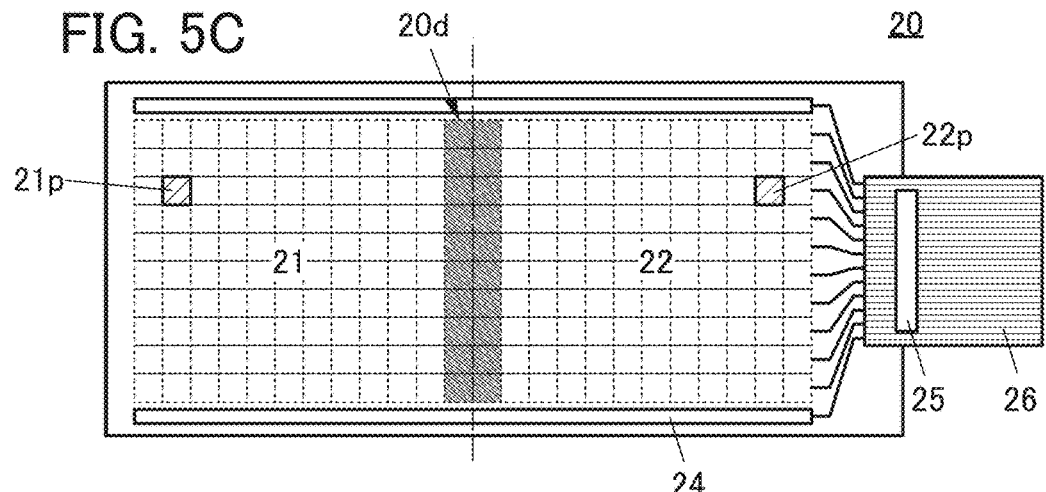

Although FIG. 5A and FIG. 5B each illustrate an example including the two separated display portions, one display portion may be divided into the display portion 21 and the display portion 22 as illustrated in FIG. 5C. In that case, a region 20d where black images are displayed whenever the display panel 20 performs display operation may be provided at the boundary between the display portion 21 and the display portion 22 in order to prevent light from entering each other's display portions. The structure illustrated in FIG. 5B, in which some pixels are omitted, can also be applied to FIG. 5C.

The display panel 20 illustrated in FIG. 5A to FIG. 5C can include, for example, a liquid crystal display device or an organic EL display device formed using a glass substrate. In the display panel formed using a glass substrate, a pixel circuit, a driver circuit, and the like can be formed with a transistor including a metal oxide, polycrystalline silicon, or the like in a semiconductor layer. Therefore, even a display panel with a relatively large screen size (e.g., approximately 4 to 8 inches diagonal) can be formed at low cost.

Note that high-resolution display is required to reduce the screen-door effect in the central field of view. In addition, high-speed operation for writing image data in a short horizontal period is also required. In the display panel formed using a glass substrate, there is a limit to increasing the pixel density when balancing the size of the display portion and the operation speed.

Thus, the display panel formed using a glass substrate is preferably used for the peripheral field of view that is less likely to perceive the screen-door effect. When a display panel with a relatively large screen size is used, the viewing angle can be easily increased without using a complicated optical system. It could be advantageous in that the display panel formed using an inexpensive glass substrate can be used as the display panel 20.

In order to obtain the effect of one embodiment of the present invention, the display surface of the display panel 20 preferably has the outer shape with an aspect ratio of approximately 2:1 to 3:1. The total diagonal size of the display portion 21 and the display portion 22 is preferably approximately 4 to 8 inches, further preferably approximately 5 to 6 inches. The pixel density is preferably higher than or equal to 100 ppi, further preferably higher than or equal to 200 ppi, still further preferably higher than or equal to 300 ppi, and can be a value lower than the pixel density of each of the display panels 30 and 40.

Figure 5D:
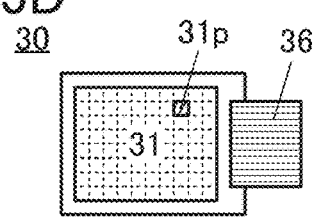

FIG. 5D is a diagram illustrating the display panel 30. The display panel 30 includes the display portion 31. The display portion 31 has a structure in which pixels 31p are arranged in a matrix. The display portion 31 has a higher pixel density than the display portion 21. An FPC 36 is electrically connected to the display panel 30, and image data, operation signals, and power can be supplied to the display panel 30 through the FPC 36. Note that the display panel 40 has a structure similar to that of the display panel 30, and thus, the description thereof is omitted here.

A liquid crystal display device or an organic EL display device can be used for the display panel 30; a self-luminous device that does not need a light source is preferable because a circuit described later can be stacked, and an example of using an organic EL display device is described here.

Figure 6A:
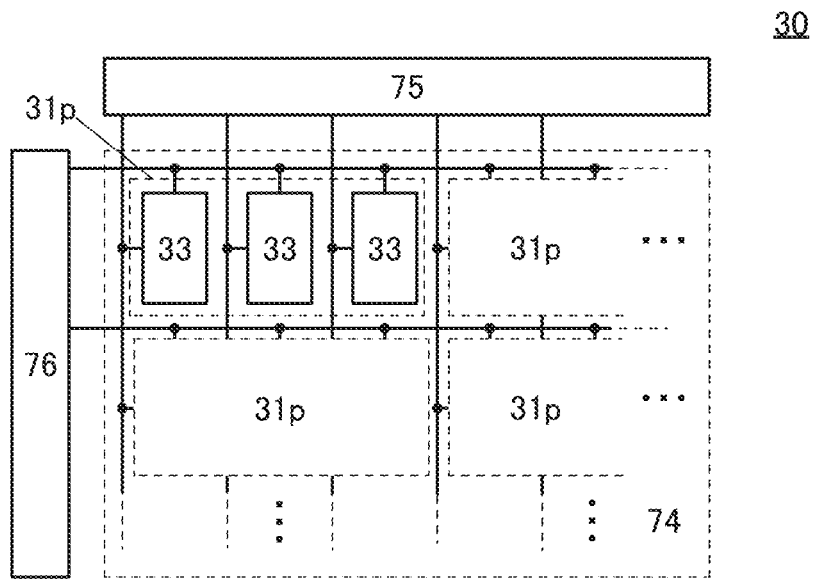
FIG. 6A to FIG. 6C are diagrams each illustrating a display panel.

FIG. 6A is a block diagram illustrating the display panel 30. The display panel 30 includes the display portion 31, a circuit 75, and a circuit 76. The display portion 31 includes the pixels 31p arranged in a column direction and a row direction.

The pixels 31p can include a plurality of subpixels 33. The subpixels 33 have a function of emitting light for display.

Note that in the description of this specification, the minimum unit in which an independent operation is performed in one "pixel" is defined as a "subpixel" for convenience; a "pixel" may be replaced with a "region" and a "subpixel" may be replaced with a "pixel."

The subpixels 33 each include a light-emitting device (also referred to as a light-emitting element) that emits visible light. An EL element such as an OLED (Organic Light Emitting Diode) or a QLED (Quantum-dot Light Emitting Diode) is preferably used as the light-emitting device. Examples of a light-emitting substance contained in the EL element include a substance that emits fluorescent light (a fluorescent material), a substance that emits phosphorescent light (a phosphorescent material), a substance that exhibits thermally activated delayed fluorescence (a thermally activated delayed fluorescent (TADF) material), and an inorganic compound (e.g., a quantum dot material). An LED (Light Emitting Diode) such as a micro LED can also be used as the light-emitting device.

The circuit 75 and the circuit 76 are drivers for driving the subpixels 33. The circuit 75 and the circuit 76 can have a function of a source driver and a function of a gate driver, respectively. A shift register circuit or the like can be used as each of the circuit 75 and the circuit 76, for example.

Figure 6B:
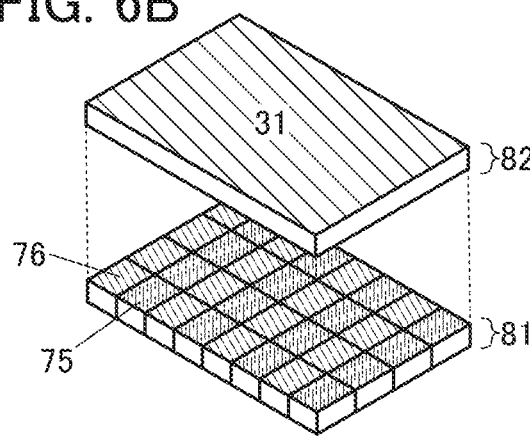

Note that a structure illustrated in FIG. 6B, in which the circuit 75 and the circuit 76 are provided in a layer 81, the display portion 31 is provided in a layer 82, and the layer 81 and the layer 82 overlap with each other, may be employed. This structure enables a display device with a narrow bezel to be formed.

When the driver circuits are provided below the display portion 31, wiring length can be shortened and wiring capacitance can be reduced. Accordingly, a display panel capable of a high-speed operation with low power consumption can be provided.

When each of the circuit 75 and the circuit 76 is placed while being divided as illustrated in FIG. 6B, the display portion 31 can be partly driven. For example, image data in the display portion 31 can be partly rewritten. Furthermore, the display portion 31 can be partly operated at a different operating frequency.

Note that the layout, shape, and area of the circuit 75 and the circuit 76 illustrated in FIG. 6B are examples and can be changed as appropriate. Parts of the circuit 75 and the circuit 76 can be formed in the same layer as the display portion 31. A circuit such as a memory circuit, an arithmetic circuit, or a communication circuit may be provided in the layer 81.

In this structure, for example, a single crystal silicon substrate can be used for the layer 81, the circuit 75 and the circuit 76 can be formed with transistors including silicon in channel formation regions (hereinafter Si transistors), and pixel circuits included in the display portion 31 provided in the layer 82 can be formed with transistors including a metal oxide in channel formation regions (hereinafter OS transistors). An OS transistor can be formed with a thin film and can be formed to be stacked over a Si transistor.

Figure 6C:
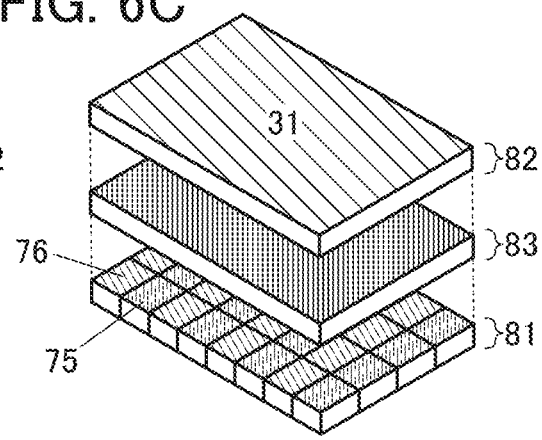

Note that a structure illustrated in FIG. 6C, in which a layer 83 including OS transistors is provided between the layer 81 and the layer 82, may be employed. The pixel circuits included in the display portion 31 can be partly provided with OS transistors in the layer 83. Alternatively, the circuit 75 and the circuit 76 can be partly provided with OS transistors. Alternatively, the circuits that can be provided in the layer 82, such as a memory circuit, an arithmetic circuit, and a communication circuit, can be partly provided with OS transistors. Note that Si transistors may be provided in the layer 83.

In order to obtain the effect of one embodiment of the present invention, the display surface of each of the display panel 30 and the display panel 40 preferably has the outer shape with an aspect ratio of approximately 1:1 to 4:3. The diagonal size of each of the display portion 31 and the display portion 41 is preferably approximately 0.3 to 1.5 inches, further preferably approximately 0.5 to 1.0 inches. The pixel density is preferably higher than or equal to 3000 ppi, further preferably higher than or equal to 4000 ppi, still further preferably higher than or equal to 5000 ppi, and can be lower than or equal to 10000 ppi.

Figure 7:
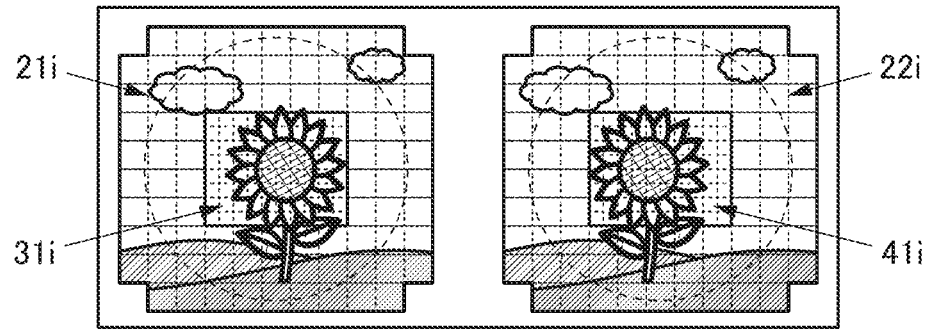
FIG. 7 is a diagram illustrating an example of a seen image.

FIG. 7 is an example of a diagram illustrating a synthesized image of an image 21i and an image 31i seen by one of the left and right eyes, and a synthesized image of the image 22i and the image 41i seen by the other of the left and right eyes.

In this manner, the high-resolution image 31i and image 41i can be displayed for the central field of view (flower images) and the low-resolution image 21i and image 22i can be displayed for the peripheral field of view in one embodiment of the present invention.

When parallax information is supplied to each of the two synthesized images, the user can feel a sense of three-dimensionality. The user seeing such images can also feel a sense of immersion and a realistic sensation.

Figure 8A:
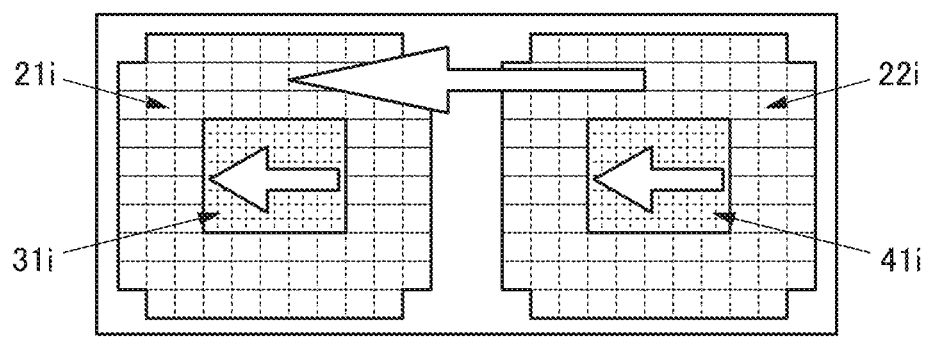
FIG. 8A and FIG. 8B are diagrams each illustrating image rewriting.

Described next is image rewriting in the display portion 21 of the display panel 20, the display portion 31 of the display panel 30, and the display portion 41 of the display panel 40. In FIG. 8A, the image 21i of the display portion 21 and the image 31i of the display portion 31 are superimposed, and the image 22i of the display portion 22 and the image 41i of the display portion 41 are superimposed.

The display panel 20 includes the two display portions but operates as one display panel as described above. Thus, image data rewriting can proceed in the direction from the image 22i to the image 21i as indicated by a large arrow in FIG. 8A. For example, the image 21i is rewritten after the rewriting of the image 22i is completed. Note that image data rewriting can sometimes proceed in the direction opposite to that in FIG. 8A depending on the specifications of the display panel; in either case, rewriting proceeds in one direction.

Figure 8B:
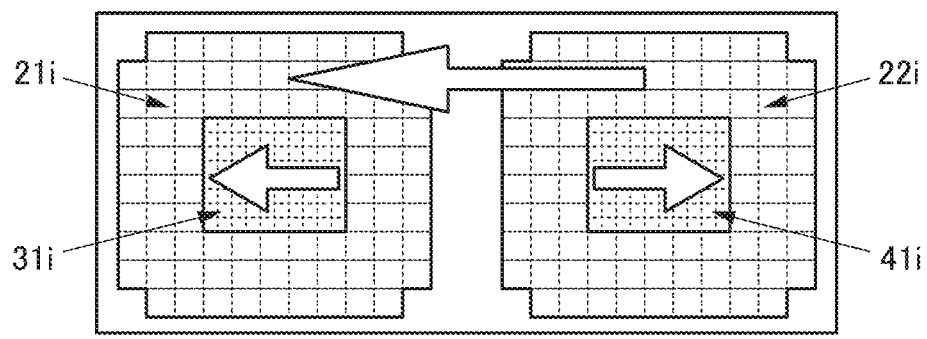

The display panel 30 and the display panel 40 are display panels independent of each other. Thus, as indicated by a small arrow in FIG. 8A, image data rewriting can proceed from the right side of each of the image 31i and the image 41i that are to be seen. Alternatively, image data rewriting may proceed from the left side of an image to be seen. Alternatively, the directions in which image data rewriting proceeds may be different from each other as illustrated in FIG. 8B. The directions of image data rewriting correspond to the specifications of the display panels or the directions in which the display panels are set.

The frame frequency of the display panel 20 may be different from or the same as that of each of the display panel 30 and the display panel 40. For example, human eyes have lower resolution in the peripheral field of view than in the central field of view; thus, even when the frame frequency of the display panel 20 is reduced, the difference from a high frame frequency is unlikely to be perceived by the user. Accordingly, the frame frequency of the display panel 20 can be lower than that of each of the display panel 30 and the display panel 40, reducing the amount of data communication and power consumption.

Note that the number of pixels (the number of rows) and the horizontal period are different between the display panel 20 and each of the display panel 30 and the display panel 40; thus, the panels sometimes have different driving frequencies even when having the same frame frequency.

Described here is an example of writing image data for each of the image 21i, the image 22i, the image 31i, and the image 41i.

Figure 9:
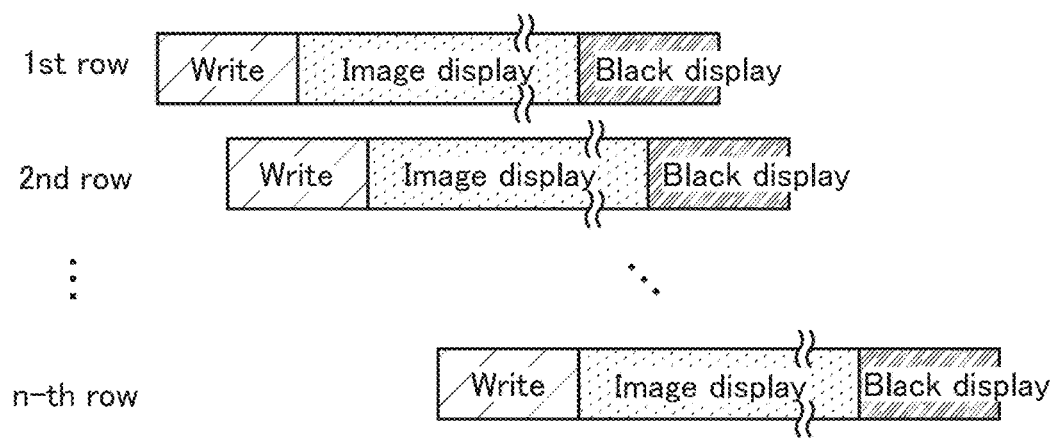
FIG. 9 is a diagram illustrating the timing of image rewriting.

FIG. 9 is a diagram showing a typical example of timings at which image data writing, image display, and black display are performed by a line-sequential method for a first row to an n-th row (n is an integer greater than or equal to 3) of the display panel. Here, black display contributes to prevention of an afterimage or the like and is also referred to as black insertion. Note that black display is not necessarily performed. FIG. 9 shows that image data is sequentially written from the first row and image display is performed immediately after the image data writing.

Figure 10A:
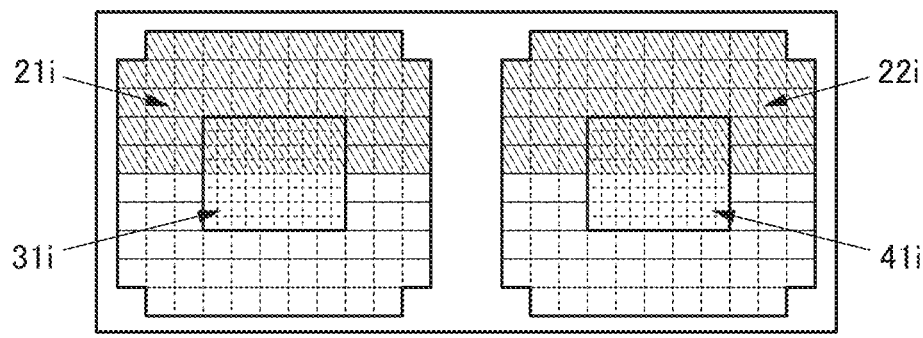
FIG. 10A to FIG. 10C are diagrams each illustrating image rewriting.
Figure 10B:
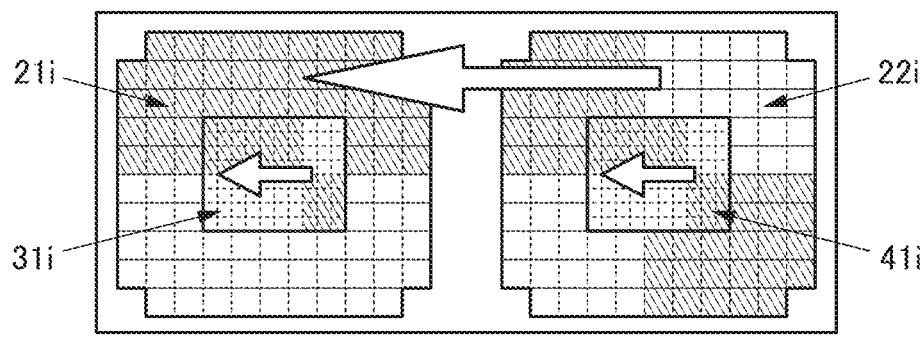
Figure 10C:
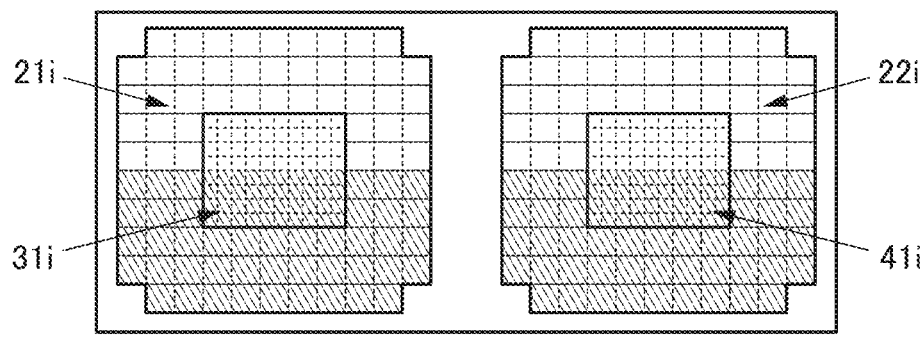

FIG. 10A to FIG. 10C are diagrams illustrating display examples. FIG. 10A illustrates an image in a frame (the upper half is black and the lower half is white), which is switched to a vertically flipped image in the next frame (FIG. 10C).

Here, image data writing is started by the line-sequential method shown in FIG. 9 concurrently for the display panel 20 (the image 21i and the image 22i), the display panel 30 (the image 31i), and the display panel 40 (the image 41i). The image data writing proceeds in the direction shown in FIG. 8A.

FIG. 10B is a diagram illustrating an image at a time when image data rewriting is being carried out. The image 22i is rewritten from the right side row by row (the row corresponds to the vertical direction in the drawing); at the same time, each of the image 31i and the image 41i is also rewritten from the right side row by row.

In the case where image rewriting is performed through the state illustrated in FIG. 10B, the user sees a partial image rewriting. In particular, a region where the image 21i and the image 31i are discontinuous or the like is noticeable. Like the screen-door effect or the like, this might hinder the user from feeling a sense of immersion or the like.

Hence, in one embodiment of the present invention, a data retention period is provided between image data writing and image display in each display panel, and image display is performed concurrently in all rows. Note that in the example described here, the organic EL display device is used for each display panel; alternatively, a display device using a micro LED or a liquid crystal display device can also be used.

Figure 11A:
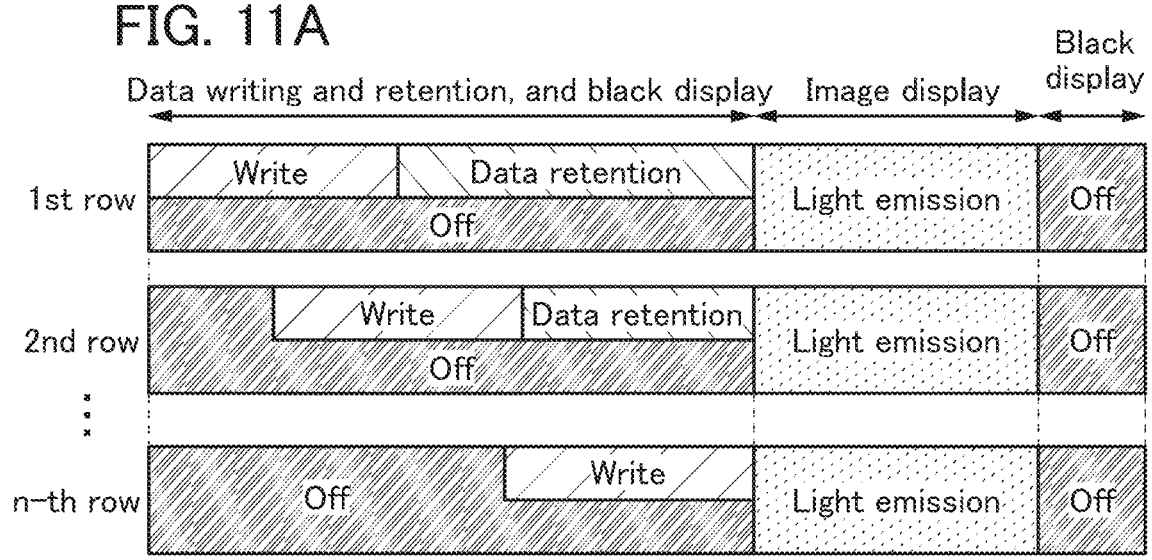
FIG. 11A is a diagram illustrating the timing of image rewriting.

FIG. 11A is a diagram showing an example of timings at which image data writing, data retention, image display, and black display are performed by the line-sequential method for a first row to an n-th row (n is an integer greater than or equal to 3) of each display panel. Here, the light-emitting device is turned off to be in a state of black display in the periods of data writing, data retention, and black display. Then, after data writing in the n-th row is completed, light emission is concurrently performed in the pixels of all rows and light is off after a certain period all at once.

Figure 12A:
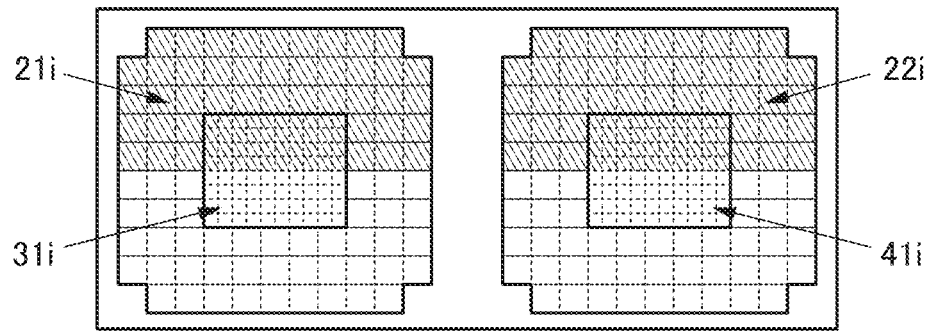
FIG. 12A to FIG. 12C are diagrams each illustrating image rewriting.
Figure 12B:
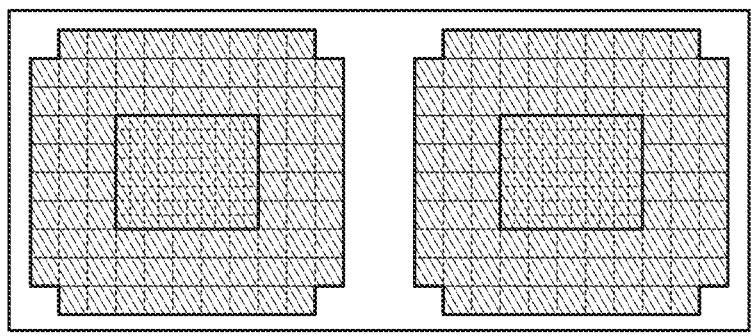
Figure 12C:
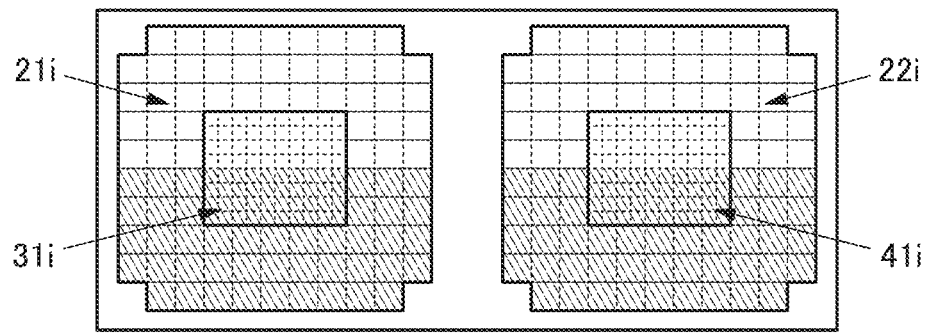

With the above operation, an image illustrated in FIG. 12A is rewritten to an image illustrated in FIG. 12C not through the image as illustrated in FIG. 10B but through black display illustrated in FIG. 12B. This allows the user to easily feel a sense of immersion without seeing a partial image rewriting.

Note that devising of the operation of the pixel circuit is needed to perform the above operation. Alternatively, it is possible to use the pixel circuit that can make the light-emitting device off.

Figure 11B:
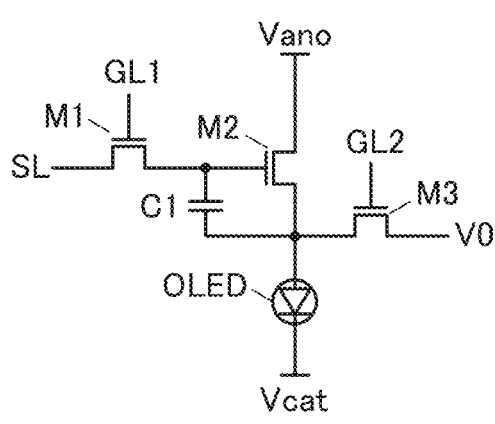
FIG. 11B and FIG. 11C are diagrams each illustrating a pixel circuit.

FIG. 11B is a pixel circuit generally used for driving an organic EL element and includes three transistors (transistors M1, M2, and M3), one capacitor C1, and a light-emitting device OLED.

One of a source and a drain of the transistor M1 is electrically connected to a gate of the transistor M2 and one electrode of the capacitor C1. One of a source and a drain of the transistor M2 is electrically connected to one of a source and a drain of the transistor M3, the other electrode of the capacitor C1, and one electrode of the light-emitting device OLED.

The other of the source and the drain of the transistor M1 is electrically connected to a source line SL, and a gate of the transistor M1 is electrically connected to a gate line GL1. The other of the source and the drain of the transistor M2 is electrically connected to an anode power supply line Vano. The other of the source and the drain of the transistor M3 is electrically connected to a wiring V0, and a gate of the transistor M3 is electrically connected to a gate line GL2. The other electrode of the light-emitting device OLED is electrically connected to a cathode power supply line Vcat.

Here, the source line SL can be electrically connected to a source driver. The gate lines GL1 and GL2 can be electrically connected to a gate driver. The anode power supply line Vano can be a high potential power supply line. The cathode power supply line Vcat can be a low power supply potential line. The wiring V0 can be supplied with, for example, a constant potential such as 0 V.

The basic operation of the pixel circuit illustrated in FIG. 11B is as follows. First, the transistor M1 and the transistor M3 are turned on. At this time, image data is supplied to the gate of the transistor M2. The source of the transistor M2 is reset to the potential of the wiring V0. That is, the image data can be written to the gate in a state where the source potential of the transistor M2 is stable. Here, the capacitor C1 functions as a capacitor for retaining the potential of the gate of the transistor M2.

When a Vgs (a gate-source voltage) of the transistor M2 is higher than or equal to the threshold voltage at this time, the transistor M2 is turned on and current flows through the light-emitting device OLED, so that light is emitted.

In the above case where light might be emitted at the same time as image data writing, for example, a power supply potential is controlled because the operation of one embodiment of the present invention cannot be performed. Specifically, in the image data writing period, the data retention period, and the non-lighting period, the potential of the anode power supply line Vano is lowered to be almost equal to the potential of the cathode power supply line Vcat. Alternatively, the potential of the cathode power supply line Vcat is lowered to be almost equal to the potential of the anode power supply line Vano. Note that in the non-lighting period, the light-emitting device OLED may be turned off by writing image data for black display.

Such a control of the power supply potential significantly reduces the potential difference between the source and the drain of the transistor M2; thus, no current flows through the transistor M2 and the light-emitting device OLED can be inhibited from emitting light. In the image display period, the potential of the anode power supply line Vano or the potential of the cathode power supply line Vcat is returned to the original potential, so that current flows through the transistor M2 and the light-emitting device OLED can emit light.

Figure 11C:
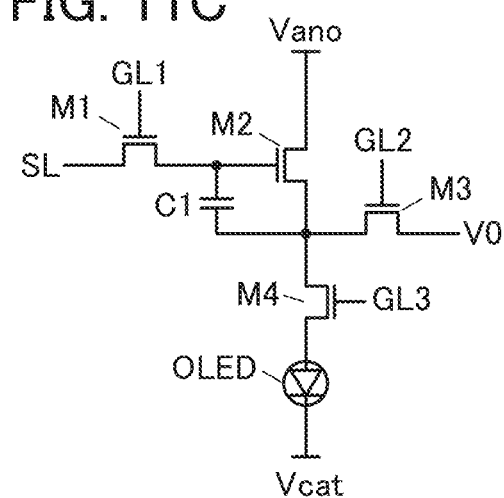

The structure of FIG. 11C is obtained by adding a transistor M4 to the pixel circuit illustrated in FIG. 11B. The transistor M4 functions as a switch for turning on or off the light-emitting device OLED.

One of a source and a drain of the transistor M4 is electrically connected to one of the source and the drain of the transistor M2, one of the source and the drain of the transistor M3, and the other electrode of the capacitor C1. The other of the source and the drain of the transistor M4 is electrically connected to one electrode of the light-emitting device OLED. A gate of the transistor M4 is electrically connected to a gate line GL3. The gate line GL3 can be electrically connected to a gate driver.

Figure 13:
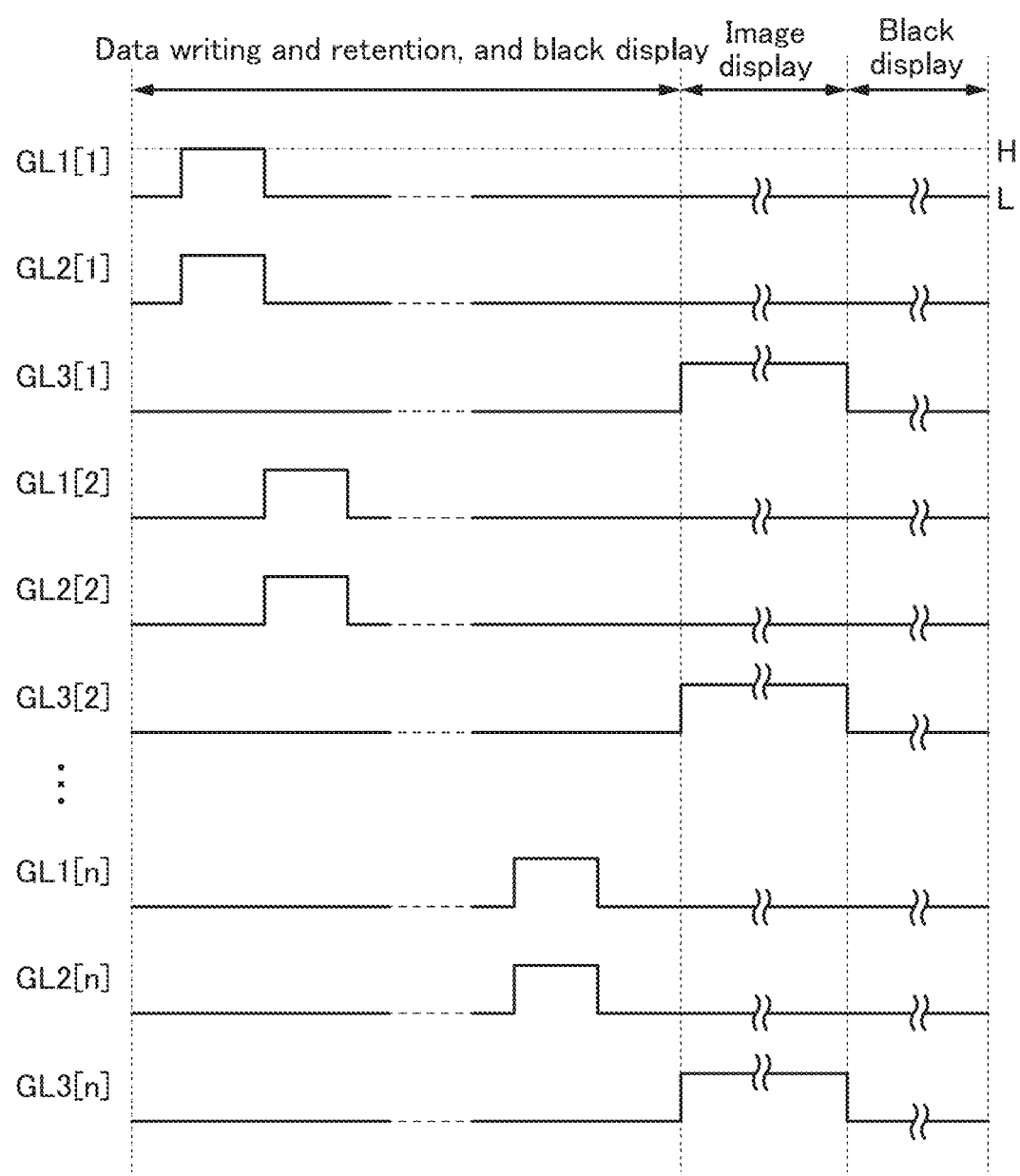
FIG. 13 is a timing chart illustrating the operation of a pixel circuit.

The operation of the pixel circuit illustrated in FIG. 11C is described with reference to a timing chart shown in FIG. 13. FIG. 13 illustrates signals supplied to gate lines GL1 to GL3 each connected to pixels in the first row to the n-th row. Note that the number inside parentheses following the reference numeral denotes a row number; for example, a gate line GL1[1] refers to the gate line GL1 connected to pixels in the first row.

First, a high potential (H) is supplied to the gate line GL1[1] and a gate line GL2[1] in the first row; then, the transistor M1 and the transistor M3 are turned on, a potential V0 is supplied to the source of the transistor M2, and image data is supplied to the gate thereof. This operation corresponds to writing of image data.

Next, a low potential (L) is supplied to the gate line GL1[1] and the gate line GL2[1]; then, the transistor M1 and the transistor M3 are turned off. The data retention period starts from this time. In the data writing period and the data retention period, the light-emitting device OLED does not emit light because the transistor M4 is off. That is, black display is performed in this state.

Subsequently, the operation similar to that in the first row is performed sequentially from the second row to the n-th row, so that image data is written and retained. Note that the data retention period is not necessarily provided in the n-th row.

When a high potential (H) is supplied to a gate line GL3[1] to a gate line GL3[n] at the same timing after the wiring of image data in the n-th row is completed, the transistor M4 in each pixel is turned on. Then, current based on the image data written to the gate of the transistor M2 flows through the light-emitting device OLED in each pixel.

In other words, the light-emitting device OLED in each pixel can emit light with the signals supplied at the same timing. This light-emitting period of the light-emitting device OLED corresponds to the image display period.

After a predetermined period elapses, a low potential (L) is supplied to the gate line GL3[1] to the gate line GL3[n] at the same timing; then, the transistor M4 in each pixel is turned off and the light-emitting device OLED is turned off.

The black display period starts from this time. The black display period continues in parallel with the image data writing period and the data retention period until the next image display period starts.

The above operation enables the three display panels to emit light in the same period while image data has been rewritten. Accordingly, the user can see a high-quality image without seeing images that are being rewritten as illustrated in FIG. 10B.

Figure 14A:
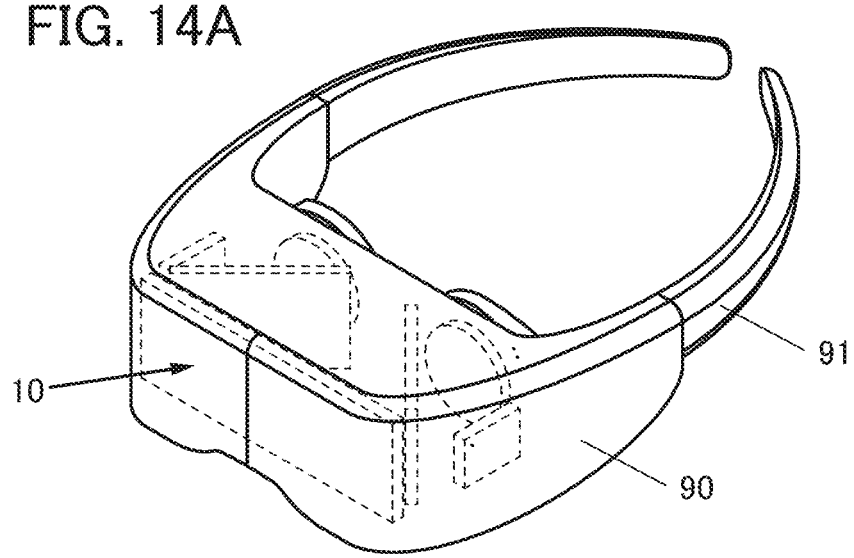
FIG. 14A and FIG. 14B are diagrams illustrating a goggles-type electronic device.
Figure 14B:
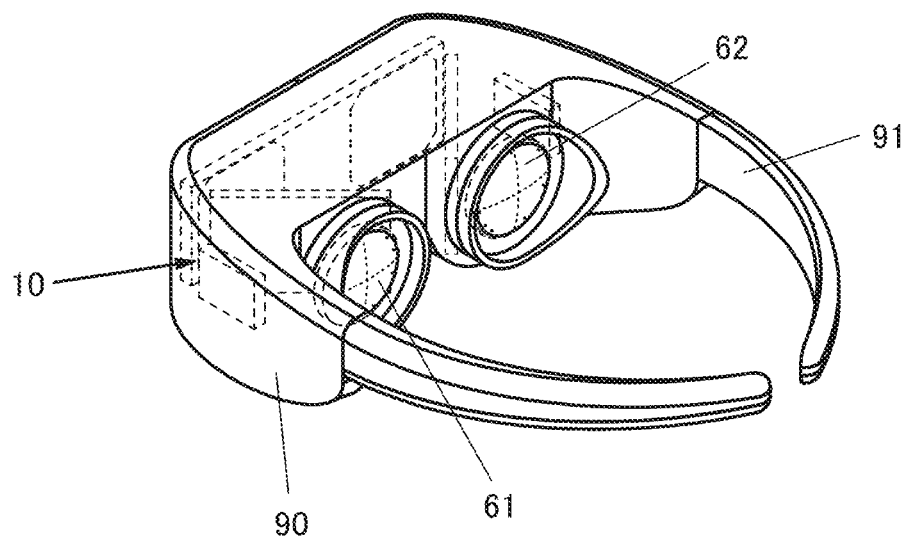

FIG. 14A and FIG. 14B are diagrams illustrating an example of a goggles-type device including the display apparatus 10 illustrated in FIG. 1. The goggles-type device includes the display apparatus 10 in a housing 90 and is sometimes referred to as VR goggles, a VR headset, VR glasses, or the like. There is no limitation on the application, and the goggles-type device can also be used for AR.

The display apparatus 10 is incorporated into the housing 90 so that surfaces of the lenses 61 and 62 are exposed on the inner side. The lens 61 is for the left eye and the lens 62 is for the right eye. When the display apparatus 10 displays an image corresponding to each eye, the user can feel a sense of three-dimensionality of the images.

The housing 90 or a band 91 may be provided with an input terminal and an output terminal. A cable for supplying a video signal from a video output device or the like, power for charging a battery provided in the housing 90, or the like can be connected to the input terminal. The output terminal can function as, for example, an audio output terminal to which earphones, headphones, or the like can be connected. Note that in the case where audio data can be output by wireless communication or sound is output from an external video output device, the audio output terminal is not necessarily provided.

A wireless communication module, a memory module, and the like may be provided inside the housing 90 or the band 91. Content to be watched can be downloaded via wireless communication using the wireless communication module and can be stored in the memory module. Accordingly, the user can watch the downloaded content offline whenever the user wants.

A sight line sensor may be provided in the housing 90. For example, operation buttons for power-on, power-off, sleep, volume control, channel change, menu display, selection, decision, and back, and operation buttons for play, stop, pause, fast forward, and rewinding of moving images are displayed to be seen, so that the operations can be performed.

Using the display apparatus 10 of one embodiment of the present invention for the goggles-type device can provide an electronic device with a reduced screen-door effect, so that the user can strongly feel a sense of three-dimensionality, a sense of immersion, and a realistic sensation. Moreover, the electronic device can have low power consumption and high reliability.

At least part of this embodiment can be implemented in combination with the other embodiments described in this specification as appropriate.

Embodiment 2

In this embodiment, structure examples of a display panel that can be used for the electronic device of one embodiment of the present invention will be described. A display panel described below as an example can be used for the display panel 20, the display panel 30, and the display panel 40 in Embodiment 1.

The display panel included in the electronic device of one embodiment of the present invention can include light-emitting devices. The display panel includes two or more pixels of different emission colors. The pixels each include a light-emitting device. The light-emitting device includes a pair of electrodes and an EL layer therebetween. The light-emitting device is preferably an organic EL element (organic electroluminescent element). Two or more light-emitting devices of different emission colors include EL layers containing different light-emitting materials. For example, when three kinds of light-emitting devices that emit red (R), green (G), and blue (B) light are included, a full-color display panel can be achieved.

In the case of manufacturing a display panel including a plurality of light-emitting devices of different emission colors, layers (light-emitting layers) containing at least light-emitting materials each need to be formed in an island shape. In the case of separately forming some or all of EL layers, a method for forming an island-shaped organic film by an evaporation method using a shadow mask such as a metal mask is known. However, this method causes a deviation from the designed shape and position of the island-shaped organic film due to various influences such as the accuracy of the metal mask, the positional deviation between the metal mask and a substrate, a warp of the metal mask, and expansion of the outline of a deposited film due to vapor scattering, for example; accordingly, it is difficult to achieve the high resolution and high aperture ratio of the display panel. In addition, the outline of the layer might blur during evaporation, so that the thickness of an end portion might be reduced. That is, the thickness of an island-shaped light-emitting layer might vary from place to place. In addition, in the case of manufacturing a display panel with a large size, high definition, or high resolution, a manufacturing yield might be reduced because of low dimensional accuracy of the metal mask and deformation due to heat or the like. Thus, a measure has been taken for a pseudo increase in resolution (also referred to as pixel density) by employing a unique pixel arrangement such as a PenTile arrangement.

Note that in this specification and the like, the term "island shape" refers to a state where two or more layers formed using the same material in the same step are physically separated from each other. For example, "island-shaped light-emitting layer" refers to a state where the light-emitting layer and its adjacent light-emitting layer are physically separated from each other.

In one embodiment of the present invention, fine patterning of EL layers is performed by photolithography without using a shadow mask such as a fine metal mask (an FMM). Accordingly, it is possible to achieve a display panel with high resolution and a high aperture ratio, which has been difficult to achieve. Moreover, since the EL layers can be formed separately, it is possible to achieve a display panel that performs extremely clear display with high contrast and high display quality. Note that, fine patterning of the EL layers may be performed using both a metal mask and photolithography, for example.

In addition, some or all of the EL layers can be physically divided from each other. This can inhibit leakage current from flowing between adjacent light-emitting devices through a layer (also referred to as a common layer) shared by the light-emitting devices. Thus, it is possible to prevent crosstalk due to unintended light emission, so that a display panel with extremely high contrast can be achieved. In particular, a display panel having high current efficiency at low luminance can be achieved.

The display panel of one embodiment of the present invention can also be obtained by combining a light-emitting device that emits white light and a color filter. In that case, light-emitting devices having the same structure can be used as light-emitting devices provided in pixels (subpixels) that emit light of different colors, which allows all the layers to be common layers. In addition, some or all of the EL layers may be divided from each other in a step using photolithography. Thus, leakage current through the common layer is inhibited; accordingly, a high-contrast display panel can be achieved. In particular, when an element has a tandem structure in which a plurality of light-emitting layers are stacked with a highly conductive intermediate layer therebetween, leakage current through the intermediate layer can be effectively prevented, so that a display panel with high luminance, high resolution, and high contrast can be achieved.

In the case where the EL layer is processed by a photolithography method, part of the light-emitting layer is sometimes exposed to cause degradation. Thus, an insulating layer covering at least a side surface of the island-shaped light-emitting layer is preferably provided. The insulating layer may cover part of a top surface of an island-shaped EL layer. For the insulating layer, a material having a barrier property against water and oxygen is preferably used. For example, an inorganic insulating film that is less likely to diffuse water or oxygen can be used. This can inhibit degradation of the EL layer and can achieve a highly reliable display panel.

Moreover, between two adjacent light-emitting devices, there is a region (a concave portion) where none of the EL layers of the light-emitting devices is provided. In the case where a common electrode or a common electrode and a common layer are formed to cover the concave portion, a phenomenon in which the common electrode is divided by a step at an end portion of the EL layer (such a phenomenon is also referred to as disconnection) might occur, which might cause insulation of the common electrode over the EL layer. In view of this, a local gap between the two adjacent light-emitting devices is preferably filled with a resin layer (also referred to as LFP: Local Filling Planarization) functioning as a planarization film. The resin layer has a function of a planarization film. This structure can inhibit disconnection of the common layer or the common electrode and can achieve a highly reliable display panel.

More specific structure examples of the display panel of one embodiment of the present invention will be described below with reference to drawings.

Structure Example 1

Figure 15A:
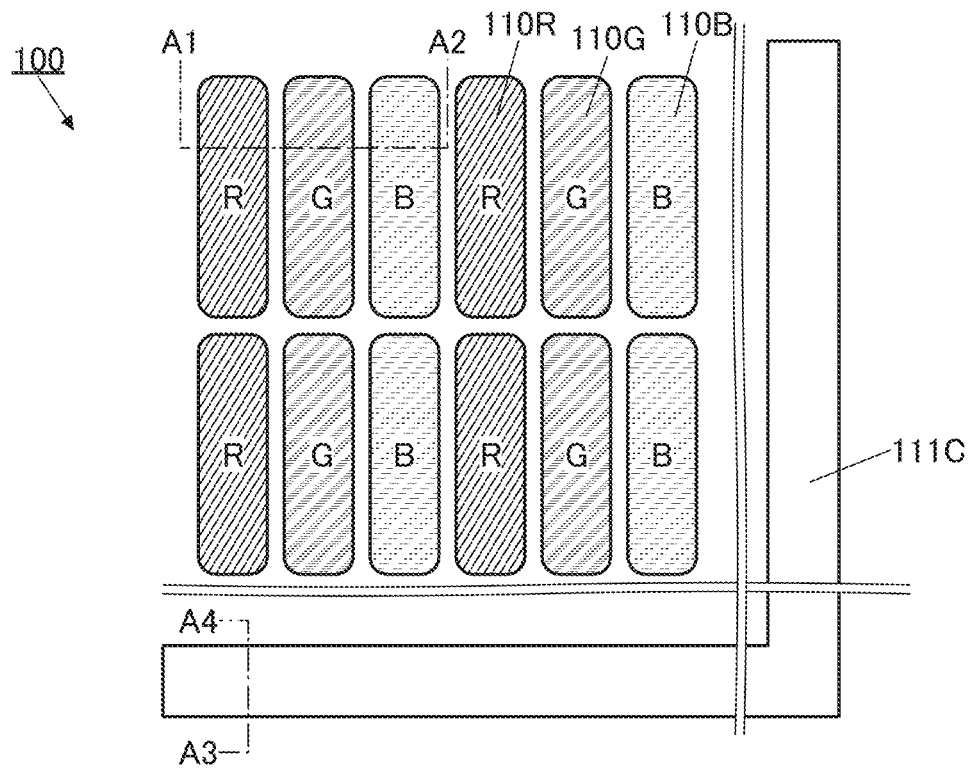
FIG. 15A to FIG. 15C are diagrams illustrating a structure example of a display panel.

FIG. 15A illustrates a schematic top view of a display panel 100 of one embodiment of the present invention. The display panel 100 includes, over a substrate 101, a plurality of light-emitting devices 110R exhibiting red, a plurality of light-emitting devices 110G exhibiting green, and a plurality of light-emitting devices 110B exhibiting blue. In FIG. 15A, light-emitting regions of the light-emitting devices are denoted by R, G, and B to easily differentiate the light-emitting devices.

The light-emitting devices 110R, the light-emitting devices 110G, and the light-emitting devices 110B are each arranged in a matrix. FIG. 15A illustrates what is called a stripe arrangement, in which the light-emitting devices of the same color are arranged in one direction. Note that an arrangement method of the light-emitting devices is not limited thereto; an arrangement method such as an S-stripe arrangement, a delta arrangement, a Bayer arrangement, or a zigzag arrangement may be employed, or a PenTile arrangement, a diamond arrangement, or the like can also be used.

As each of the light-emitting devices 110R, the light-emitting devices 110G, and the light-emitting devices 110B, an OLED (Organic Light Emitting Diode) or a QLED (Quantum-dot light Emitting Diode) is preferably used, for example. Examples of a light-emitting substance contained in the EL element include a substance that emits fluorescent light (a fluorescent material), a substance that emits phosphorescent light (a phosphorescent material), and a substance that exhibits thermally activated delayed fluorescence (a thermally activated delayed fluorescent (TADF) material). As the light-emitting substance contained in the EL element, not only an organic compound but also an inorganic compound (a quantum dot material or the like) can be used.

FIG. 15A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting devices 110R and the like are arranged.

The connection electrode 111C can be provided along the outer periphery of the display region. For example, the connection electrode 111C may be provided along one side of the outer periphery of the display region, or the connection electrode 111C may be provided across two or more sides of the outer periphery of the display region. That is, in the case where the display region has a rectangular top surface shape, the top surface shape of the connection electrode 111C can be a band shape (a rectangle), an L shape, a U shape (a square bracket shape), a quadrangular shape, or the like.

Figure 15B:
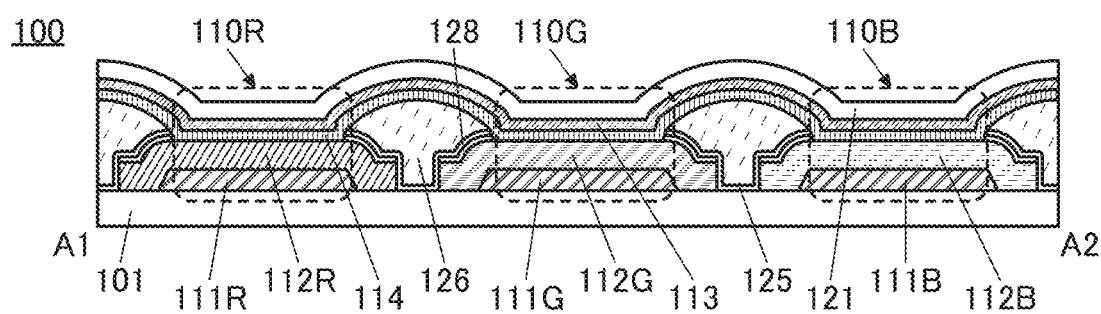
Figure 15C:
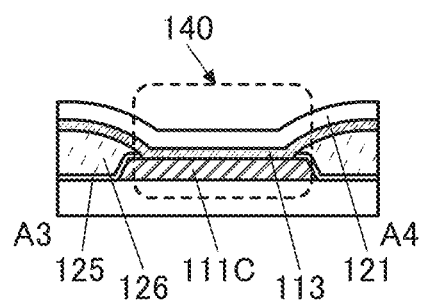

FIG. 15B and FIG. 15C are schematic cross-sectional views corresponding to the dashed-dotted line A1-A2 and the dashed-dotted line A3-A4, respectively, in FIG. 15A. FIG. 15B illustrates a schematic cross-sectional view of the light-emitting device 110R, the light-emitting device 110G, and the light-emitting device 110B, and FIG. 15C illustrates a schematic cross-sectional view of a connection portion 140 where the connection electrode 111C and the common electrode 113 are connected to each other.

The light-emitting device 110R includes a pixel electrode 111R, an organic layer 112R, a common layer 114, and the common electrode 113. The light-emitting device 110G includes a pixel electrode 111G, an organic layer 112G, the common layer 114, and the common electrode 113. The light-emitting device 110B includes a pixel electrode 111B, an organic layer 112B, the common layer 114, and the common electrode 113. The common layer 114 and the common electrode 113 are provided to be shared by the light-emitting device 110R, the light-emitting device 110G, and the light-emitting device 110B.

The organic layer 112R included in the light-emitting device 110R contains at least a light-emitting organic compound that emits red light. The organic layer 112G included in the light-emitting device 110G contains at least a light-emitting organic compound that emits green light. The organic layer 112B included in the light-emitting device 110B contains at least a light-emitting organic compound that emits blue light. Each of the organic layer 112R, the organic layer 112G, and the organic layer 112B can also be referred to as an EL layer and includes at least a layer containing a light-emitting substance (a light-emitting layer).

Hereinafter, the term "light-emitting device 110" is sometimes used to describe matters common to the light-emitting device 110R, the light-emitting device 110G, and the light-emitting device 110B. Similarly, in the description of matters common to components that are distinguished from each other using alphabets, such as the organic layer 112R, the organic layer 112G, and the organic layer 112B, reference numerals without alphabets are sometimes used.

The organic layer 112 and the common layer 114 can each independently include one or more of an electron-injection layer, an electron-transport layer, a hole-injection layer, and a hole-transport layer. For example, it is possible to employ a structure in which the organic layer 112 has a stacked-layer structure of a hole-injection layer, a hole-transport layer, a light-emitting layer, and an electron-transport layer from the pixel electrode 111 side and the common layer 114 includes an electron-injection layer.

The pixel electrode 111R, the pixel electrode 111G, and the pixel electrode 111B are provided for the respective light-emitting devices. Each of the common electrode 113 and the common layer 114 is provided as a continuous layer shared by the light-emitting devices. A conductive film having a property of transmitting visible light is used for either the pixel electrodes or the common electrode 113, and a conductive film having a reflective property is used for the other. When the pixel electrodes have light-transmitting properties and the common electrode 113 has a reflective property, a bottom-emission display panel can be obtained. In contrast, when the pixel electrodes have reflective properties and the common electrode 113 has a light-transmitting property, a top-emission display panel can be obtained. Note that when both the pixel electrodes and the common electrode 113 have light-transmitting properties, a dual-emission display panel can also be obtained.

A protective layer 121 is provided over the common electrode 113 to cover the light-emitting device 110R, the light-emitting device 110G, and the light-emitting device 110B. The protective layer 121 has a function of preventing diffusion of impurities such as water into each light-emitting device from the above.

An end portion of the pixel electrode 111 preferably has a tapered shape. In the case where the end portion of the pixel electrode 111 has a tapered shape, the organic layer 112 that is provided along the end portion of the pixel electrode 111 can also have a tapered shape. When the end portion of the pixel electrode 111 has a tapered shape, coverage with the organic layer 112 provided beyond the end portion of the pixel electrode 111 can be increased. Furthermore, a side surface of the pixel electrode 111 preferably has a tapered shape, in which case foreign substances (for example, also referred to as dust or particles) in a manufacturing process are easily removed by processing such as cleaning.

Note that in this specification and the like, a tapered shape indicates a shape in which at least part of a side surface of a structure is inclined to a substrate surface. For example, a tapered shape preferably includes a region where the angle formed between the inclined side surface and the substrate surface (such an angle is also referred to as a taper angle) is less than 90°.

The organic layer 112 is processed into an island shape by a photolithography method. Thus, the angle formed between a top surface and a side surface of an end portion of the organic layer 112 is approximately 90°. In contrast, an organic film formed using an FMM (Fine Metal Mask) or the like has a thickness that tends to gradually decrease with decreasing the distance from an end portion, and has a top surface forming a slope in an area extending in the range of greater than or equal to 1 µm and less than or equal to 10 µm, for example. Thus, such an organic film has a shape whose top surface and side surface are difficult to distinguish from each other.

An insulating layer 125, a resin layer 126, and a layer 128 are included between two adjacent light-emitting devices.

Between two adjacent light-emitting devices, side surfaces of the organic layers 112 are provided to face each other with the resin layer 126 therebetween. The resin layer 126 is positioned between the two adjacent light-emitting devices and is provided to fill end portions of the organic layers 112 and a region between the two organic layers 112. The resin layer 126 has a top surface with a smooth convex shape. The common layer 114 and the common electrode 113 are provided to cover a top surface of the resin layer 126.

The resin layer 126 functions as a planarization film that fills a step positioned between two adjacent light-emitting devices. Providing the resin layer 126 can prevent a phenomenon in which the common electrode 113 is divided by a step at an end portion of the organic layer 112 (such a phenomenon is also referred to as disconnection) from occurring and the common electrode over the organic layer 112 from being insulated. The resin layer 126 can also be referred to as LFP (Local Filling Planarization).

An insulating layer containing an organic material can be suitably used as the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of these resins, or the like can be used, for example. For the resin layer 126, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used.

Alternatively, a photosensitive resin can be used for the resin layer 126. A photoresist may be used for the photosensitive resin. As the photosensitive resin, a positive photosensitive material or a negative photosensitive material can be used.

The resin layer 126 may contain a material that absorbs visible light. For example, the resin layer 126 itself may be made of a material that absorbs visible light, or the resin layer 126 may contain a pigment that absorbs visible light. For example, for the resin layer 126, it is possible to use a resin that can be used as a color filter that transmits red, blue, or green light and absorbs other light, a resin that contains carbon black as a pigment and functions as a black matrix, or the like.

The insulating layer 125 is provided in contact with side surfaces of the organic layer 112. In addition, the insulating layer 125 is provided to cover an upper end portion of the organic layer 112. Furthermore, part of the insulating layer 125 is provided in contact with a top surface of the substrate 101.

The insulating layer 125 is positioned between the resin layer 126 and the organic layer 112 and functions as a protective film for preventing contact between the resin layer 126 and the organic layer 112. When the organic layer 112 and the resin layer 126 are in contact with each other, the organic layer 112 might be dissolved by an organic solvent or the like used at the time of forming the resin layer 126. Therefore, the insulating layer 125 is provided between the organic layer 112 and the resin layer 126 to protect the side surfaces of the organic layer 112.

An insulating layer containing an inorganic material can be used for the insulating layer 125. For the insulating layer 125, an inorganic insulating film such as an oxide insulating film, a nitride insulating film, an oxynitride insulating film, or a nitride oxide insulating film can be used, for example. The insulating layer 125 may have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film that is formed by an ALD method is used for the insulating layer 125, it is possible to form the insulating layer 125 that has a small number of pinholes and has an excellent function of protecting the EL layer.

Note that in this specification and the like, oxynitride refers to a material that contains more oxygen than nitrogen in its composition, and nitride oxide refers to a material that contains more nitrogen than oxygen in its composition. For example, silicon oxynitride refers to a material that contains more oxygen than nitrogen in its composition, and silicon nitride oxide refers to a material that contains more nitrogen than oxygen in its composition.

For the formation of the insulating layer 125, a sputtering method, a CVD method, a PLD method, an ALD method, or the like can be used. The insulating layer 125 is preferably formed by an ALD method that provides good coverage.

In addition, a structure may be employed in which a reflective film (e.g., a metal film containing one or more selected from silver, palladium, copper, titanium, aluminum, and the like) is provided between the insulating layer 125 and the resin layer 126 so that light emitted from the light-emitting layer is reflected by the reflective film. This can improve light extraction efficiency.

The layer 128 is a remaining part of a protective layer (also referred to as a mask layer or a sacrificial layer) for protecting the organic layer 112 during etching of the organic layer 112. For the layer 128, a material that can be used for the insulating layer 125 can be used. It is particularly preferable to use the same material for the layer 128 and the insulating layer 125 because an apparatus or the like for processing can be used in common.

In particular, since a metal oxide film such as an aluminum oxide film or a hafnium oxide film or an inorganic insulating film such as a silicon oxide film that is formed by an ALD method has a small number of pinholes, such a film has an excellent function of protecting the EL layer and can be suitably used for the insulating layer 125 and the layer 128.

The protective layer 121 can have, for example, a single-layer structure or a stacked-layer structure including at least an inorganic insulating film. Examples of the inorganic insulating film include an oxide film and a nitride film, such as a silicon oxide film, a silicon oxynitride film, a silicon nitride oxide film, a silicon nitride film, an aluminum oxide film, an aluminum oxynitride film, and a hafnium oxide film. Alternatively, a semiconductor material or a conductive material such as indium gallium oxide, indium zinc oxide, indium tin oxide, or indium gallium zinc oxide may be used for the protective layer 121.

For the protective layer 121, a stacked film of an inorganic insulating film and an organic insulating film can be used. For example, a structure in which an organic insulating film is sandwiched between a pair of inorganic insulating films is preferable. Furthermore, the organic insulating film preferably functions as a planarization film. This enables a top surface of the organic insulating film to be flat, which results in improved coverage with the inorganic insulating film thereover and a higher barrier property. Moreover, a top surface of the protective layer 121 is flat, which is preferable because the influence of an uneven shape due to a lower structure can be reduced in the case where a component (e.g., a color filter, an electrode of a touch sensor, a lens array, or the like) is provided above the protective layer 121.

FIG. 15C illustrates the connection portion 140 in which the connection electrode 111C and the common electrode 113 are electrically connected to each other. In the connection portion 140, an opening portion is provided in the insulating layer 125 and the resin layer 126 over the connection electrode 111C. The connection electrode 111C and the common electrode 113 are electrically connected to each other in the opening portion.

Although FIG. 15C illustrates the connection portion 140 in which the connection electrode 111C and the common electrode 113 are electrically connected to each other, the common electrode 113 may be provided over the connection electrode 111C with the common layer 114 therebetween. Particularly in the case where a carrier-injection layer is used as the common layer 114, for example, a material used for the common layer 114 has sufficiently low electrical resistivity and the common layer 114 can be formed to be thin. Thus, problems do not arise in many cases even when the common layer 114 is positioned in the connection portion 140. Accordingly, the common electrode 113 and the common layer 114 can be formed using the same shielding mask, so that manufacturing cost can be reduced.

Structure Example 2

A display panel whose structure is partly different from that of Structure example 1 is described below. Note that the above description can be referred to for portions common to those in Structure example 1, and the description is omitted in some cases.

Figure 16A:
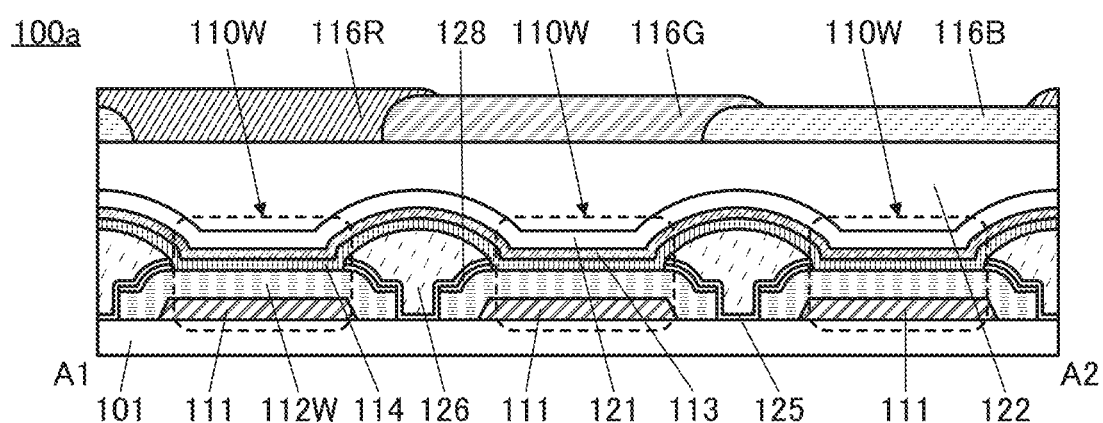
FIG. 16A and FIG. 16B are diagrams each illustrating a structure example of a display panel.

FIG. 16A is a schematic cross-sectional view of a display panel 100a. The display panel 100a is different from the display panel 100 mainly in the structure of the light-emitting device and including a coloring layer.

The display panel 100a includes light-emitting devices 110W that emit white light. The light-emitting devices 110W each include the pixel electrode 111, an organic layer 112W, the common layer 114, and the common electrode 113. The organic layer 112W emits white light. For example, the organic layer 112W can contain two or more kinds of light-emitting materials whose emission colors are complementary colors. For example, the organic layer 112W can contain a light-emitting organic compound that emits red light, a light-emitting organic compound that emits green light, and a light-emitting organic compound that emits blue light. Alternatively, the organic layer 112W may contain a light-emitting organic compound that emits blue light and a light-emitting organic compound that emits yellow light.

The organic layer 112W is divided between two adjacent light-emitting devices 110W. Thus, leakage current flowing between the adjacent light-emitting devices 110W through the organic layer 112W can be inhibited and crosstalk due to the leakage current can be inhibited. Accordingly, the display panel can achieve high contrast and high color reproducibility.

An insulating layer 122 that functions as a planarization film is provided over the protective layer 121, and a coloring layer 116R, a coloring layer 116G, and a coloring layer 116B are provided over the insulating layer 122.

An organic resin film or an inorganic insulating film with a flat top surface can be used for the insulating layer 122. The insulating layer 122 is a formation surface on which the coloring layer 116R, the coloring layer 116G, and the coloring layer 116B are formed. Thus, with a flat top surface of the insulating layer 122, the thickness of the coloring layer 116R or the like can be uniform and color purity can be increased. Note that when the thickness of the coloring layer 116R or the like is non-uniform, the amount of light absorption varies depending on a place in the coloring layer 116R, which might decrease the color purity.

Structure Example 3

Figure 16B:
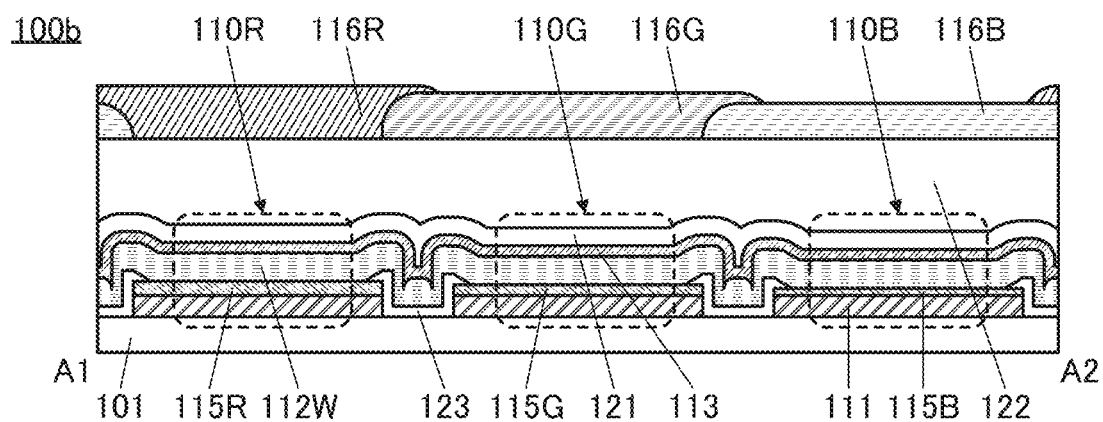

FIG. 16B illustrates a schematic cross-sectional view of a display panel 100b.

The light-emitting device 110R includes the pixel electrode 111, a conductive layer 115R, the organic layer 112W, and the common electrode 113. The light-emitting device 110G includes the pixel electrode 111, a conductive layer 115G, the organic layer 112W, and the common electrode 113. The light-emitting device 110B includes the pixel electrode 111, a conductive layer 115B, the organic layer 112W, and the common electrode 113. The conductive layer 115R, the conductive layer 115G, and the conductive layer 115B each have a light-transmitting property and function as an optical adjustment layer.

A film that reflects visible light is used for the pixel electrode 111 and a film having a property of reflecting and transmitting visible light is used for the common electrode 113, so that a micro resonator (microcavity) structure can be achieved. In that case, by adjusting the thicknesses of the conductive layer 115R, the conductive layer 115G, and the conductive layer 115B to obtain optimal optical path lengths, light with different wavelengths and increased intensities can be obtained from the light-emitting device 110R, the light-emitting device 110G, and the light-emitting device 110B even when the organic layer 112 that emits white light is used.

Furthermore, the coloring layer 116R, the coloring layer 116G, and the coloring layer 116B are provided on the optical paths of the light-emitting device 110R, the light-emitting device 110G, and the light-emitting device 110B, respectively, so that light with high color purity can be obtained.

In addition, an insulating layer 123 that covers an end portion of the pixel electrode 111 and an end portion of an optical adjustment layer 115 is provided. An end portion of the insulating layer 123 preferably has a tapered shape. When the insulating layer 123 is provided, coverage with the organic layer 112W, the common electrode 113, the protective layer 121, and the like provided over the insulating layer 123 can be increased.

The organic layer 112W and the common electrode 113 are each provided as one continuous film shared by the light-emitting devices. Such a structure is preferable because the manufacturing process of the display panel can be greatly simplified.

Here, the end portion of the pixel electrode 111 preferably has a substantially vertical shape. Accordingly, a steep portion can be formed on the surface of the insulating layer 123, and thus a thin portion can be formed in part of the organic layer 112W that covers the steep portion or part of the organic layer 112W can be divided. Accordingly, leakage current generated between adjacent light-emitting devices through the organic layer 112W can be inhibited without processing the organic layer 112W by a photolithography method or the like.

The above is the description of the structure examples of the display panel.

[Pixel Layout]

Pixel layouts different from that in FIG. 15A will be mainly described below. There is no particular limitation on the arrangement of light-emitting devices (subpixels), and a variety of methods can be employed.

Examples of the top surface shape of the subpixel include polygons such as a triangle, a tetragon (including a rectangle and a square), and a pentagon; polygons with rounded corners; an ellipse; and a circle. Here, the top surface shape of the subpixel corresponds to a top surface shape of a light-emitting region of the light-emitting device.

Figure 17A:
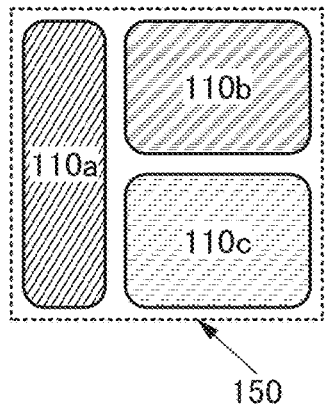
FIG. 17A to FIG. 17F are diagrams each illustrating a structure example of a pixel.

A pixel 150 illustrated in FIG. 17A employs an S-stripe arrangement. The pixel 150 illustrated in FIG. 17A is composed of three subpixels with light-emitting devices 110a, 110b, and 110c. For example, the light-emitting device 110a may be a blue-light-emitting device, the light-emitting device 110b may be a red-light-emitting device, and the light-emitting device 110c may be a green-light-emitting device.

Figure 17B:
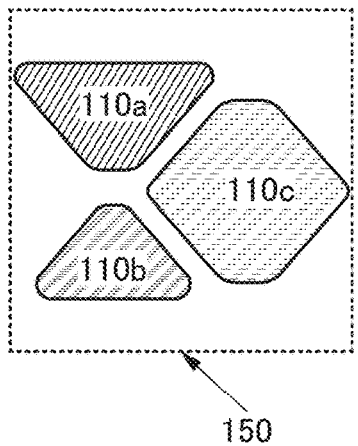

The pixel 150 illustrated in FIG. 17B includes the light-emitting device 110a whose top surface has a rough trapezoidal or rough triangle shape with rounded corners, the light-emitting device 110b whose top surface has a rough trapezoidal or rough triangle shape with rounded corners, and the light-emitting device 110c whose top surface has a rough tetragonal or rough hexagonal shape with rounded corners. The light-emitting device 110a has a larger light-emitting area than the light-emitting device 110b. In this manner, the shapes and sizes of the light-emitting devices can be independently determined. For example, the size of a light-emitting device with higher reliability can be made smaller. For example, the light-emitting device 110a may be a green light-emitting device, the light-emitting device 110b may be a red light-emitting device, and the light-emitting device 110c may be a blue light-emitting device.

Figure 17C:
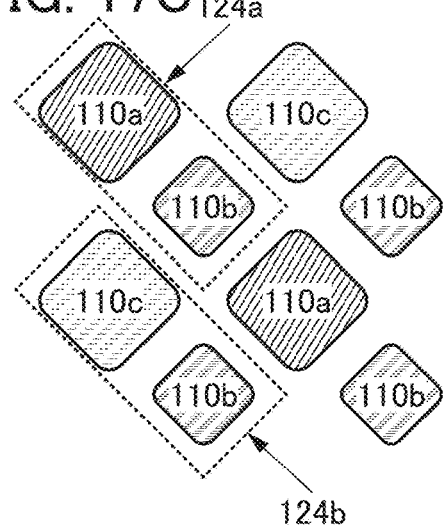

Pixels 124a and 124b illustrated in FIG. 17C employ a PenTile arrangement. FIG. 17C illustrates an example in which the pixels 124a each including the light-emitting device 110a and the light-emitting device 110b and the pixels 124b each including the light-emitting device 110b and the light-emitting device 110c are alternately arranged. For example, the light-emitting device 110a may be a red light-emitting device, the light-emitting device 110b may be a green light-emitting device, and the light-emitting device 110c may be a blue light-emitting device.

Figure 17D:
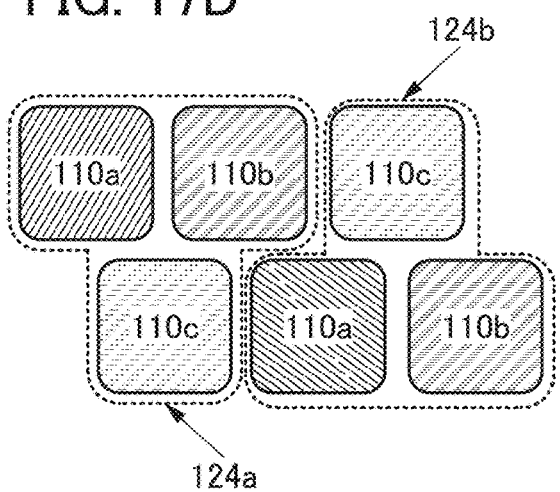
Figure 17E:
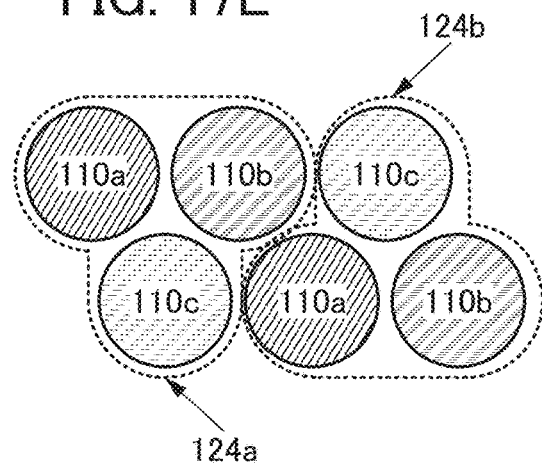

The pixels 124a and 124b illustrated in FIG. 17D and FIG. 17E employ a delta arrangement. The pixel 124a includes two light-emitting devices (the light-emitting devices 110a and 110b) in an upper row (a first row) and one light-emitting device (the light-emitting device 110c) in a lower row (a second row). The pixel 124b includes one light-emitting device (the light-emitting device 110c) in the upper row (the first row) and two light-emitting devices (the light-emitting devices 110a and 110b) in the lower row (the second row). For example, the light-emitting device 110a may be a red light-emitting device, the light-emitting device 110*b* may be a green light-emitting device, and the light-emitting device 110*c* may be a blue light-emitting device.

FIG. 17D illustrates an example in which each light-emitting device has a rough tetragonal top surface shape with rounded corners, and FIG. 17E illustrates an example in which each light-emitting device has a circular top surface shape.

Figure 17F:
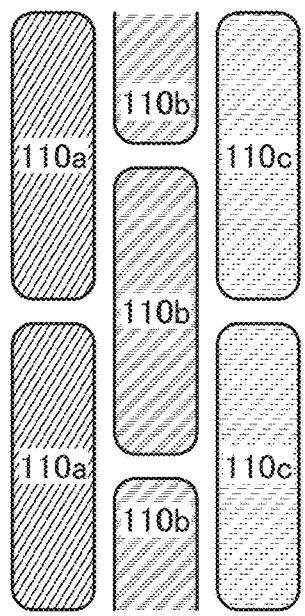

FIG. 17F illustrates an example in which light-emitting devices of different colors are arranged in a zigzag manner. Specifically, the positions of top sides of two light-emitting devices arranged in a column direction (e.g., the light-emitting device 110*a* and the light-emitting device 110*b* or the light-emitting device 110*b* and the light-emitting device 110*c*) are not aligned in a top view. For example, the light-emitting device 110*a* may be a red light-emitting device, the light-emitting device 110*b* may be a green light-emitting device, and the light-emitting device 110*c* may be a blue light-emitting device.

In a photolithography method, as a pattern to be processed becomes finer, the influence of light diffraction becomes more difficult to ignore; accordingly, fidelity in transferring a photomask pattern by light exposure is degraded, and it becomes difficult to process a resist mask into a desired shape. Thus, a pattern with rounded corners is likely to be formed even with a rectangular photomask pattern. Consequently, a top surface of a light-emitting device has a polygonal shape with rounded corners, an elliptical shape, a circular shape, or the like in some cases.

Furthermore, in the method for manufacturing the display panel of one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of a resist material. An insufficiently cured resist film might have a shape different from a desired shape at the time of processing. As a result, a top surface of the EL layer has a polygonal shape with rounded corners, an elliptical shape, a circular shape, or the like in some cases. For example, when a resist mask with a square top surface shape is intended to be formed, a resist mask with a circular top surface shape might be formed, and a top surface of the EL layer might have a circular shape.

Note that to obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

The above is the description of the pixel layout.

At least part of this embodiment can be implemented in combination with the other embodiments described in this specification as appropriate.

Embodiment 3

Described in this embodiment are other structure examples of the display panel that can be used for the display panel 30 and the display panel 40 shown in Embodiment 1.

Display panels in this embodiment are high-resolution display panels. In particular, the display panels in this embodiment are suitably used for display portions of wearable devices that can be worn on a head, such as VR devices like head-mounted displays and glasses-type AR devices.

[Display Module]

Figure 18A:
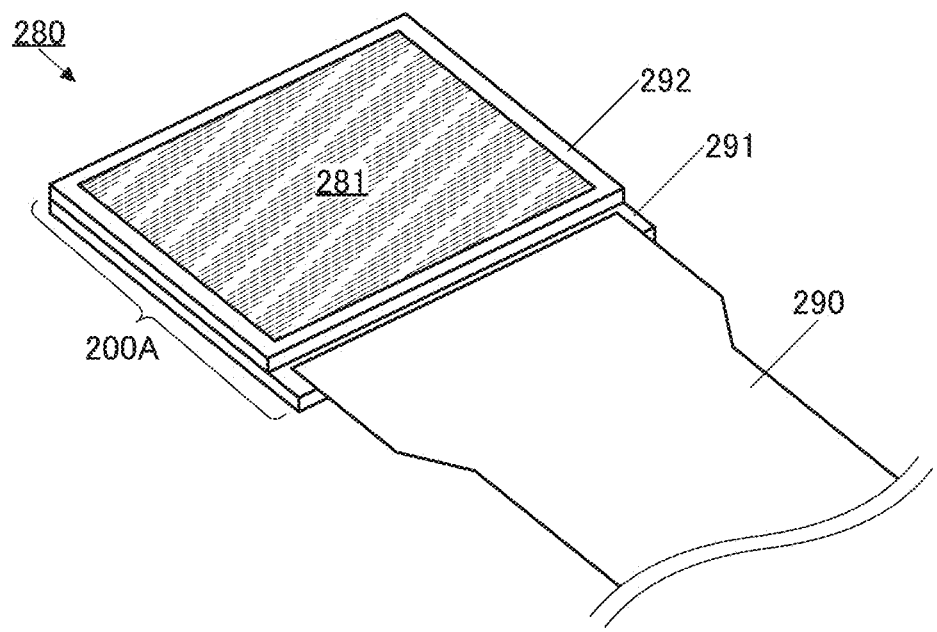
FIG. 18A and FIG. 18B are diagrams illustrating a structure example of a display panel.

FIG. 18A is a perspective view of a display module 280. The display module 280 includes a display panel 200A and an FPC 290. Note that a display panel included in the display module 280 is not limited to the display panel 200A and may be any of a display panel 200B to a display panel 200F described later.

The display module 280 includes a substrate 291 and a substrate 292. The display module 280 includes a display portion 281. The display portion 281 is a region where an image is displayed.

Figure 18B:
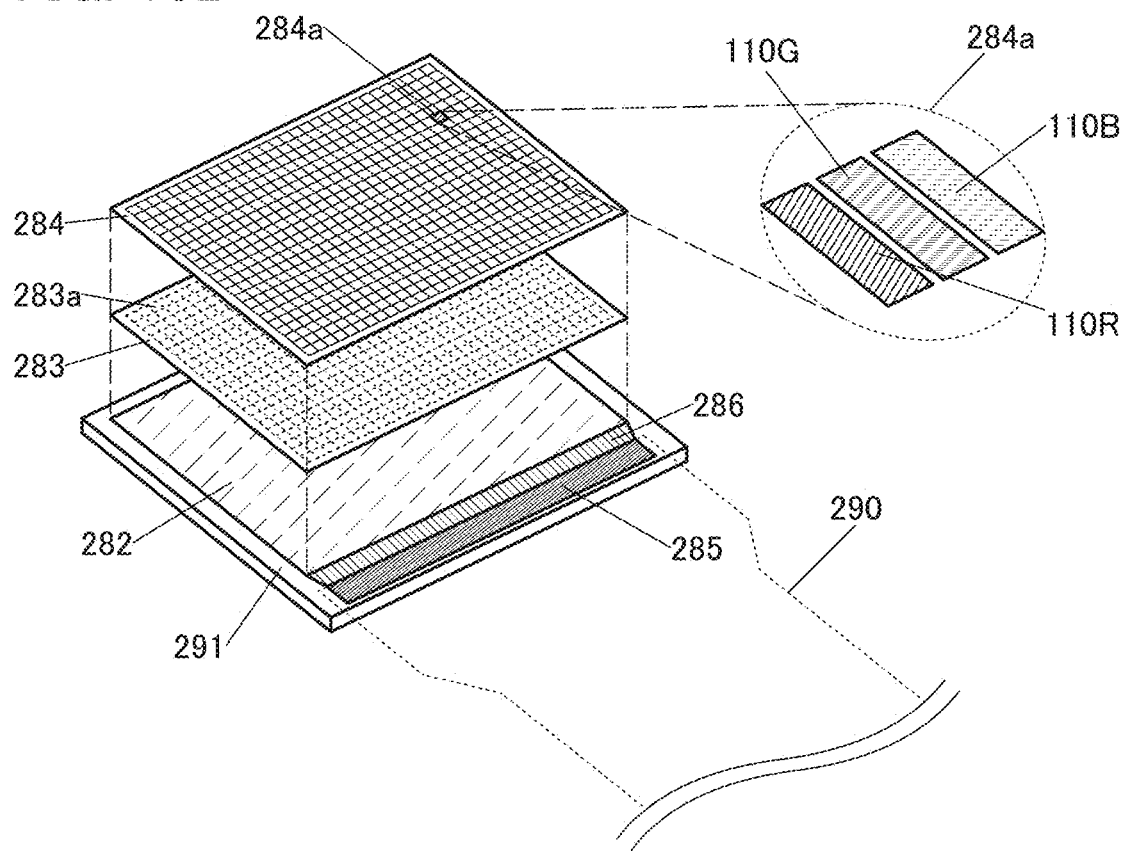

FIG. 18B is a perspective view schematically illustrating a structure on the substrate 291 side. Over the substrate 291, a circuit portion 282, a pixel circuit portion 283 over the circuit portion 282, and a pixel portion 284 over the pixel circuit portion 283 are stacked. In addition, a terminal portion 285 to be connected to the FPC 290 is provided in a portion over the substrate 291 that does not overlap the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 18B. The pixel 284*a* includes the light-emitting device 110R that emits red light, the light-emitting device 110G that emits green light, and the light-emitting device 110B that emits blue light.

The pixel circuit portion 283 includes a plurality of pixel circuits 283*a* arranged periodically. One pixel circuit 283*a* is a circuit for controlling light emission of three light-emitting devices included in one pixel 284*a*. One pixel circuit 283*a* may be provided with three circuits for controlling light emission of one light-emitting device. For example, the pixel circuit 283*a* can include at least one selection transistor, one current control transistor (driving transistor), and a capacitor for one light-emitting device. In that case, a gate signal is input to a gate of the selection transistor, and a source signal is input to a source of the selection transistor. Thus, an active-matrix display panel is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may further include at least one of an arithmetic circuit, a memory circuit, a power supply circuit, and the like. In addition, a transistor provided in the circuit portion 282 may constitute part of the pixel circuit 283*a*. That is, the pixel circuit 283*a* may be constituted by a transistor included in the pixel circuit portion 283 and a transistor included in the circuit portion 282.

The FPC 290 functions as a wiring for supplying a video signal, a power supply potential, and the like to the circuit portion 282 from the outside. In addition, an IC may be mounted on the FPC 290.

The display module 280 can have a structure in which one or both of the pixel circuit portion 283 and the circuit portion 282 are provided to be stacked below the pixel portion 284; thus, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284a are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a VR device such as a head-mounted display or a glasses-type AR device. For example, even in the case of a structure in which the display portion of the display module 280 is seen through a lens, pixels of the extremely-high-resolution display portion 281 included in the display module 280 are not seen even when the display portion is enlarged by the lens, so that display providing a high sense of immersion can be performed. Without being limited thereto, the display module 280 can also be suitably used for an electronic device having a relatively small display portion. For example, the display module 280 can be suitably used for a display portion of a wearable electronic device such as a wristwatch.

[Display Panel 200A]

Figure 19:
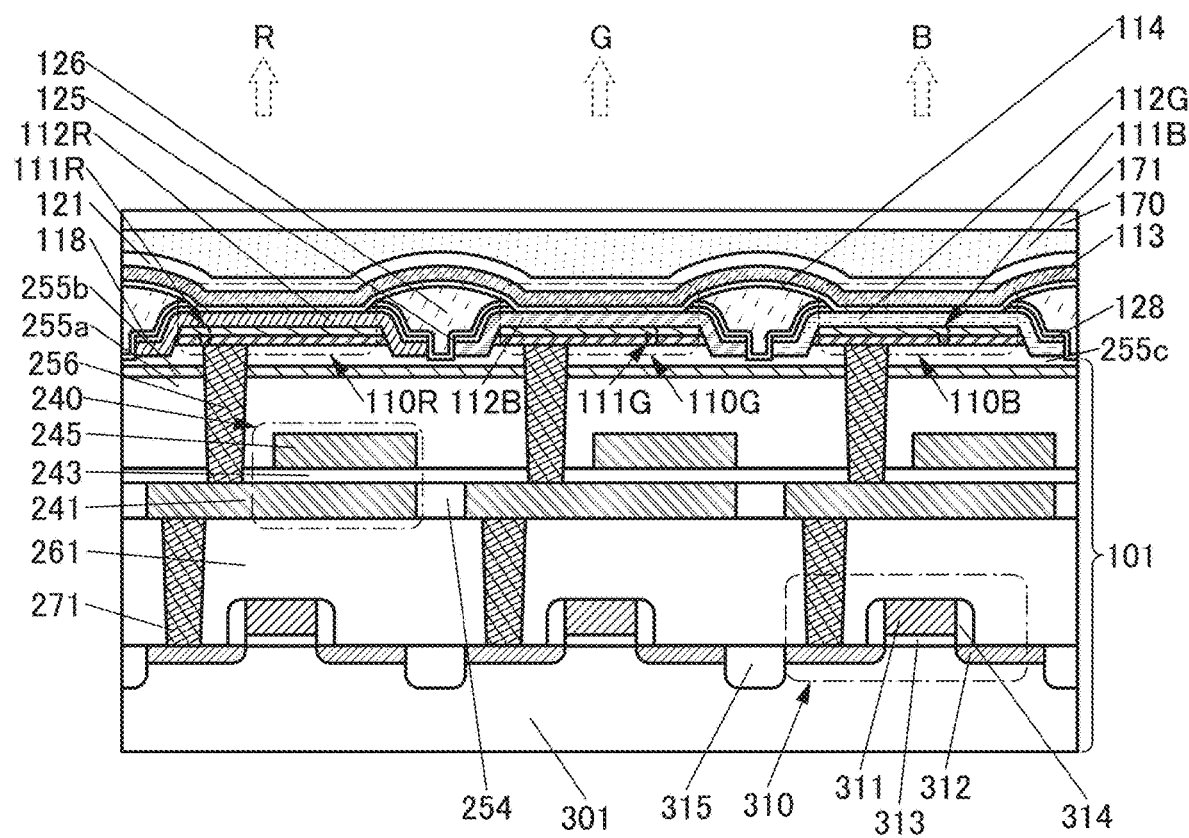
FIG. 19 is a diagram illustrating a structure example of a display panel.

The display panel 200A illustrated in FIG. 19A includes a substrate 301, the light-emitting devices 110R, 110G, and 110B, capacitors 240, and transistors 310.

The substrate 301 corresponds to the substrate 291 in FIG. 18A and FIG. 18B.

The transistor 310 is a transistor that includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and insulating layers 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layers 314 are provided to cover side surfaces of the conductive layer 311.

An element isolation layer 315 is provided between two adjacent transistors 310 to be embedded in the substrate 301.

An insulating layer 261 is provided to cover the transistors 310, and the capacitors 240 are provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

An insulating layer 255a is provided to cover the capacitor 240; an insulating layer 255b is provided over the insulating layer 255a; and an insulating layer 255c is provided over the insulating layer 255b.

An inorganic insulating film can be suitably used for each of the insulating layer 255a, the insulating layer 255b, and the insulating layer 255c. For example, it is preferable that a silicon oxide film be used for each of the insulating layer 255a and the insulating layer 255c and a silicon nitride film be used for the insulating layer 255b. This enables the insulating layer 255b to function as an etching protective film. Although this embodiment shows an example in which the insulating layer 255c is partly etched and a concave portion is formed, the concave portion is not necessarily provided in the insulating layer 255c.

The light-emitting device 110R, the light-emitting device 110G, and the light-emitting device 110B are provided over the insulating layer 255c. Embodiment 1 can be referred to for the structures of the light-emitting device 110R, the light-emitting device 110G, and the light-emitting device 110B.

In the display panel 200A, since the light-emitting devices of different colors are separately formed, a change in chromaticity between light emission at low luminance and light emission at high luminance is small. Furthermore, since the organic layers 112R, 112G, and 112B are apart from each other, generation of crosstalk between adjacent subpixels can be inhibited even in the high-resolution display panel. It is thus possible to achieve a display panel that has high resolution and high display quality.

In a region between adjacent light-emitting devices, the insulating layer 125, the resin layer 126, and the layer 128 are provided.

The pixel electrode 111R, the pixel electrode 111G, and the pixel electrode 111B of the light-emitting devices are each electrically connected to one of the source and the drain of the transistor 310 through a plug 256 embedded in the insulating layer 255a, the insulating layer 255b, and the insulating layer 255c, the conductive layer 241 embedded in the insulating layer 254, and the plug 271 embedded in the insulating layer 261. A top surface of the insulating layer 255c and a top surface of the plug 256 are level with or substantially level with each other. A variety of conductive materials can be used for the plugs.

The protective layer 121 is provided over the light-emitting devices 110R, 110G, and 110B. A substrate 170 is attached onto the protective layer 121 with an adhesive layer 171.

An insulating layer covering an end portion of a top surface of the pixel electrode 111 is not provided between two adjacent pixel electrodes 111. Thus, the distance between adjacent light-emitting devices can be extremely narrowed. Accordingly, the display panel can have high resolution or high definition.

[Display Panel 200B]

Figure 20:
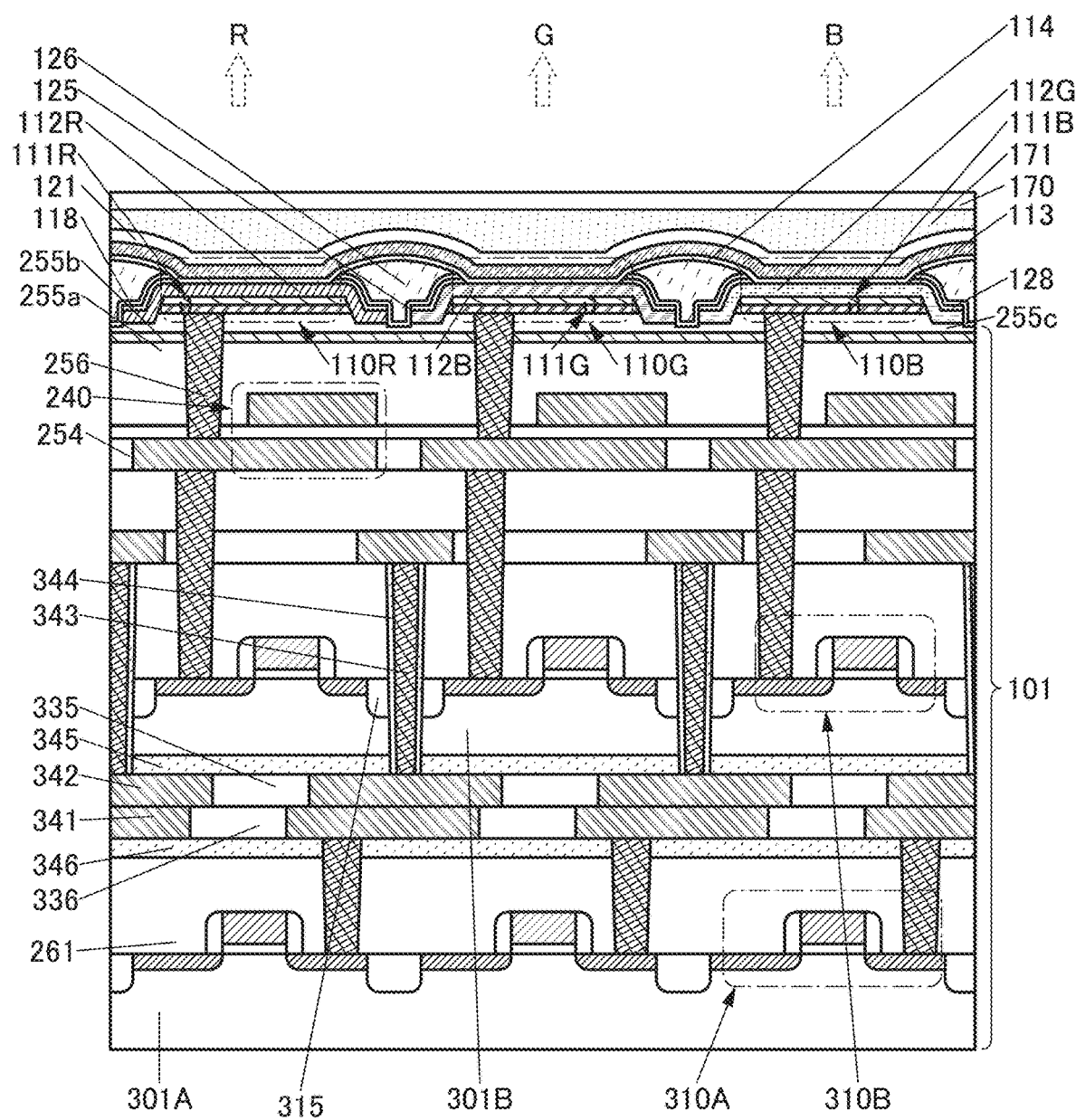
FIG. 20 is a diagram illustrating a structure example of a display panel.

The display panel 200B illustrated in FIG. 20 has a structure in which a transistor 310A and a transistor 310B each including a channel formed in a semiconductor substrate are stacked. Note that in the following description of the display panel, the description of portions similar to those of the above display panel is omitted in some cases.

The display panel 200B has a structure in which a substrate 301B provided with the transistor 310B, the capacitor 240, and the light-emitting device is attached to a substrate 301A provided with the transistor 310A.

Here, an insulating layer 345 is provided on a bottom surface of the substrate 301B, and an insulating layer 346 is provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 121 or an insulating layer 332 can be used.

The substrate 301B is provided with a plug 343 that penetrates the substrate 301B and the insulating layer 345. Here, an insulating layer 344 functioning as a protective layer is preferably provided to cover side surfaces of the plug 343.

A conductive layer 342 is provided under the insulating layer 345 on the substrate 301B. The conductive layer 342 is embedded in an insulating layer 335, and bottom surfaces of the conductive layer 342 and the insulating layer 335 are planarized. Furthermore, the conductive layer 342 is electrically connected to the plug 343.

In contrast, a conductive layer 341 is provided over the insulating layer 346 over the substrate 301A. The conductive layer 341 is embedded in an insulating layer 336, and top surfaces of the conductive layer 341 and the insulating layer 336 are planarized.

The same conductive material is preferably used for the conductive layer 341 and the conductive layer 342. A metal film containing an element selected from Al, Cr, Cu, Ta, Ti, Mo, and W, a metal nitride film containing the above element as a component (a titanium nitride film, a molybdenum nitride film, or a tungsten nitride film), or the like can be used, for example. Copper is particularly preferably used for the conductive layer 341 and the conductive layer 342. Accordingly, it is possible to employ a Cu-to-Cu (copper-to-copper) direct bonding technique (a technique for achieving electrical continuity by connecting Cu (copper) pads to each other).

[Display panel 200C]

Figure 21:
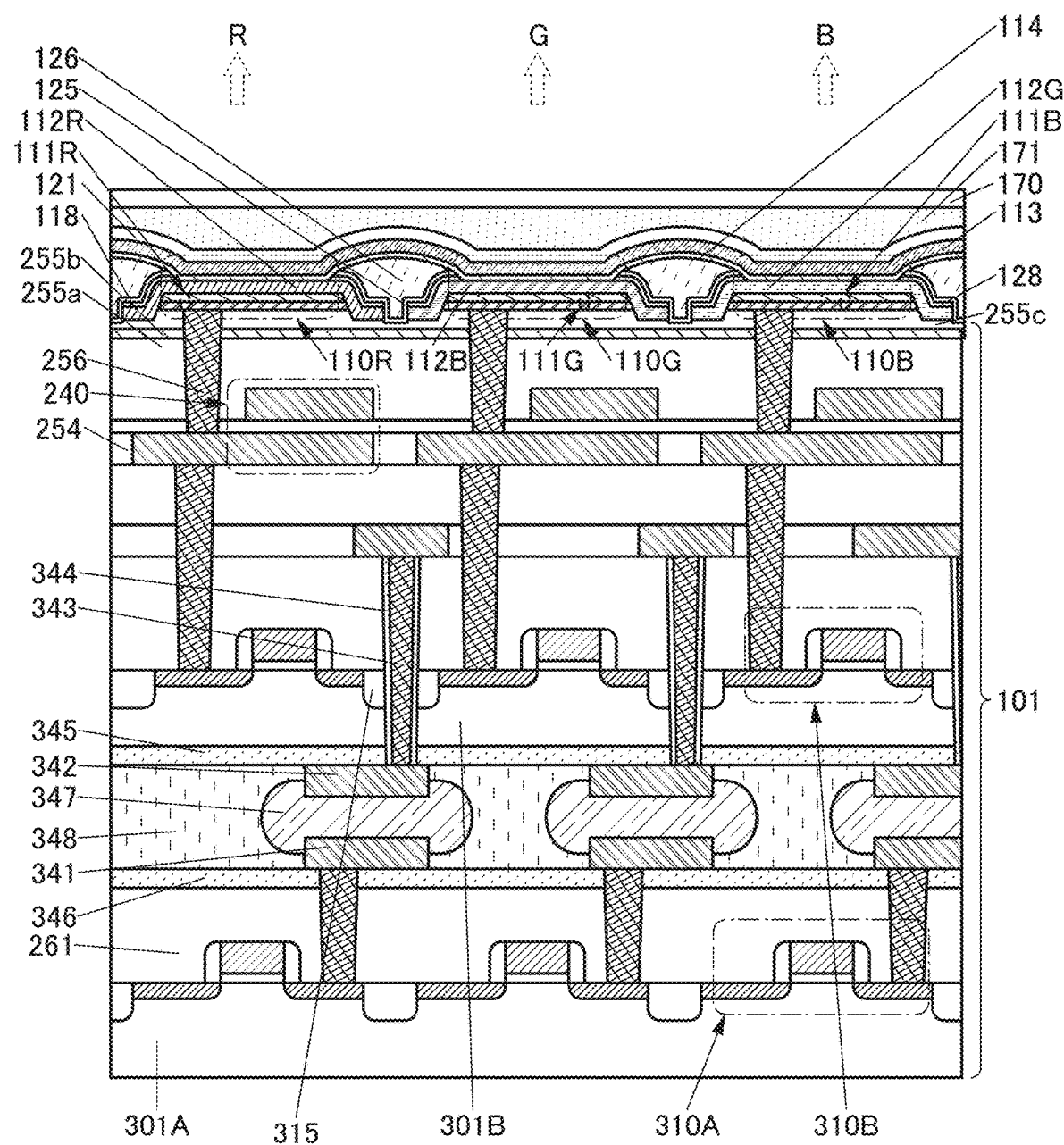
FIG. 21 is a diagram illustrating a structure example of a display panel.

The display panel 200C illustrated in FIG. 21 has a structure in which the conductive layer 341 and the conductive layer 342 are bonded to each other through a bump 347.

Providing the bump 347 between the conductive layer 341 and the conductive layer 342 as illustrated in FIG. 21 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder is used for the bump 347 in some cases. An adhesive layer 348 may be provided between the insulating layer 345 and the insulating layer 346. In the case where the bump 347 is provided, a structure without the insulating layer 335 and the insulating layer 336 may be employed.

[Display Panel 200D]

Figure 22:
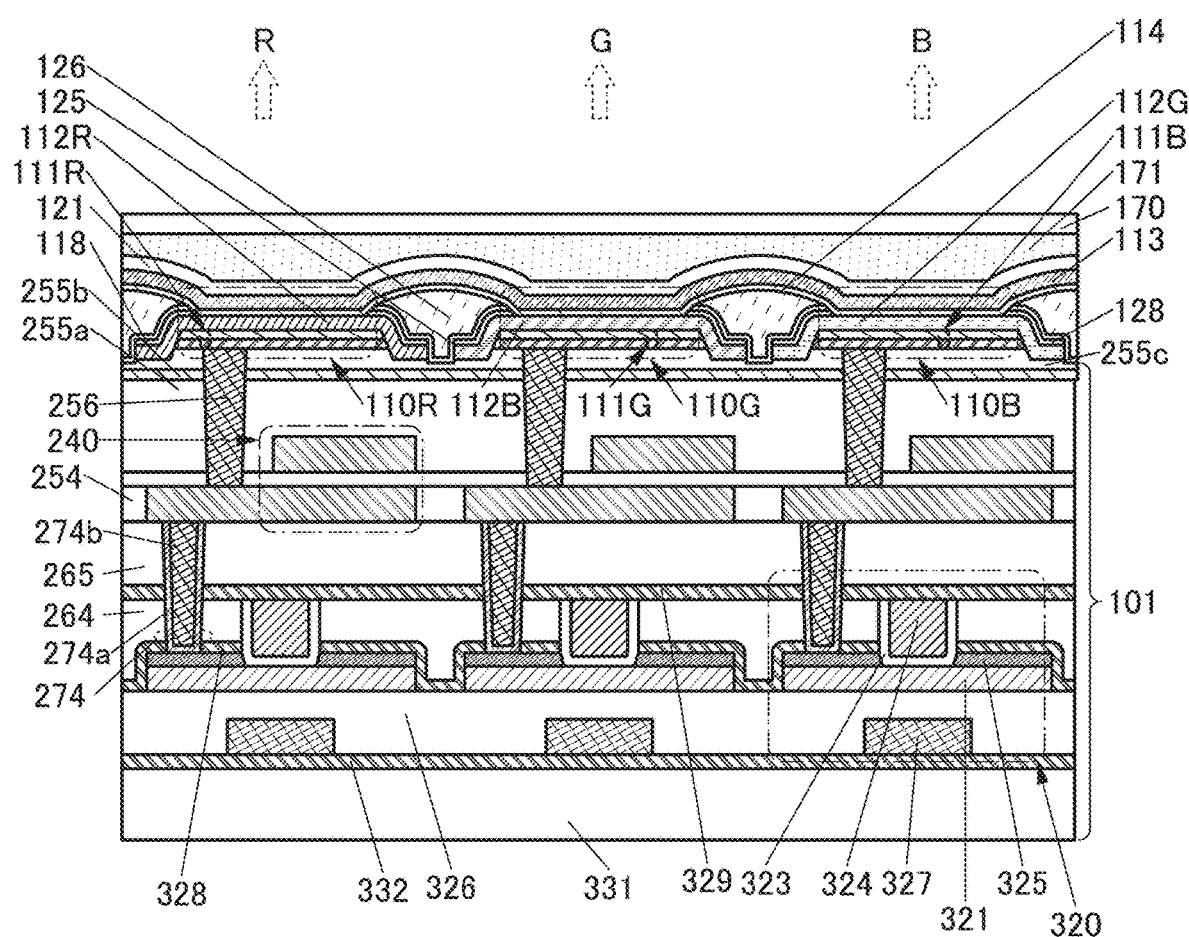
FIG. 22 is a diagram illustrating a structure example of a display panel.

The display panel 200D illustrated in FIG. 22 differs from the display panel 200A mainly in a transistor structure.

A transistor 320 is a transistor (an OS transistor) in which a metal oxide (also referred to as an oxide semiconductor) is used in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 18A and FIG. 18B.

The insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. A top surface of the insulating layer 326 is preferably planarized.

The semiconductor layer 321 is provided over the insulating layer 326. The semiconductor layer 321 preferably includes a metal oxide (also referred to as an oxide semiconductor) film exhibiting semiconductor characteristics. The pair of conductive layers 325 is provided on and in contact with the semiconductor layer 321, and functions as a source electrode and a drain electrode.

An insulating layer 328 is provided to cover top surfaces and side surfaces of the pair of conductive layers 325, side surfaces of the semiconductor layer 321, and the like, and an insulating layer 264 is provided over the insulating layer 328. The insulating layer 328 functions as a barrier layer that prevents diffusion of impurities such as water or hydrogen from the insulating layer 264 or the like into the semiconductor layer 321 and release of oxygen from the semiconductor layer 321. For the insulating layer 328, an insulating film similar to the insulating layer 332 can be used.

An opening reaching the semiconductor layer 321 is provided in the insulating layer 328 and the insulating layer 264. The conductive layer 324 and the insulating layer 323 that is in contact with a top surface of the semiconductor layer 321 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are subjected to planarization treatment so that they are level with or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like into the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers side surfaces of openings in the insulating layer 265, the insulating layer 329, the insulating layer 264, and the insulating layer 328 and part of a top surface of the conductive layer 325, and a conductive layer 274b in contact with a top surface of the conductive layer 274a. In that case, a conductive material that does not easily allow diffusion of hydrogen and oxygen is preferably used for the conductive layer 274a.

Note that there is no particular limitation on the structures of the transistors included in the display panel of this embodiment. For example, a planar transistor, a staggered transistor, an inverted staggered transistor, or the like can be used. The transistor structure may be either a top-gate structure or a bottom-gate structure. Alternatively, gates may be provided above and below a semiconductor layer where a channel is formed.

The transistor 320 has a structure in which the semiconductor layer where a channel is formed is sandwiched between two gates. The two gates may be connected to each other and supplied with the same signal to drive the transistor. Alternatively, the threshold voltage of the transistor may be controlled by supplying a potential for controlling the threshold voltage to one of the two gates and by supplying a potential for driving to the other gate.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used because degradation of the transistor characteristics can be inhibited.

The bandgap of a metal oxide used for the semiconductor layer of the transistor is preferably greater than or equal to 2 eV, further preferably greater than or equal to 2.5 eV. The use of a metal oxide having a wide bandgap can reduce the off-state current of the OS transistor.

A metal oxide preferably contains at least indium or zinc, and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example.

Alternatively, the semiconductor layer of the transistor may contain silicon. Examples of silicon include amorphous silicon and crystalline silicon (low-temperature polysilicon, single crystal silicon, or the like).

Examples of the metal oxide that can be used for the semiconductor layer include indium oxide, gallium oxide, and zinc oxide. In addition, the metal oxide preferably contains two or three kinds selected from indium, the element M, and zinc. Note that the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium. In particular, the element M is preferably one or more kinds selected from aluminum, gallium, yttrium, and tin.

It is particularly preferable that an oxide containing indium, gallium, and zinc (also referred to as IGZO) be used as the metal oxide used for the semiconductor layer. Alternatively, it is preferable to use an oxide containing indium, tin, and zinc (also referred to as ITZO (registered trademark)). Alternatively, it is preferable to use an oxide containing indium, gallium, tin, and zinc. Alternatively, it is preferable to use an oxide containing indium, aluminum, and zinc (also referred to as IAZO). Alternatively, it is preferable to use an oxide containing indium, aluminum, gallium, and zinc (also referred to as IAGZO).

When the metal oxide used for the semiconductor layer is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn 10=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of a intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. In addition, when the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. Furthermore, when the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The semiconductor layer may include two or more metal oxide layers having different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being formed over the first metal oxide layer can be suitably employed. In particular, gallium or aluminum is preferably used as the element M.

Alternatively, a stacked-layer structure or the like of one selected from indium oxide, indium gallium oxide, and IGZO, and one selected from IAZO, IAGZO, and ITZO (registered trademark) may be used, for example.

Examples of an oxide semiconductor having crystallinity include a CAAC (c-axis aligned crystalline)-OS and an nc (nanocrystalline)-OS.

An OS transistor has extremely higher field-effect mobility than a transistor using amorphous silicon. In addition, the OS transistor has extremely low leakage current between a source and a drain in an off state (hereinafter also referred to as off-state current), and charge accumulated in a capacitor that is connected in series with the transistor can be retained for a long period. Furthermore, the power consumption of the display panel can be reduced with the use of the OS transistor.

To increase the emission luminance of the light-emitting device included in a pixel circuit, it is necessary to increase the amount of current flowing through the light-emitting device. For that purpose, the source-drain voltage of the driving transistor included in the pixel circuit needs to be increased. Since an OS transistor has a higher withstand voltage between the source and the drain than a Si transistor, a high voltage can be applied between the source and the drain of the OS transistor. Thus, by using an OS transistor as a driving transistor included in the pixel circuit, the amount of current flowing through the light-emitting device can be increased, resulting in an increase in the emission luminance of the light-emitting device.

When a transistor operates in a saturation region, a change in source-drain current relative to a change in gate-source voltage is smaller in an OS transistor than in a Si transistor. Accordingly, when an OS transistor is used as the driving transistor included in the pixel circuit, current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of current flowing when a transistor operates in a saturation region, even in the case where the source-drain voltage of an OS transistor increases gradually, more stable current (saturation current) can be fed through the OS transistor than through a Si transistor. Thus, by using an OS transistor as the driving transistor, a stable current can be fed through the light-emitting device even when the current-voltage characteristics of the EL device vary, for example. In other words, when the OS transistor operates in the saturation region, the source-drain current hardly changes with an increase in the source-drain voltage; hence, the emission luminance of the light-emitting device can be stable.

As described above, by using an OS transistor as the driving transistor included in the pixel circuit, it is possible to achieve "inhibition of black-level degradation", "increase in emission luminance", "increase in the number of gray levels", "inhibition of variation in light-emitting devices", and the like.

[Display Panel 200E]

Figure 23:
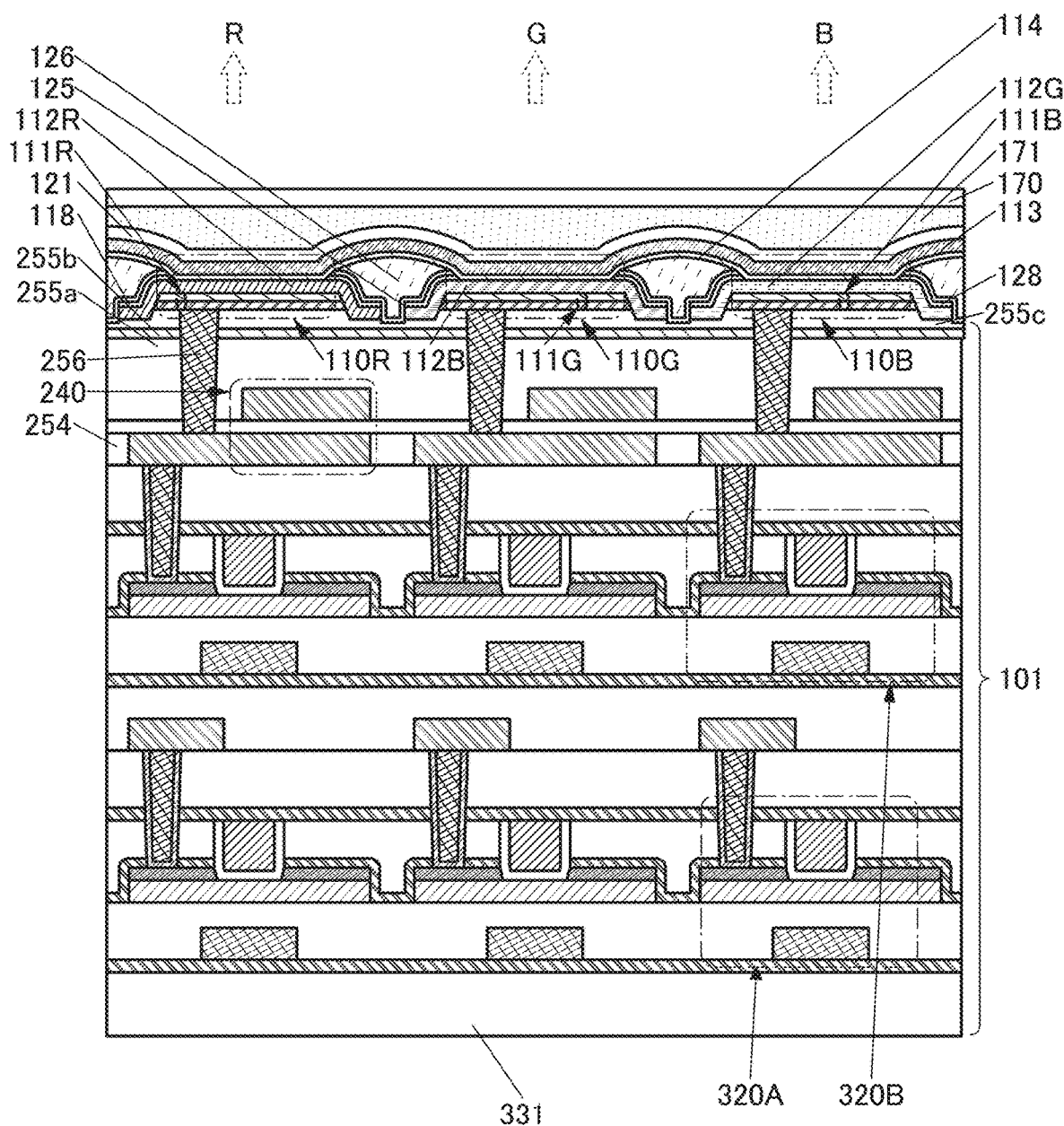
FIG. 23 is a diagram illustrating a structure example of a display panel.

The display panel 200E illustrated in FIG. 23 has a structure in which the transistor 320A and a transistor 320B each including an oxide semiconductor in a semiconductor where a channel is formed are stacked.

The description of the display panel 200D can be referred to for the transistor 320A, the transistor 320B, and other peripheral structures.

Although two transistors including an oxide semiconductor are stacked in the structure shown here, the present invention is not limited thereto. For example, three or more transistors may be stacked.

[Display Panel 200F]

Figure 24:
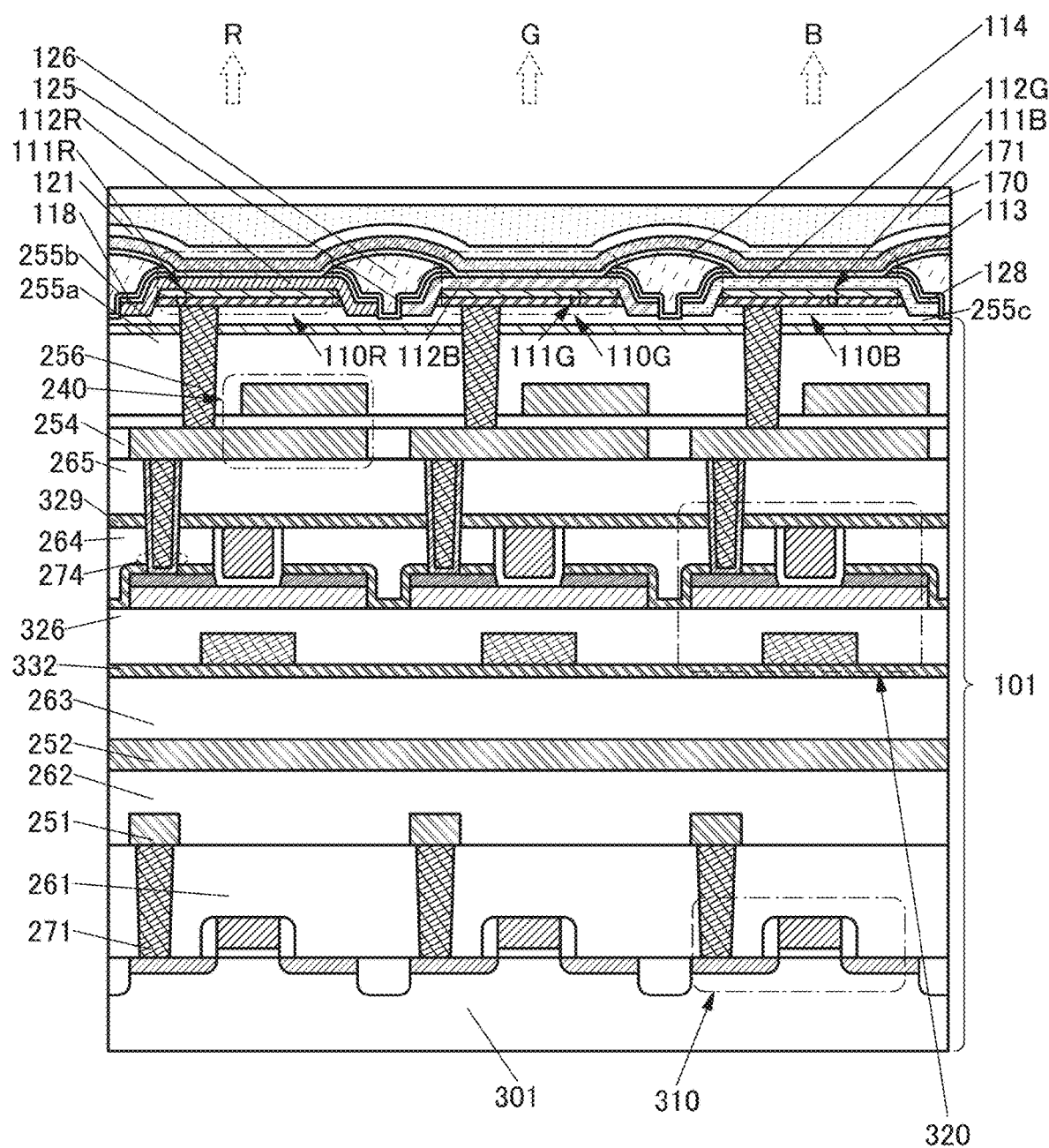
FIG. 24 is a diagram illustrating a structure example of a display panel.

The display panel 200F illustrated in FIG. 24 has a structure in which the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display panel can be downsized as compared with the case where a driver circuit is provided around a display region.

[Display Panel 200G]

Figure 25:
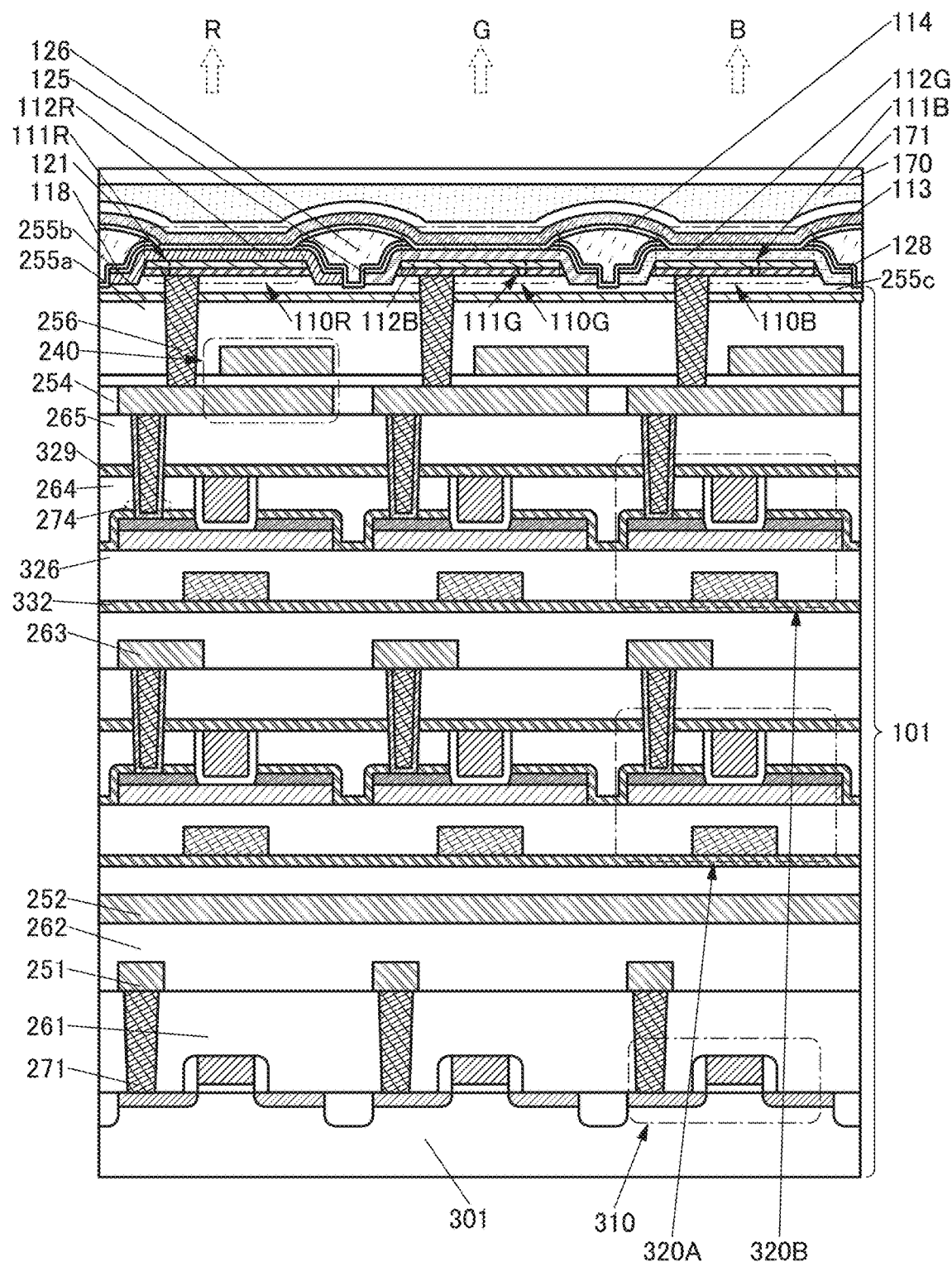
FIG. 25 is a diagram illustrating a structure example of a display panel.

The display panel 200G illustrated in FIG. 25 has a structure in which the transistor 310 having a channel formed in the substrate 301 and the transistors 320A and 320B each including a metal oxide in a semiconductor layer where a channel is formed are stacked.

The transistor 320A can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 320B may be used as a transistor included in the pixel circuit or a transistor included in the driver circuit. The transistor 310, the transistor 320A, and the transistor 320B can also be used as transistors included in a variety of circuits such as an arithmetic circuit and a memory circuit.

At least part of this embodiment can be implemented in combination with the other embodiments described in this specification as appropriate.

Embodiment 4

Described in this embodiment are a structure example of a liquid crystal display device and a structure example of an organic EL display device that can be used in the display panel 20 described in Embodiment 1.

Figure 26A:
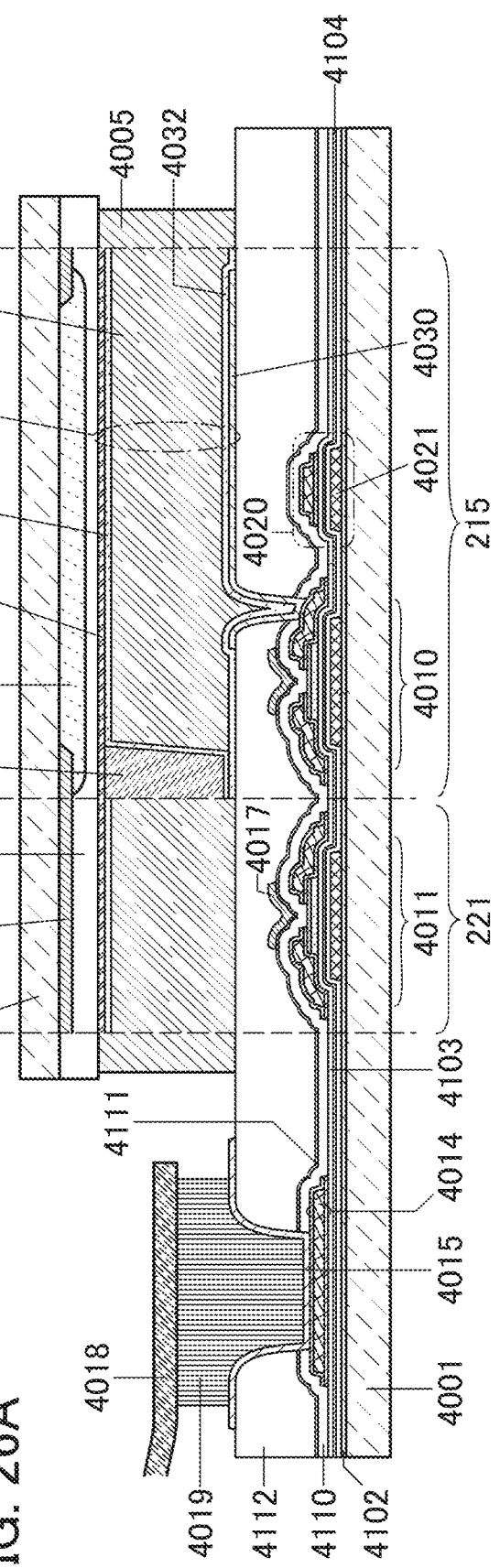
FIG. 26A and FIG. 26B are diagrams each illustrating a structure example of a display panel.
Figure 26B:
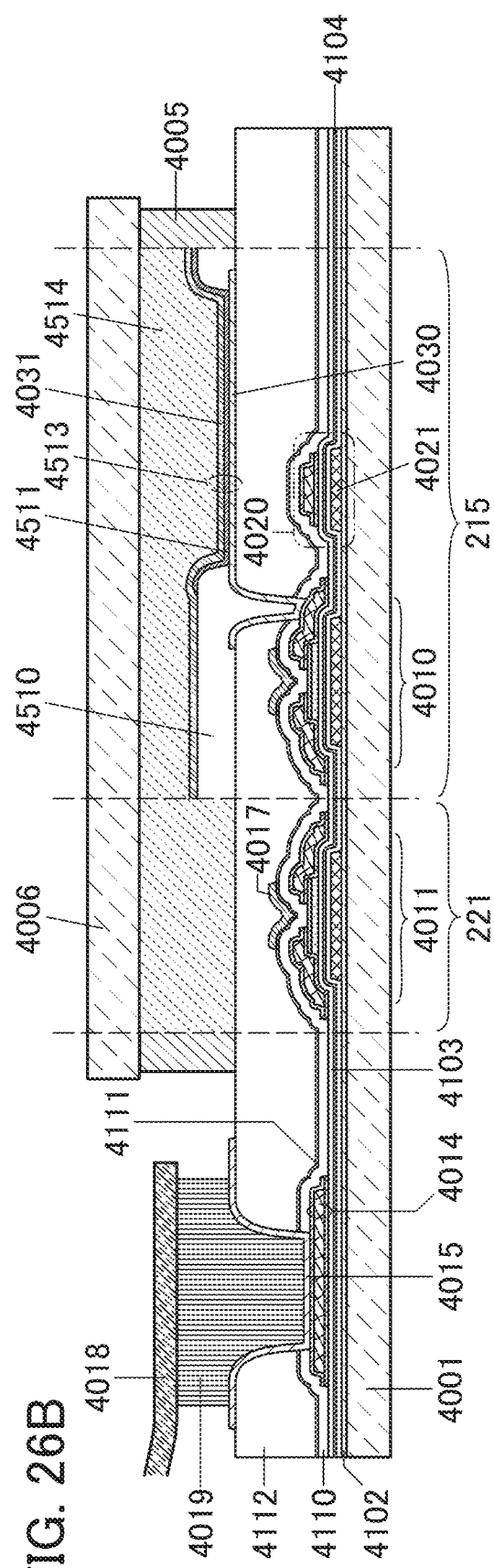

FIG. 26A and FIG. 26B are diagrams each illustrating part of a cross section of a display panel that can be used as the display panel 20.

Display devices illustrated in FIG. 26A and FIG. 26B each include an electrode 4015, and the electrode 4015 is electrically connected to a terminal included in the FPC 4018 through an anisotropic conductive layer 4019. In FIG. 26A and FIG. 26B, the electrode 4015 is electrically connected to a wiring 4014 in an opening formed in an insulating layer 4112, an insulating layer 4111, and an insulating layer 4110.

The electrode 4015 is formed with the same conductive layer as a first electrode layer 4030, and the wiring 4014 is formed with the same conductive layer as source electrodes and drain electrodes of a transistor 4010 and a transistor 4011.

A display portion 215 and a gate driver 221 provided over a first substrate 4001 each include a plurality of transistors. In FIGS. 26A and 26B, the transistor 4010 included in the display portion 215 and the transistor 4011 included in the gate driver 221 are illustrated as an example. Note that in the examples illustrated in FIGS. 26A and 26B, the transistor 4010 and the transistor 4011 are bottom-gate transistors but may be top-gate transistors.

In FIGS. 26A and 26B, the insulating layer 4112 is provided over the transistor 4010 and the transistor 4011. In FIG. 26B, a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display devices illustrated in FIGS. 26A and 26B each include a capacitor 4020. The capacitor 4020 includes an electrode 4021 formed in the same step as a gate electrode of the transistor 4010, and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor is set in consideration of the off-state current of the transistors or the like.

The transistor 4010 provided in the display portion 215 is electrically connected to the display element. FIG. 26A illustrates an example of a liquid crystal display device using a liquid crystal element as the display element. In FIG. 26A, a liquid crystal element 4013 serving as the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal element having a variety of modes can be used as the liquid crystal element 4013. For example, a liquid crystal element using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used.

As the liquid crystal display device described in this embodiment, a normally black liquid crystal display device such as a transmissive liquid crystal display device employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal element is an element that controls transmission and non-transmission of light by the optical modulation action of liquid crystal. The optical modulation action of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although an example of a liquid crystal display device including a liquid crystal element with a vertical electric field mode is illustrated in FIG. 26A, one embodiment of the present invention can be applied to a liquid crystal display device including a liquid crystal element with a horizontal electric field mode. In the case of employing a horizontal electric field mode, a liquid crystal exhibiting a blue phase for which an alignment film is not used may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains a liquid crystal exhibiting a blue phase and a chiral material has a short response speed and exhibits optical isotropy. In addition, the liquid crystal composition containing a liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display device in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display device illustrated in FIG. 26A, a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material used for a coloring layer that transmits light of a certain color and a film containing a material used for a coloring layer that transmits light of another color can be employed. Material sharing between the coloring layer and the light-blocking layer is preferable because process simplification as well as equipment sharing can be achieved.

Examples of a material that can be used for the coloring layer include a metal material, a resin material, and a resin material containing a pigment or a dye. The light-blocking layer and the coloring layer can be formed by an inkjet method, for example.

The display devices illustrated in FIG. 26A and FIG. 26B each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting device can be used as the display element included in the display device. As the light-emitting element, for example, an EL element that utilizes electroluminescence can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light.

As the EL element, an organic EL element or an inorganic EL element can be used, for example. Note that an LED (including a micro LED) that uses a compound semiconductor as a light-emitting material is one of EL elements, and the LED can also be used.

In the organic EL element, by voltage application, electrons are injected from one electrode to the EL layer and holes are injected from the other electrode to the EL layer. The carriers (electrons and holes) are recombined, the light-emitting organic compound forms an excited state, and light is emitted when the excited state returns to a ground state. Owing to such a mechanism, this light-emitting device is referred to as a current-excitation light-emitting device.

Note that in addition to the light-emitting compound, the EL layer may further include a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localization type light emission that utilizes inner-shell electron transition of metal ions. Note that the description is made here using an organic EL element as the light-emitting device.

In order to extract light emitted from the light-emitting device, at least one of the pair of electrodes needs to be transparent. The light-emitting device can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

FIG. 26B illustrates an example of a light-emitting display device using a light-emitting device as a display element (also referred to as an "EL display device"). A light-emitting device 4513 serving as the display element is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, this embodiment is not limited to this structure. The structure of the light-emitting device 4513 can be changed as appropriate depending on the direction in which light is extracted from the light-emitting device 4513, or the like. For example, the light-emitting device described in Embodiment 2 and its peripheral components can be used.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion is formed to be an inclined surface with continuous curvature.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a method for achieving color display, there are a method in which the light-emitting device 4513 that emits white light is combined with a coloring layer and a method in which the light-emitting device 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may include an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover member with high air-tightness and little degasification in this manner so that the light-emitting device is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy resin, a silicone resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are used in combination, the glare can be reduced and visibility of a displayed image can be increased.

Whether the first electrode layer and the second electrode layer (also referred to as a pixel electrode layer, a common electrode layer, a counter electrode layer, or the like) for applying a voltage to the display element have light-transmitting properties or light-reflecting properties may be determined in accordance with the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Note that a stacked structure including a region where a transistor and a capacitor overlap with each other in the height direction may be employed. For example, when a plurality of transistors included in the driver circuit are provided to overlap with each other, a display device with a narrow frame can be provided. Furthermore, when the plurality of transistors, the capacitor 4020, and the like included in the pixel circuit are provided to at least partly overlap with each other, the aperture ratio can be improved.

When a light-transmitting conductive film with high visible-light-transmitting property is used as an electrode and a wiring in the pixel circuit, the transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

At least part of this embodiment can be implemented in combination with the other embodiments described in this specification as appropriate.

Embodiment 5

In this embodiment, a light-emitting device (a light-emitting element) that can be used in the display panel of one embodiment of the present invention will be described.

In this specification and the like, a device manufactured using a metal mask or an FMM (a fine metal mask or a high-resolution metal mask) is sometimes referred to as a device having an MM (metal mask) structure. In addition, in this specification and the like, a device manufactured without using a metal mask or an FMM is sometimes referred to as a device having an MML (metal maskless) structure.

In this specification and the like, a structure in which at least light-emitting layers of light-emitting devices having different emission wavelengths are separately formed is sometimes referred to as an SBS (Side By Side) structure. The SBS structure allows optimization of materials and structures of the light-emitting devices and thus can increase the degree of freedom in selecting the materials and the structures, which facilitates improvement in luminance and improvement in reliability.

In this specification and the like, a hole or an electron is sometimes referred to as a "carrier." Specifically, a hole-injection layer or an electron-injection layer is sometimes referred to as a "carrier-injection layer," a hole-transport layer or an electron-transport layer is sometimes referred to as a "carrier-transport layer," and a hole-blocking layer or an electron-blocking layer is sometimes referred to as a "carrier-blocking layer." Note that the carrier-injection layer, carrier-transport layer, and carrier-blocking layer cannot be distinguished from each other by cross-sectional shapes, characteristics, or the like in some cases. Furthermore, one layer has two or three functions of the carrier-injection layer, the carrier-transport layer, and the carrier-blocking layer in some cases.

In this specification and the like, a light-emitting device includes an EL layer between a pair of electrodes. The EL layer includes at least a light-emitting layer. Here, examples of a layer included in the EL layer (also referred to as a functional layer) include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer).

As the light-emitting device, an OLED (Organic Light Emitting Diode) or a QLED (Quantum-dot Light Emitting Diode) is preferably used, for example. Examples of a light-emitting substance contained in the light-emitting device include a substance exhibiting fluorescence (a fluorescent material), a substance exhibiting phosphorescence (a phosphorescent material), a substance exhibiting thermally activated delayed fluorescence (a thermally activated delayed fluorescent (TADF) material), and an inorganic compound (a quantum-dot material or the like). In addition, an LED (Light Emitting Diode) such as a micro LED can also be used as the light-emitting device.

The emission color of the light-emitting device can be infrared, red, green, blue, cyan, magenta, yellow, white, or the like. Furthermore, color purity can be increased when the light-emitting device has a microcavity structure.

Figure 27A:
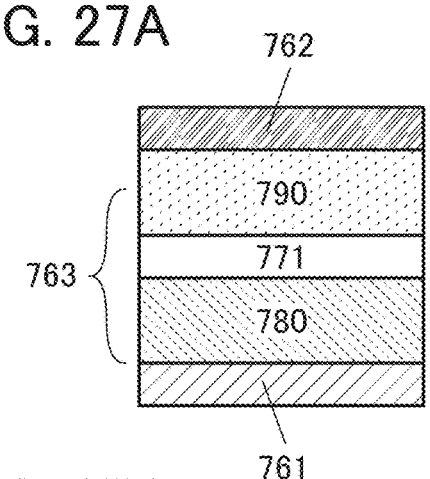
FIG. 27A to FIG. 27F are diagrams each illustrating a structure example of a light-emitting device.

As illustrated in FIG. 27A, the light-emitting device includes an EL layer 763 between a pair of electrodes (a lower electrode 761 and an upper electrode 762). The EL layer 763 can be formed using a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). The layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layer 780 and the layer 790 are replaced with each other.

The structure including the layer 780, the light-emitting layer 771, and the layer 790 that is provided between the pair of electrodes can function as a single light-emitting unit, and the structure in FIG. 27A is referred to as a single structure in this specification.

Figure 27B:
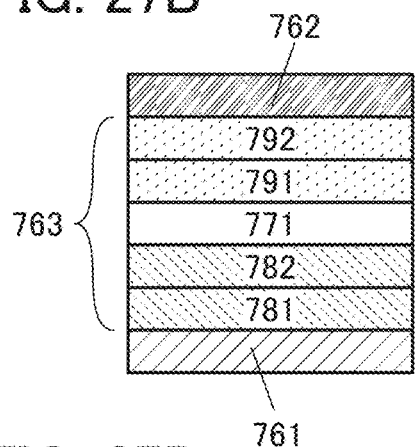

FIG. 27B is a modification example of the EL layer 763 included in the light-emitting device illustrated in FIG. 27A. Specifically, the light-emitting device illustrated in FIG. 27B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of recombination of carriers in the light-emitting layer 771 can be increased.

Figure 27C:
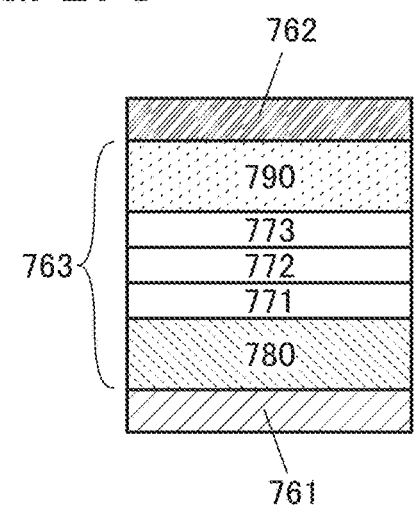
Figure 27D:
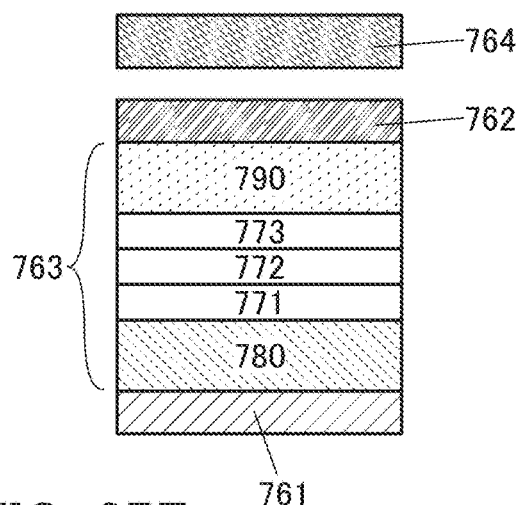

Note that structures in which a plurality of light-emitting layers (light-emitting layers 771, 772, and 773) are provided between the layer 780 and the layer 790 as illustrated in FIG. 27C and FIG. 27D are other variations of the single structure. Note that although FIG. 27C and FIG. 27D each illustrate an example of including three light-emitting layers, the light-emitting device having a single structure may include two light-emitting layers or four or more light-emitting layers. In addition, the light-emitting device having a single structure may include a buffer layer between two light-emitting layers.

Figure 27E:
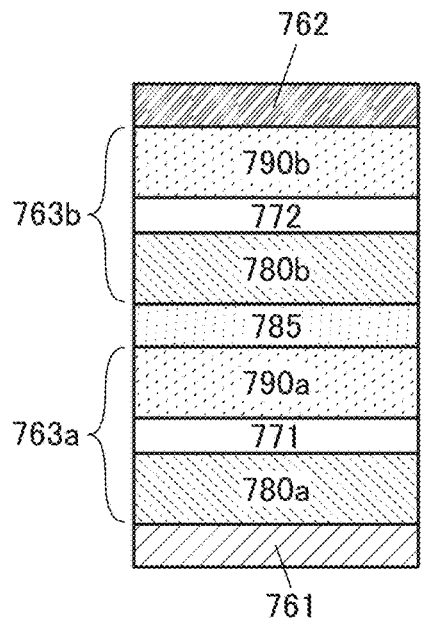
Figure 27F:
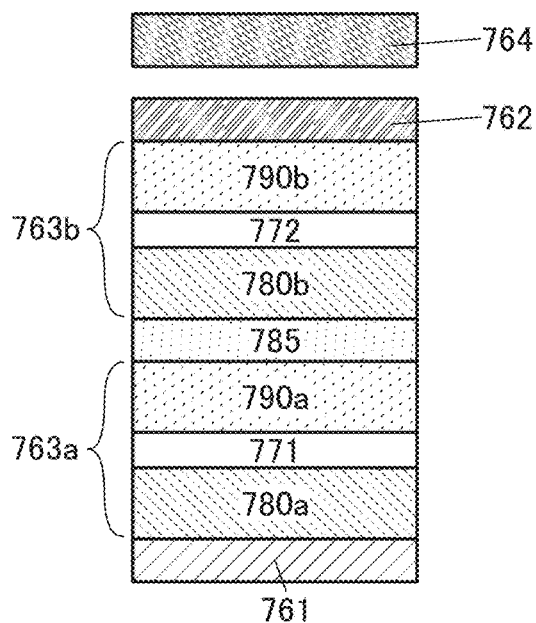

A structure in which a plurality of light-emitting units (a light-emitting unit 763a and a light-emitting unit 763b) are connected in series with a charge-generation layer 785 (also referred to as an intermediate layer) therebetween as illustrated in FIG. 27E and FIG. 27F is referred to as a tandem structure in this specification. Note that the tandem structure may be referred to as a stack structure. The tandem structure enables a light-emitting device capable of light emission at high luminance. Furthermore, the tandem structure can reduce the amount of current needed for obtaining the same luminance as compared with the single structure, and thus can increase reliability.

Note that FIG. 27D and FIG. 27F each illustrate an example in which the display panel includes a layer 764 overlapping the light-emitting device. FIG. 27D illustrates an example in which the layer 764 overlaps with the light-emitting device illustrated in FIG. 27C, and FIG. 27F illustrates an example in which the layer 764 overlaps with the light-emitting device illustrated in FIG. 27E.

One or both of a color conversion layer and a color filter (a coloring layer) can be used for the layer 764.

In FIG. 27C and FIG. 27D, light-emitting substances that emit light of the same color or the same light-emitting substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. In a subpixel that emits blue light, blue light emitted from the light-emitting device can be extracted. In addition, in each of a subpixel that emits red light and a subpixel that emits green light, a color conversion layer is provided as the layer 764 illustrated in FIG. 27D, so that blue light emitted from the light-emitting device can be converted into light with a longer wavelength and thus red light or green light can be extracted.

Light-emitting substances that emit light of different colors may be used for the light-emitting layer 771, the light-emitting layer 772, and the light-emitting layer 773. White light emission can be obtained when the emission colors of the light-emitting layer 771, the light-emitting layer 772, and the light-emitting layer 773 are complementary colors. The light-emitting device having a single structure preferably includes a light-emitting layer containing a light-emitting substance that emits blue light and a light-emitting layer containing a light-emitting substance that emits visible light with a longer wavelength than blue light, for example.

In the case where the light-emitting device having a single structure includes three light-emitting layers, for example, a light-emitting layer containing a light-emitting substance that emits red (R) light, a light-emitting layer containing a light-emitting substance that emits green (G) light, and a light-emitting layer containing a light-emitting substance that emits blue (B) light are preferably included. The stacking order of the light-emitting layers can be R, G, and B from the anode side or R, B, and G from the anode side, for example. In that case, a buffer layer may be provided between R and G or between R and B.

In the case where the light-emitting device having a single structure includes two light-emitting layers, for example, a light-emitting layer containing a light-emitting substance that emits blue (B) light and a light-emitting layer containing a light-emitting substance that emits yellow light are preferably included. Such a structure is sometimes referred to as a BY single structure.

A color filter may be provided for the layer 764 illustrated in FIG. 27D. When white light passes through the color filter, light of a desired color can be obtained.

A light-emitting device that emits white light preferably contains two or more kinds of light-emitting substances. To obtain white light emission, two or more light-emitting substances are selected such that their emission colors are complementary colors. For example, when the emission color of a first light-emitting layer and the emission color of a second light-emitting layer are complementary colors, the light-emitting device can be configured to emit white light as a whole. The same applies to a light-emitting device including three or more light-emitting layers.

In FIG. 27E and FIG. 27F, light-emitting substances that emit light of the same color or the same light-emitting substance may be used for the light-emitting layer 771 and the light-emitting layer 772.

For example, in light-emitting devices included in subpixels that emit light of different colors, a light-emitting substance that emits blue light may be used for each of the light-emitting layer 771 and the light-emitting layer 772. In a subpixel that emits blue light, blue light emitted from the light-emitting device can be extracted. In addition, in each of a subpixel that emits red light and a subpixel that emits green light, a color conversion layer is provided as the layer 764 illustrated in FIG. 27F, so that blue light emitted from the light-emitting device can be converted into light with a longer wavelength and thus red light or green light can be extracted.

In the case where the light-emitting device having the structure illustrated in FIG. 27E or FIG. 27F is used for the subpixels that emit light of different colors, the subpixels may use different light-emitting substances. Specifically, in the light-emitting device included in the subpixel that emits red light, a light-emitting substance that emits red light may be used for each of the light-emitting layer 771 and the light-emitting layer 772. Similarly, in the light-emitting device included in the subpixel that emits green light, a light-emitting substance that emits green light may be used for each of the light-emitting layer 771 and the light-emitting layer 772. In the light-emitting device included in the subpixel that emits blue light, a light-emitting substance that emits blue light may be used for each of the light-emitting layer 771 and the light-emitting layer 772. A display panel having such a structure can be regarded as employing a light-emitting device with the tandem structure and the SBS structure. Thus, the display panel can have both the advantage of a tandem structure and the advantage of an SBS structure. Accordingly, alight-emitting device capable of light emission at high luminance and having high reliability can be achieved.

In FIG. 27E and FIG. 27F, light-emitting substances that emit light of different colors may be used for the light-emitting layer 771 and the light-emitting layer 772. White light emission can be obtained when light emitted from the light-emitting layer 771 and light emitted from the light-emitting layer 772 have complementary colors. A color filter may be provided as the layer 764 illustrated in FIG. 27F. When white light passes through the color filter, light of a desired color can be obtained.

Note that although FIG. 27E and FIG. 27F each illustrate an example in which the light-emitting unit 763*a* includes one light-emitting layer 771 and the light-emitting unit 763*b* includes one light-emitting layer 772, one embodiment of the present invention is not limited thereto. Each of the light-emitting unit 763*a* and the light-emitting unit 763*b* may include two or more light-emitting layers.

Although FIG. 27E and FIG. 27F each illustrate an example of the light-emitting device including two light-emitting units, one embodiment of the present invention is not limited thereto. The light-emitting device may include three or more light-emitting units.

Figure 28A:
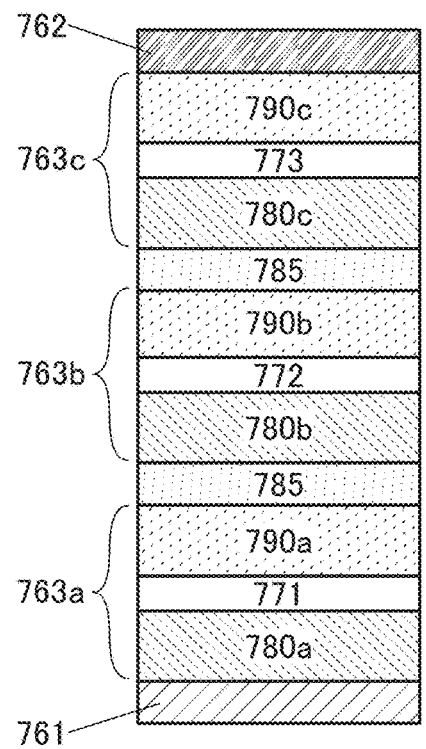
FIG. 28A to FIG. 28C are diagrams each illustrating a structure example of a light-emitting device.
Figure 28B:
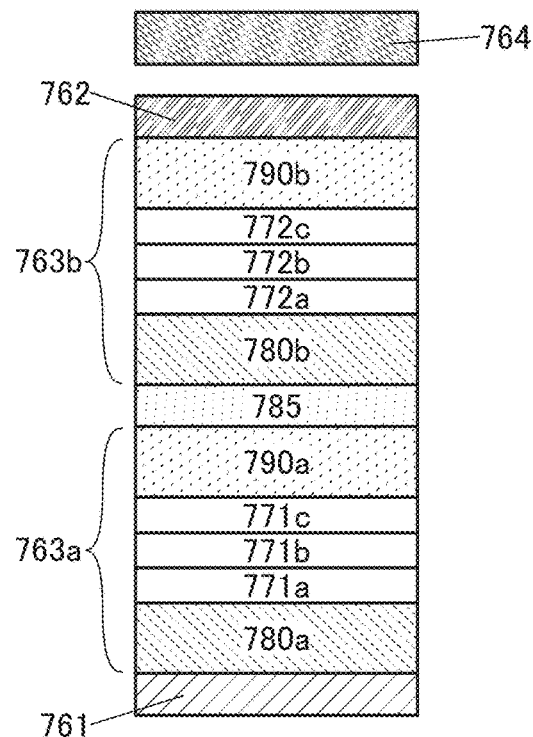
Figure 28C:
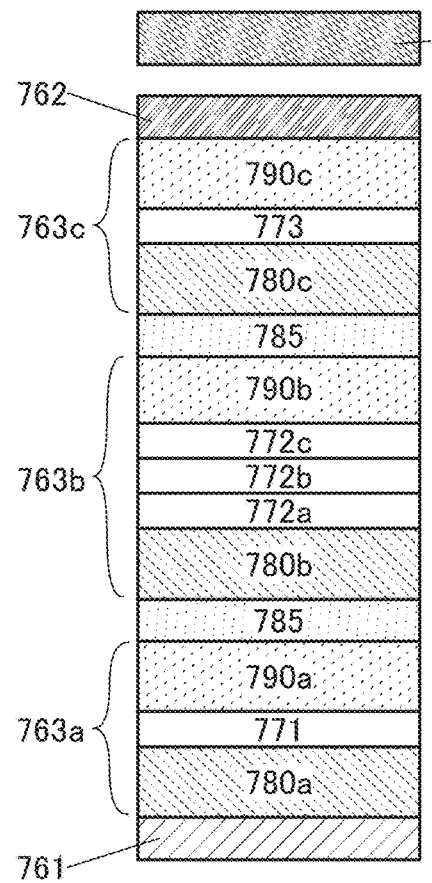

Specifically, structures of the light-emitting device illustrated in FIG. 28A to FIG. 28C can be given.

FIG. 28A illustrates a structure including three light-emitting units. Note that a structure including two light-emitting units and a structure including three light-emitting units may be referred to as a two-unit tandem structure and a three-unit tandem structure, respectively.

In the structure illustrated in FIG. 28A, a plurality of light-emitting units (the light-emitting unit 763*a*, the light-emitting unit 763*b*, and a light-emitting unit 763*c*) are connected in series with the charge-generation layers 785 therebetween. Furthermore, the light-emitting unit 763*a* includes a layer 780*a*, the light-emitting layer 771, and a layer 790*a*. The light-emitting unit 763*b* includes a layer 780*b*, the light-emitting layer 772, and a layer 790*b*. The light-emitting unit 763*c* includes a layer 780*c*, the light-emitting layer 773, and a layer 790*c*.

Note that in the structure illustrated in FIG. 28A, the light-emitting layer 771, the light-emitting layer 772, and the light-emitting layer 773 preferably contain light-emitting substances that emit light of the same color. Specifically, the light-emitting layer 771, the light-emitting layer 772, and the light-emitting layer 773 can each contain a light-emitting substance that emits red (R) light (what is called a three-unit R\R\R tandem structure), the light-emitting layer 771, the light-emitting layer 772, and the light-emitting layer 773 can each contain a light-emitting substance that emits green (G) light (what is called a three-unit G\G\G tandem structure), or the light-emitting layer 771, the light-emitting layer 772, and the light-emitting layer 773 can each contain a light-emitting substance that emits blue (B) light (what is called a three-unit B\B\B tandem structure).

Note that the structures of the light-emitting substances that emit light of the same color are not limited to the above structures. For example, a light-emitting device having a tandem structure may be employed in which light-emitting units each containing a plurality of light-emitting substances are stacked as illustrated in FIG. 28B. FIG. 28B illustrates a structure in which a plurality of light-emitting units (the light-emitting unit 763*a* and the light-emitting unit 763*b*) are connected in series with the charge-generation layer 785 therebetween. The light-emitting unit 763*a* includes the layer 780*a*, a light-emitting layer 771*a*, a light-emitting layer 771*b*, a light-emitting layer 771*c*, and the layer 790*a*. The light-emitting unit 763*b* includes the layer 780*b*, a light-emitting layer 772*a*, a light-emitting layer 772*b*, a light-emitting layer 772*c*, and the layer 790*b*.

In the structure illustrated in FIG. 28B, a structure is employed in which light-emitting substances for the light-emitting layer 771*a*, the light-emitting layer 771*b*, and the light-emitting layer 771*c* are selected to emit light of complementary colors and white (W) light emission can be obtained. Furthermore, a structure is employed in which light-emitting substances for the light-emitting layer 772*a*, the light-emitting layer 772*b*, and the light-emitting layer 772*c* are selected to emit light of complementary colors and white (W) light emission can be obtained. That is, the structure illustrated in FIG. 28C is a two-unit W\W tandem structure. Note that there is no particular limitation on the stacking order of light-emitting substances that emit light of complementary colors in the light-emitting layer 771*a*, the light-emitting layer 771*b*, and the light-emitting layer 771*c*.

A practitioner can select the optimal stacking order as appropriate. Although not illustrated, a three-unit W\W\W tandem structure or a tandem structure with four or more units may be employed.

In the case of using the light-emitting device having a tandem structure, the following structure can be given, for example: a two-unit B\Y tandem structure including a light-emitting unit that emits yellow (Y) light and a light-emitting unit that emits blue (B) light; a two-unit R•G\B tandem structure including a light-emitting unit that emits red (R) and green (G) light and a light-emitting unit that emits blue (B) light; a three-unit B\Y\B tandem structure including a light-emitting unit that emits blue (B) light, a light-emitting unit that emits yellow (Y) light, and a light-emitting unit that emits blue (B) light in this order; a three-unit B\YG\B tandem structure including a light-emitting unit that emits blue (B) light, a light-emitting unit that emits yellowish-green (YG) light, and a light-emitting unit that emits blue (B) light in this order; and a three-unit B\G\B tandem structure including a light-emitting unit that emits blue (B) light, a light-emitting unit that emits green (G) light, and a light-emitting unit that emits blue (B) light in this order.

A light-emitting unit containing one light-emitting substance and a light-emitting unit containing a plurality of light-emitting substances may be used in combination as illustrated in FIG. 28C.

Specifically, in the structure illustrated in FIG. 28C, a plurality of light-emitting units (the light-emitting unit 763a, the light-emitting unit 763b, and the light-emitting unit 763c) are connected in series with the charge-generation layers 785 therebetween. In addition, the light-emitting unit 763a includes the layer 780a, the light-emitting layer 771, and the layer 790a. The light-emitting unit 763b includes the layer 780b, the light-emitting layer 772a, the light-emitting layer 772b, the light-emitting layer 772c, and the layer 790b. The light-emitting unit 763c includes the layer 780c, the light-emitting layer 773, and the layer 790c.

For example, the structure illustrated in FIG. 28C can employ a three-unit B\R•G•YG\B tandem structure in which the light-emitting unit 763a is a light-emitting unit that emits blue (B) light, the light-emitting unit 763b is a light-emitting unit that emits red (R), green (G), and yellowish-green (YG) light, and the light-emitting unit 763c is a light-emitting unit that emits blue (B) light.

Examples of the number of stacked light-emitting units and the order of colors from the anode side include a two-unit structure of B and Y, a two-unit structure of B and a light-emitting unit X, a three-unit structure of B, Y, and B, and a three-unit structure of B, X, and B. Examples of the number of light-emitting layers stacked in the light-emitting unit X and the order of colors from the anode side include a two-layer structure of R and Y, a two-layer structure of R and G, a two-layer structure of G and R, a three-layer structure of G, R, and G, and a three-layer structure of R, G, and R. Another layer may be provided between two light-emitting layers.

Note that also in FIG. 27C and FIG. 27D, the layer 780 and the layer 790 may each independently have a stacked-layer structure of two or more layers as illustrated in FIG. 27B.

In FIG. 27E and FIG. 27F, the light-emitting unit 763a includes the layer 780a, the light-emitting layer 771, and the layer 790a, and the light-emitting unit 763b includes the layer 780b, the light-emitting layer 772, and the layer 790b.

In the case where the lower electrode 761 is an anode and the upper electrode 762 is a cathode, the layer 780a and the layer 780b each include one or more of a hole-injection layer, a hole-transport layer, and an electron-blocking layer. The layer 790a and the layer 790b each include one or more of an electron-injection layer, an electron-transport layer, and a hole-blocking layer. In the case where the lower electrode 761 is a cathode and the upper electrode 762 is an anode, the structures of the layer 780a and the layer 790a are replaced with each other, and the structures of the layer 780b and the layer 790b are also replaced with each other.

In the case where the lower electrode 761 is an anode and the upper electrode 762 is a cathode, for example, the layer 780a includes a hole-injection layer and a hole-transport layer over the hole-injection layer, and may further include an electron-blocking layer over the hole-transport layer. The layer 790a includes an electron-transport layer, and may further include a hole-blocking layer between the light-emitting layer 771 and the electron-transport layer. The layer 780b includes a hole-transport layer, and may further include an electron-blocking layer over the hole-transport layer. The layer 790b includes an electron-transport layer and an electron-injection layer over the electron-transport layer, and may further include a hole-blocking layer between the light-emitting layer 772 and the electron-transport layer. In the case where the lower electrode 761 is a cathode and the upper electrode 762 is an anode, for example, the layer 780a includes an electron-injection layer and an electron-transport layer over the electron-injection layer, and may further include a hole-blocking layer over the electron-transport layer. The layer 790a includes a hole-transport layer, and may further include an electron-blocking layer between the light-emitting layer 771 and the hole-transport layer. The layer 780b includes an electron-transport layer, and may further include a hole-blocking layer over the electron-transport layer. The layer 790b includes a hole-transport layer and a hole-injection layer over the hole-transport layer, and may further include an electron-blocking layer between the light-emitting layer 772 and the hole-transport layer.

In the case of manufacturing the light-emitting device having a tandem structure, two light-emitting units are stacked with the charge-generation layer 785 therebetween. The charge-generation layer 785 includes at least a charge-generation region. The charge-generation layer 785 has a function of injecting electrons to one of the two light-emitting units and injecting holes to the other of the two light-emitting units when voltage is applied between the pair of electrodes.

Next, materials that can be used for the light-emitting device will be described.

A conductive film that transmits visible light is used for the electrode through which light is extracted, which is either the lower electrode 761 or the upper electrode 762. A conductive film that reflects visible light is preferably used for the electrode through which light is not extracted. In the case where the display panel includes a light-emitting device that emits infrared light, it is preferable that a conductive film that transmits visible light and infrared light be used as the electrode through which light is extracted and that a conductive film that reflects visible light and infrared light be used as the electrode through which light is not extracted.

A conductive film that transmits visible light may be used also for the electrode through which light is not extracted. In that case, the electrode is preferably placed between a reflective layer and the EL layer 763. In other words, light emitted from the EL layer 763 may be reflected by the reflective layer to be extracted from the display panel.

As a material that forms the pair of electrodes of the light-emitting device, a metal, an alloy, an electrically conductive compound, a mixture thereof, or the like can be used as appropriate. Specific examples of the material include metals such as aluminum, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing an appropriate combination of these metals. Other examples of the material include indium tin oxide (also referred to as In—Sn oxide or ITO), an In—Si—Sn oxide (also referred to as ITSO), indium zinc oxide (an In—Zn oxide), and an In—W—Zn oxide. Other examples of the material include an alloy containing aluminum (an aluminum alloy) such as an alloy of aluminum, nickel, and lanthanum (Al—Ni—La), and an alloy of silver, palladium, and copper (Ag—Pd—Cu, also referred to as APC). Other examples of the material include an element that belongs to Group 1 or Group 2 of the periodic table, which is not described above (e.g., lithium, cesium, calcium, or strontium), a rare earth metal such as europium or ytterbium, an alloy containing an appropriate combination of these elements, and graphene.

The light-emitting device preferably employs a microcavity structure. Therefore, one of the pair of electrodes of the light-emitting device is preferably an electrode having properties of transmitting and reflecting visible light (a semi-transmissive and semi-reflective electrode), and the other of the pair of electrodes of the light-emitting device is preferably an electrode having a property of reflecting visible light (a reflective electrode). When the light-emitting device has a microcavity structure, light obtained from the light-emitting layer can be resonated between the electrodes, so that light emitted from the light-emitting device can be intensified.

Note that the semi-transmissive and semi-reflective electrode can have a stacked-layer structure of a conductive layer that can be used for a reflective electrode and a conductive layer that can be used for an electrode having a property of transmitting visible light (also referred to as a transparent electrode).

The transparent electrode has a light transmittance higher than or equal to 40%. For example, an electrode having a visible light (light with a wavelength longer than or equal to 400 nm and shorter than 750 nm) transmittance higher than or equal to 40% is preferably used as the transparent electrode of the light-emitting device. The visible light reflectance of the semi-transmissive and semi-reflective electrode is higher than or equal to 10% and lower than or equal to 95%, preferably higher than or equal to 30% and lower than or equal to 80%. The visible light reflectance of the reflective electrode is higher than or equal to 40% and lower than or equal to 100%, preferably higher than or equal to 70% and lower than or equal to 100%. These electrodes preferably have a resistivity lower than or equal to $1\times10^{-2}$ Ωcm.

The light-emitting device includes at least a light-emitting layer. The light-emitting device may further include, as a layer other than the light-emitting layer, a layer containing a substance having a high hole-injection property, a substance having a high hole-transport property, a hole-blocking material, a substance having a high electron-transport property, an electron-blocking material, a substance having a high electron-injection property, a substance having a bipolar property (a substance having a high electron-transport property and a high hole-transport property), or the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may be contained. Each layer included in the light-emitting device can be formed by a method such as an evaporation method (including a vacuum evaporation method), a transfer method, a printing method, an inkjet method, or a coating method.

The light-emitting layer contains one or more kinds of light-emitting substances. As the light-emitting substance, a substance that exhibits an emission color of blue, violet, bluish violet, green, yellowish green, yellow, orange, red, or the like is used as appropriate. As the light-emitting substance, a substance that emits near-infrared light can also be used.

Examples of the light-emitting substance include a fluorescent material, a phosphorescent material, a TADF material, and a quantum-dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (a host material, an assist material, and the like) in addition to the light-emitting substance (guest material). As one or more kinds of organic compounds, one or both of a substance having a high hole-transport property (a hole-transport material) and a substance having a high electron-transport property (an electron-transport material) can be used. As the hole-transport material, it is possible to use a material having a high hole-transport property that can be used for the hole-transport layer and will be described later. As the electron-transport material, it is possible to use a material having a high electron-transport property that can be used for the electron-transport layer and will be described later. As one or more kinds of organic compounds, a bipolar material or a TADF material may be used.

The light-emitting layer preferably includes a phosphorescent material and a combination of a hole-transport material and an electron-transport material that easily forms an exciplex, for example. Such a structure makes it possible to efficiently obtain light emission using ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of the lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

The hole-injection layer is a layer injecting holes from an anode to the hole-transport layer and a layer containing a material having a high hole-injection property. Examples of the material having a high hole-injection property include an aromatic amine compound and a composite material containing a hole-transport material and an acceptor material (an electron-accepting material).

As the hole-transport material, it is possible to use a material having a high hole-transport property that can be used for the hole-transport layer and will be described later.

As the acceptor material, an oxide of a metal that belongs to Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is particularly preferable because it is stable in the air, has a low hygroscopic property, and is easy to handle. An organic acceptor material containing fluorine can also be used. An organic acceptor material such as a quinodimethane derivative, a chloranil derivative, and a hexaazatriphenylene derivative can be used.

For example, a material that contains a hole-transport material and the above oxide of a metal that belongs to Group 4 to Group 8 of the periodic table (typically, molybdenum oxide) may be used as the material having a high hole-injection property.

The hole-transport layer is a layer transporting holes, which are injected from the anode by the hole-injection layer, to the light-emitting layer. The hole-transport layer is a layer containing a hole-transport material. For the hole-transport material, a substance having a hole mobility higher than or equal to $1 \times 10^{-6}$ cm$^2$/Vs is preferable. Note that other substances can also be used as long as they have a property of transporting more holes than electrons. As the hole-transport material, a material having a high hole-transport property, such as a π-electron rich heteroaromatic compound (e.g., a carbazole derivative, a thiophene derivative, a furan derivative, or the like) or an aromatic amine (a compound having an aromatic amine skeleton), is preferable.

The electron-blocking layer is provided in contact with the light-emitting layer. The electron-blocking layer has a hole-transport property and contains a material capable of blocking electrons. The materials having an electron-blocking property among the above hole-transport materials can be used for the electron-blocking layer.

The electron-blocking layer has a hole-transport property, and thus can also be referred to as a hole-transport layer. In addition, a layer having an electron-blocking property among the hole-transport layers can also be referred to as an electron-blocking layer.

The electron-transport layer is a layer transporting electrons, which are injected from the cathode by the electron-injection layer, to the light-emitting layer. The electron-transport layer is a layer containing an electron-transport material. As the electron-transport material, a substance having an electron mobility higher than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The hole-blocking layer is provided in contact with the light-emitting layer. The hole-blocking layer has an electron-transport property and contains a material capable of blocking holes. The materials having a hole-blocking property among the above electron-transport materials can be used for the hole-blocking layer.

The hole-blocking layer has an electron-transport property, and thus can also be referred to as an electron-transport layer. In addition, a layer having a hole-blocking property among the electron-transport layers can also be referred to as a hole-blocking layer.

The electron-injection layer is a layer injecting electrons from the cathode to the electron-transport layer and a layer containing a material having a high electron-injection property. As the material having a high electron-injection property, an alkali metal, an alkaline earth metal, or a compound thereof can be used. As the material having a high electron-injection property, a composite material containing an electron-transport material and a donor material (an electron-donating material) can also be used.

The difference between the LUMO level of the material having a high electron-injection property and the work function value of the material used for the cathode is preferably small (specifically, smaller than or equal to 0.5 eV).

For the electron-injection layer, an alkali metal, an alkaline earth metal, or a compound thereof, such as lithium, cesium, ytterbium, lithium fluoride (LiF), cesium fluoride (CsF), calcium fluoride (CaF$_x$, where x is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate can be used, for example. The electron-injection layer may have a stacked-layer structure of two or more layers. Examples of the stacked-layer structure include a structure in which lithium fluoride is used for a first layer and ytterbium is provided for a second layer.

The electron-injection layer may include an electron-transport material. For example, a compound having an unshared electron pair and an electron deficient heteroaromatic ring can be used for the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), 2,2-(1,3-phenylene)bis[9-phenyl-1,10-phenanthroline](abbreviation: mPPhen2P), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound having an unshared electron pair. Note that NBPhen has a higher glass transition point (Tg) than BPhen and thus has high heat resistance.

As described above, the charge-generation layer includes at least a charge-generation region. The charge-generation region preferably contains an acceptor material, and for example, preferably contains a hole-transport material and an acceptor material that can be employed for the hole-injection layer.

The charge-generation layer preferably includes a layer containing a material having a high electron-injection property. The layer can also be referred to as an electron-injection buffer layer. The electron-injection buffer layer is preferably provided between the charge-generation region and the electron-transport layer. By providing the electron-injection buffer layer, an injection barrier between the charge-generation region and the electron-transport layer can be lowered; thus, electrons generated in the charge-generation region can be easily injected to the electron-transport layer.

The electron-injection buffer layer preferably contains an alkali metal or an alkaline earth metal and can include an alkali metal compound or an alkaline earth metal compound, for example. Specifically, the electron-injection buffer layer preferably includes an inorganic compound containing an alkali metal and oxygen or an inorganic compound containing an alkaline earth metal and oxygen, further preferably includes an inorganic compound containing lithium and oxygen (lithium oxide ($Li_2O$) or the like). Alternatively, a material that can be used for the electron-injection layer can be suitably used for the electron-injection buffer layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other by cross-sectional shapes, characteristics, or the like in some cases.

Note that the charge-generation layer may include a donor material instead of an acceptor material. For example, the charge-generation layer may include a layer including an electron-transport material and a donor material that can be used for the electron-injection layer.

When the light-emitting units are stacked, provision of a charge-generation layer between two light-emitting units can inhibit an increase in driving voltage.

At least part of the structure examples, the drawings corresponding thereto, and the like described in this embodiment can be combined with the other structure examples, the other drawings corresponding thereto, and the like as appropriate.

At least part of this embodiment can be implemented in combination with the other embodiments described in this specification as appropriate.

REFERENCE NUMERALS

OLED: light-emitting device, SL: source line, Vano: anode power supply line, Vcat: cathode power supply line, 10: display apparatus, 15: eye, 20d: region, 20w: wiring, 20: display panel, 21i: image, 21n: region, 21p: pixel, 21: display portion, 22c: region, 22d: region, 22i: image, 22n: region, 22p: pixel, 22: display portion, 24w: wiring, 24: gate driver, 25: source driver, 26: FPC, 30: display panel, 31i: image, 31p: pixel, 31: display portion, 33: subpixel, 36: FPC, 40: display panel, 41c: image, 41i: image, 41: display portion, 51r: reflection surface, 51: half mirror, 52r: reflection surface, 52: half mirror, 61: lens, 62: lens, 75: circuit, 76: circuit, 81: layer, 82: layer, 83: layer, 90: housing, 91: band, 100a: display panel, 100b: display panel, 100: display panel, 101: substrate, 110a: light-emitting device, 110B: light-emitting device, 110b: light-emitting device, 110c: light-emitting device, 110G: light-emitting device, 110R: light-emitting device, 110W: light-emitting device, 110: light-emitting device, 111B: pixel electrode, 111C: connection electrode, 111G: pixel electrode, 111R: pixel electrode, 111: pixel electrode, 112B: organic layer, 112G: organic layer, 112R: organic layer, 112W: organic layer, 112: organic layer, 113: common electrode, 114: common layer, 115B: conductive layer, 115G: conductive layer, 115R: conductive layer, 115: optical adjustment layer, 116B: coloring layer, 116G: coloring layer, 116R: coloring layer, 121: protective layer, 122: insulating layer, 123: insulating layer, 124a: pixel, 124b: pixel, 125: insulating layer, 126: resin layer, 128: layer, 140: connection portion, 150: pixel, 170: substrate, 171: adhesive layer, 200A: display panel, 200B: display panel, 200C: display panel, 200D: display panel, 200E: display panel, 200F: display panel, 200G: display panel, 215: display portion, 221: gate driver, 240: capacitor, 241: conductive layer, 243: insulating layer, 245: conductive layer, 251: conductive layer, 252: conductive layer, 254: insulating layer, 255a: insulating layer, 255b: insulating layer, 255c: insulating layer, 256: plug, 261: insulating layer, 262: insulating layer, 263: insulating layer, 264: insulating layer, 265: insulating layer, 271: plug, 274a: conductive layer, 274b: conductive layer, 274: plug, 280: display module, 281: display portion, 282: circuit portion, 283a: pixel circuit, 283: pixel circuit portion, 284a: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 761: lower electrode, 762: upper electrode, 763a: light-emitting unit, 763b: light-emitting unit, 763c: light-emitting unit, 763: EL layer, 764: layer, 771a: light-emitting layer, 771b: light-emitting layer, 771c: light-emitting layer, 771: light-emitting layer, 772a: light-emitting layer, 772b: light-emitting layer, 772c: light-emitting layer, 772: light-emitting layer, 773: light-emitting layer, 780a: layer, 780b: layer, 780c: layer, 780: layer, 781: layer, 782: layer, 785: charge-generation layer, 790a: layer, 790b: layer, 790c: layer, 790: layer, 791: layer, 792: layer, 4001: first substrate, 4005: sealant, 4006: second substrate, 4008: liquid crystal layer, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4030: first electrode layer, 4031:

second electrode layer, 4032: insulating layer, 4033: insulating layer, 4035: spacer, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4510: partition wall, 4511: light-emitting layer, 4513: light-emitting device, 4514: filler This application is based on Japanese Patent Application Serial No. 2022-018401 filed on Feb. 9, 2022; the entire contents are hereby incorporated herein by reference.

The invention claimed is:

1. An electronic device comprising:
a first display panel comprising a first display region and a second display region;
a second display panel comprising a third display region;
a third display panel comprising a fourth display region;
a first half mirror;
a second half mirror;
a first lens; and
a second lens,
wherein the first half mirror is configured to let a first image of the first display region pass through,
wherein the first half mirror is configured to reflect a second image of the third display region,
wherein one of a first eye and a second eye of a user of the electronic device sees the first image and the second image via the first lens,
wherein the second half mirror is configured to let a third image of the second display region pass through,
wherein the second half mirror is configured to reflect a fourth image of the fourth display region, and
wherein the other of the first eye and the second eye of the user of the electronic device sees the third image and the fourth image via the second lens.

2. The electronic device according to claim 1,
wherein the electronic device is configured to display the second image of the third display region and the fourth image of the fourth display region in a region corresponding to a central field of view of the user, and
wherein the electronic device is configured to display the first image of the first display region and the third image of the second display region a region corresponding to a peripheral field of view of the user.

3. The electronic device according to claim 1,
wherein the first display panel comprises one of a liquid crystal element and an organic EL element, and
wherein a circuit configured to drive the one of the liquid crystal element and the organic EL element is provided over a glass substrate.

4. The electronic device according to claim 1,
wherein each of the second display panel and the third display panel comprises an organic EL element, and
wherein a circuit configured to drive the organic EL element is provided on a silicon substrate.

5. The electronic device according to claim 1,
wherein each of the second display panel and the third display panel has a higher pixel density than the first display panel.

6. The electronic device according to claim 1,
wherein the first display panel, the second display panel, and the third display panel perform black display at a time of image data writing and data retention, and
wherein the first display panel, the second display panel, and the third display panel perform image display in accordance with signals supplied to the first display panel, the second display panel, and the third display panel at the same timing.

7. An electronic device comprising:
a first display panel comprising a first display region and a second display region;
a second display panel comprising a third display region;
a third display panel comprising a fourth display region;
a first half mirror;
a second half mirror;
a first lens; and
a second lens,
wherein the first lens faces the first display region with the first half mirror therebetween,
wherein the second lens faces the second display region with the second half mirror therebetween,
wherein the second display panel is positioned so that a first image of the third display region is reflected by the first half mirror and enters the first lens, and
wherein the third display panel is positioned so that a second image of the fourth display region is reflected by the second half mirror and enters the second lens.

8. The electronic device according to claim 7,
wherein the first display panel comprises one of a liquid crystal element and an organic EL element, and
wherein a circuit configured to drive the one of the liquid crystal element and the organic EL element is provided over a glass substrate.

9. The electronic device according to claim 7,
wherein each of the second display panel and the third display panel comprises an organic EL element, and
wherein a circuit configured to drive the organic EL element is provided on a silicon substrate.

10. The electronic device according to claim 7,
wherein each of the second display panel and the third display panel has a higher pixel density than the first display panel.

11. The electronic device according to claim 7,
wherein the first display panel, the second display panel, and the third display panel perform black display at a time of image data writing and data retention, and
wherein the first display panel, the second display panel, and the third display panel perform image display in accordance with signals supplied to the first display panel, the second display panel, and the third display panel at the same timing.

12. An electronic device comprising:
a first display panel comprising a first display region and a second display region;
a second display panel comprising a third display region;
a third display panel comprising a fourth display region;
a first half mirror;
a second half mirror;
a first lens; and
a second lens,
wherein the first lens faces the first display region with the first half mirror therebetween,
wherein the second lens faces the second display region with the second half mirror therebetween, and
wherein the second display panel faces the third display panel with the first half mirror and the second half mirror therebetween.

13. The electronic device according to claim 12,
wherein the first display panel comprises one of a liquid crystal element and an organic EL element, and
wherein a circuit configured to drive the one of the liquid crystal element and the organic EL element is provided over a glass substrate.

14. The electronic device according to claim 12,
wherein each of the second display panel and the third display panel comprises an organic EL element, and
wherein a circuit configured to drive the organic EL element is provided on a silicon substrate.

15. The electronic device according to claim 12,
wherein each of the second display panel and the third display panel has a higher pixel density than the first display panel.

16. The electronic device according to claim 12,
wherein the first display panel, the second display panel, and the third display panel perform black display at a time of image data writing and data retention, and
wherein the first display panel, the second display panel, and the third display panel perform image display in accordance with signals supplied to the first display panel, the second display panel, and the third display panel at the same timing.

* * * * *